United States Patent
Su et al.

(10) Patent No.: US 11,996,481 B2
(45) Date of Patent: May 28, 2024

(54) LINER FOR A BI-LAYER GATE HELMET AND THE FABRICATION THEREOF

(71) Applicant: Taiwan Semiconductor Manufacturing Co., Ltd., Hsinchu (TW)

(72) Inventors: Huan-Chieh Su, Tianzhong Township (TW); Chih-Hao Wang, Baoshan Township (TW); Kuo-Cheng Chiang, Zhubei (TW); Wei-Hao Wu, Hsinchu (TW); Zhi-Chang Lin, Zhubei (TW); Jia-Ni Yu, New Taipei (TW); Yu-Ming Lin, Hsinchu (TW); Chung-Wei Hsu, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 65 days.

(21) Appl. No.: 17/322,267

(22) Filed: May 17, 2021

(65) Prior Publication Data
US 2021/0280694 A1    Sep. 9, 2021

Related U.S. Application Data

(62) Division of application No. 16/510,554, filed on Jul. 12, 2019, now Pat. No. 11,011,625.

(60) Provisional application No. 62/734,013, filed on Sep. 20, 2018.

(51) Int. Cl.
*H01L 21/8238*  (2006.01)
*H01L 21/768*   (2006.01)
*H01L 27/092*   (2006.01)
*H01L 29/66*    (2006.01)
*H01L 29/78*    (2006.01)

(52) U.S. Cl.
CPC ...... *H01L 29/785* (2013.01); *H01L 21/76829* (2013.01); *H01L 21/823814* (2013.01); *H01L 21/823821* (2013.01); *H01L 21/823864* (2013.01); *H01L 27/0924* (2013.01); *H01L 29/66795* (2013.01)

(58) Field of Classification Search
CPC ......... H01L 21/76829; H01L 21/76831; H01L 21/76834; H01L 21/823814; H01L 21/82385; H01L 21/823821; H01L 21/823864; H01L 27/0924; H01L 29/66795; H01L 29/785
See application file for complete search history.

(56) References Cited

U.S. PATENT DOCUMENTS

| | | | |
|---|---|---|---|
| 5,610,430 A | 3/1997 | Yamashita et al. | |
| 9,257,348 B2* | 2/2016 | Xie | H01L 29/66545 |
| 9,331,077 B2* | 5/2016 | Matsumoto | H01L 21/823864 |
| 9,472,446 B2* | 10/2016 | Xie | H01L 21/76224 |
| 9,576,955 B2* | 2/2017 | Lee | H01L 27/0924 |
| 9,911,833 B2* | 3/2018 | Zhou | H01L 29/7856 |
| 10,164,053 B1* | 12/2018 | Chung | H01L 29/66795 |

(Continued)

*Primary Examiner* — Eduardo A Rodela
(74) *Attorney, Agent, or Firm* — Haynes and Boone, LLP

(57) ABSTRACT

A semiconductor device includes a semiconductor layer. A gate structure is disposed over the semiconductor layer. A spacer is disposed on a sidewall of the gate structure. A height of the spacer is greater than a height of the gate structure. A liner is disposed on the gate structure and on the spacer. The spacer and the liner have different material compositions.

20 Claims, 47 Drawing Sheets

(56) References Cited

U.S. PATENT DOCUMENTS

| | | |
|---|---|---|
| 10,177,042 B2 | 1/2019 | Chung et al. |
| 10,229,983 B1 | 3/2019 | Bu et al. |
| 10,283,406 B2 * | 5/2019 | Basker .............. H01L 21/76834 |
| 10,374,039 B1 * | 8/2019 | Hashemi ................. H01L 21/84 |
| 2005/0045942 A1 | 3/2005 | Jung |
| 2005/0124104 A1 | 6/2005 | Jung |
| 2009/0206406 A1 | 8/2009 | Rachmady et al. |
| 2011/0254090 A1 * | 10/2011 | Cheng ................. H01L 29/78618 |
| | | 438/151 |
| 2012/0104509 A1 | 5/2012 | Matsumoto |
| 2012/0139042 A1 * | 6/2012 | Fu ....................... H01L 29/7843 |
| | | 257/E21.409 |
| 2013/0087833 A1 * | 4/2013 | Wang ................ H01L 29/66477 |
| | | 257/E21.409 |
| 2013/0341643 A1 | 12/2013 | Kudou et al. |
| 2015/0028388 A1 | 1/2015 | Majumdar et al. |
| 2015/0187900 A1 | 7/2015 | Shankar et al. |
| 2017/0186849 A1 | 6/2017 | Chen et al. |
| 2018/0069000 A1 | 3/2018 | Bergengahl et al. |
| 2018/0374927 A1 * | 12/2018 | Liu ................... H01L 21/28114 |
| 2019/0006486 A1 | 1/2019 | Ching et al. |
| 2019/0067120 A1 | 2/2019 | Ching et al. |
| 2019/0088762 A1 | 3/2019 | Su et al. |
| 2019/0165127 A1 | 5/2019 | Ching et al. |
| 2020/0044072 A1 * | 2/2020 | Chiang ............. H01L 29/66795 |
| 2020/0098622 A1 | 3/2020 | Su et al. |
| 2020/0144369 A1 | 5/2020 | Lin et al. |

\* cited by examiner

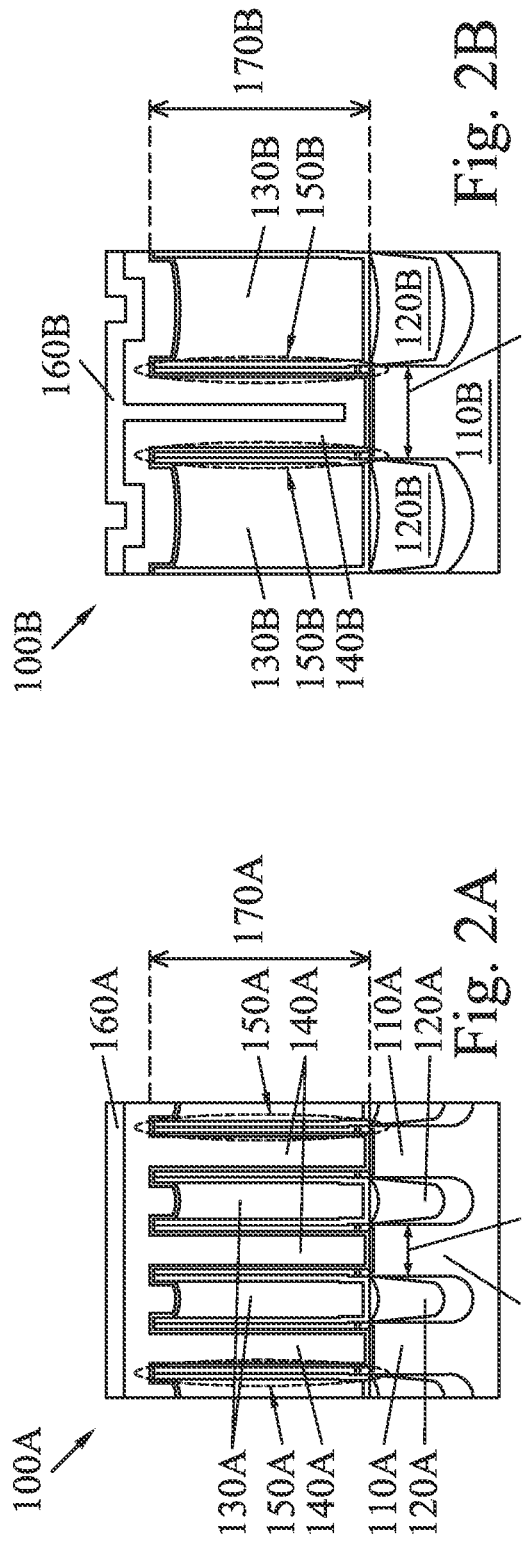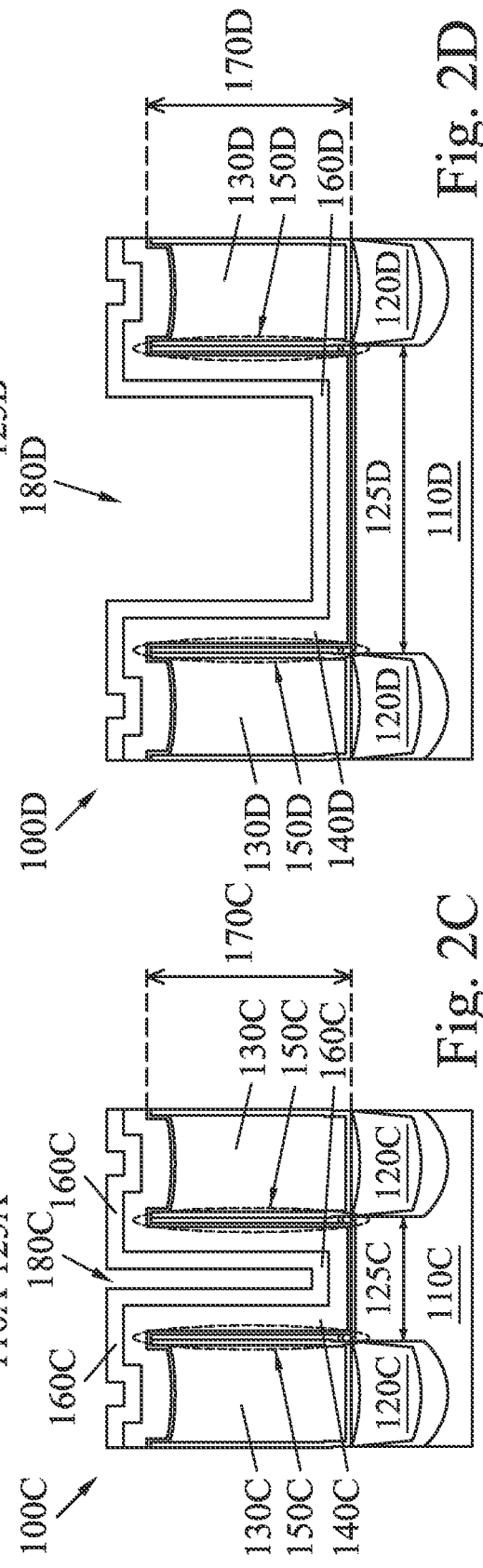

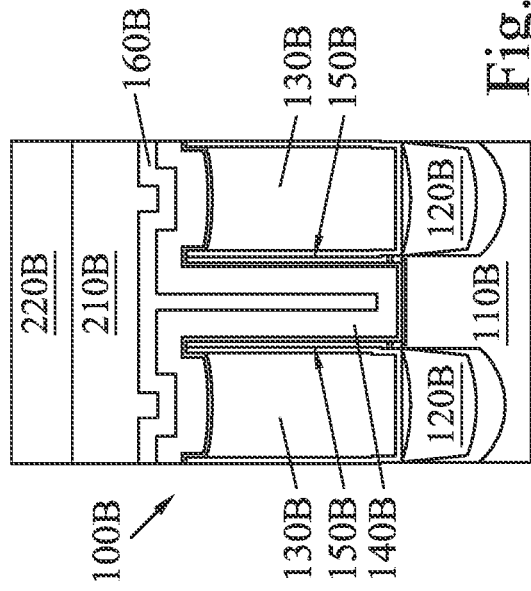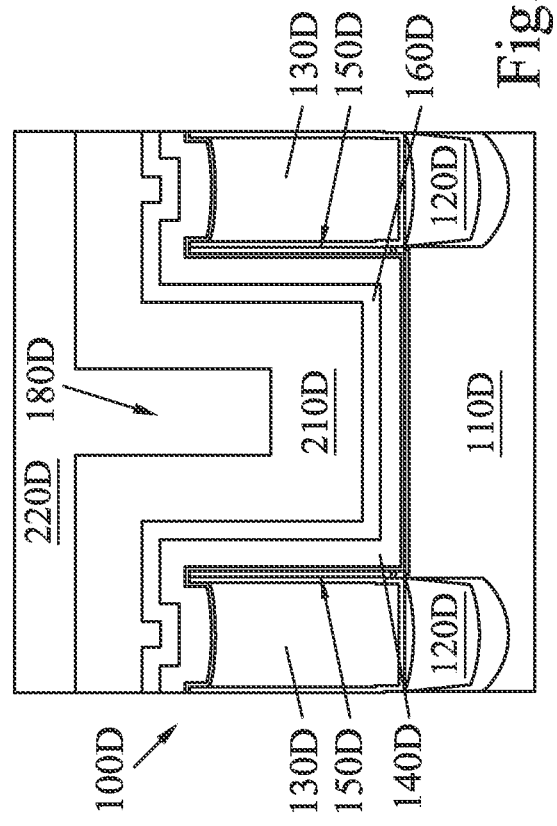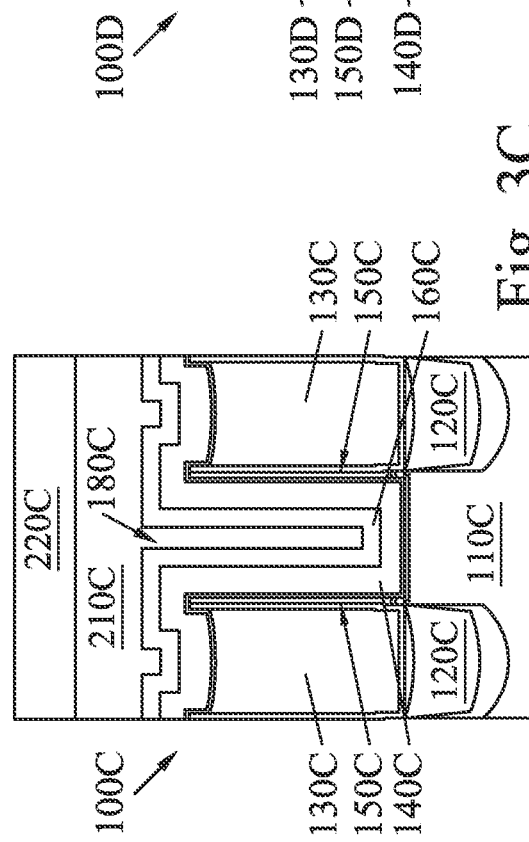

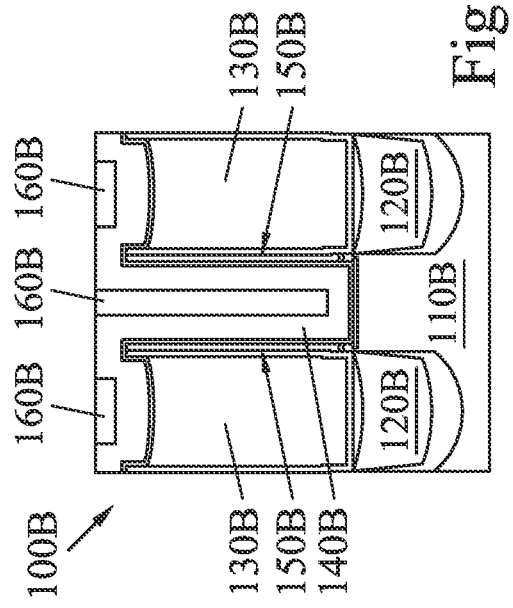
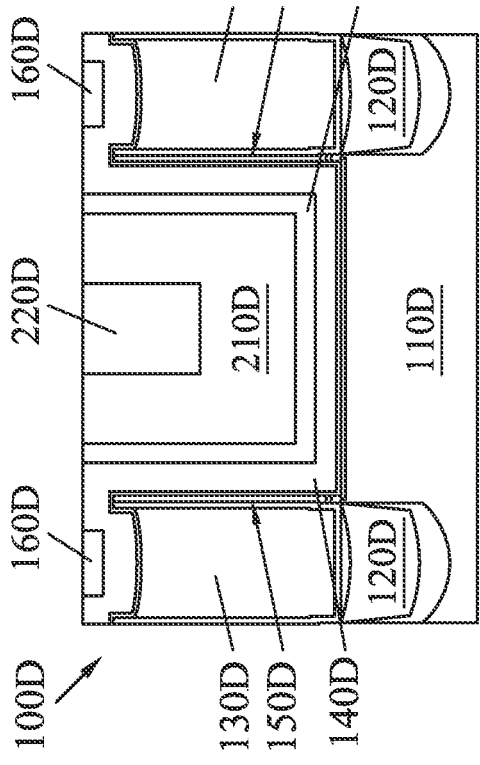
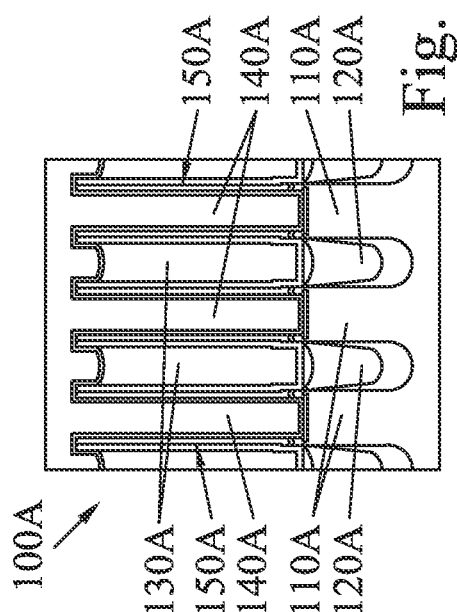
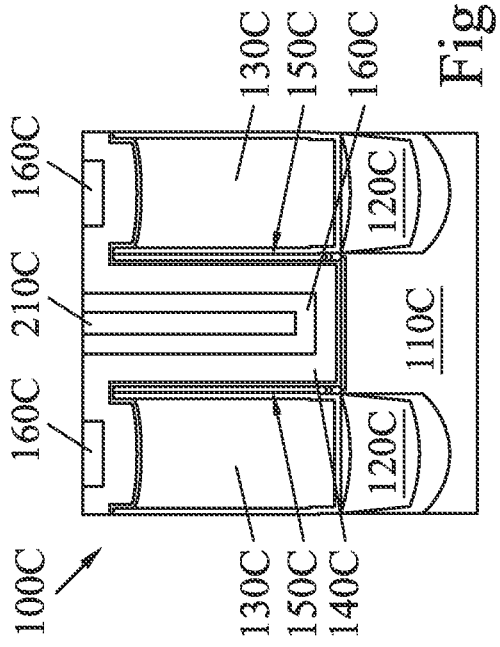

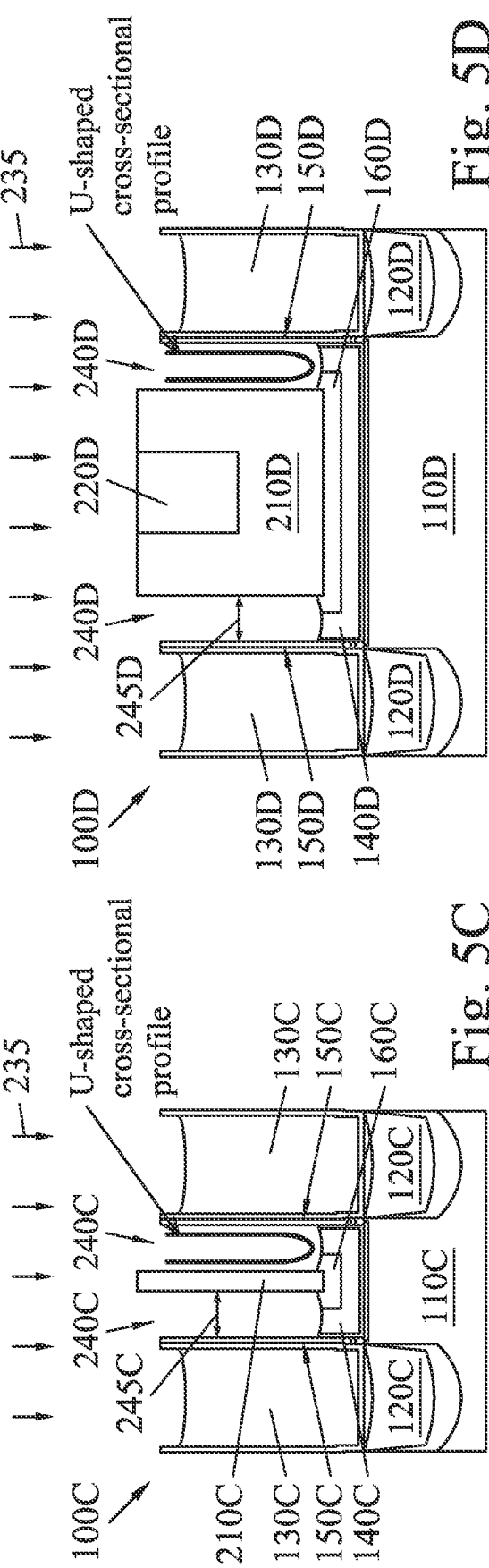

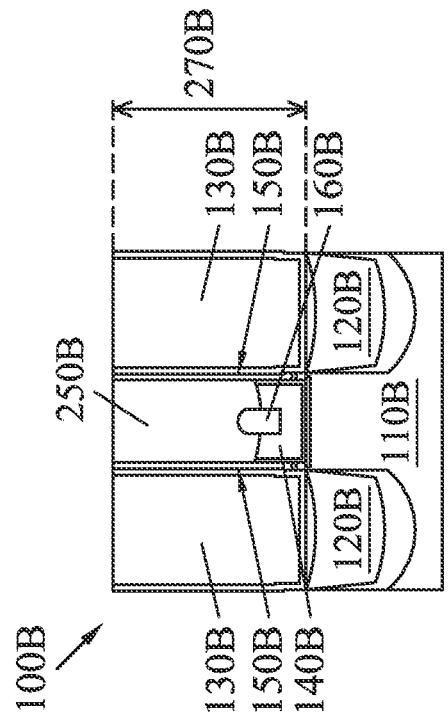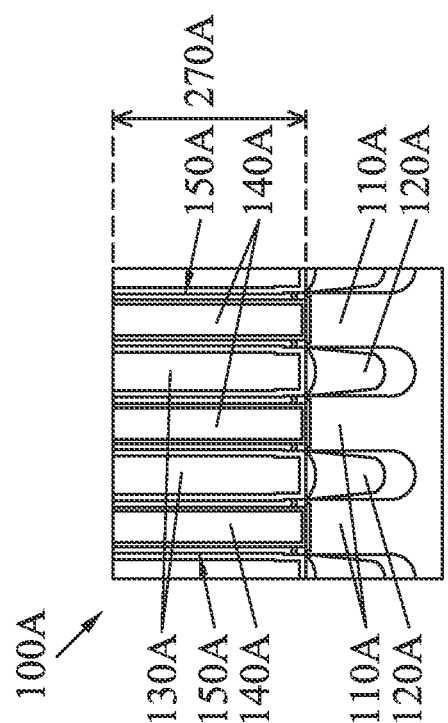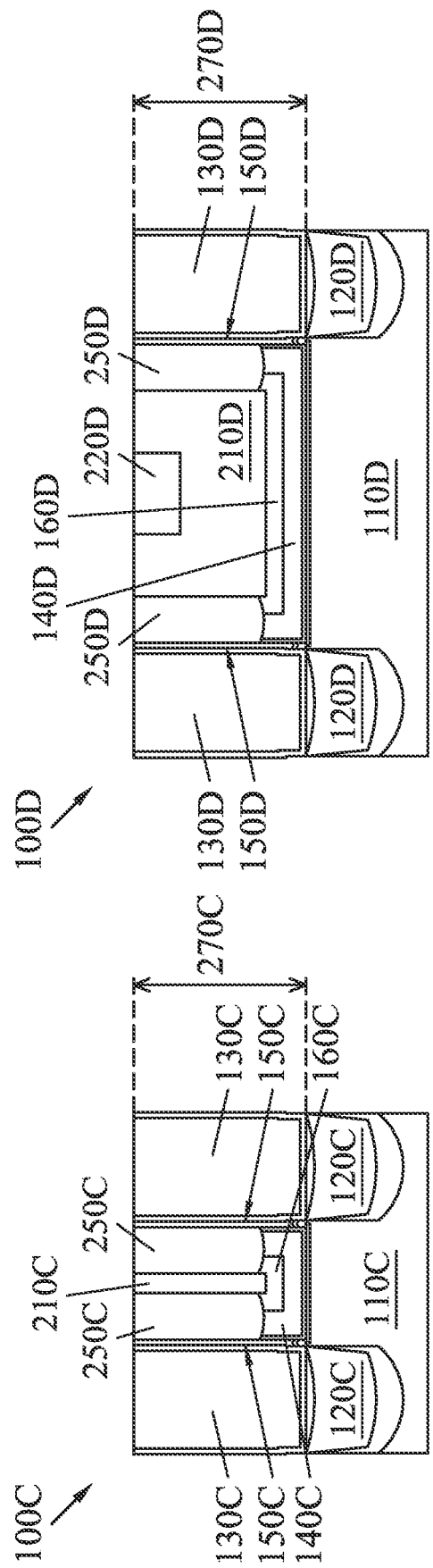
Fig. 7A  Fig. 7B  Fig. 7C  Fig. 7D

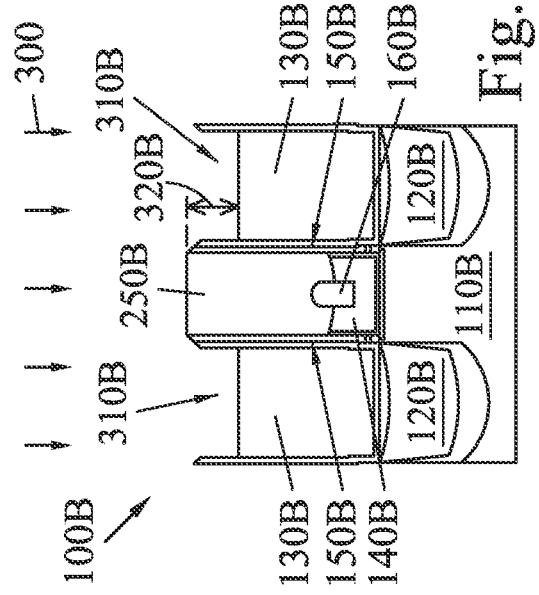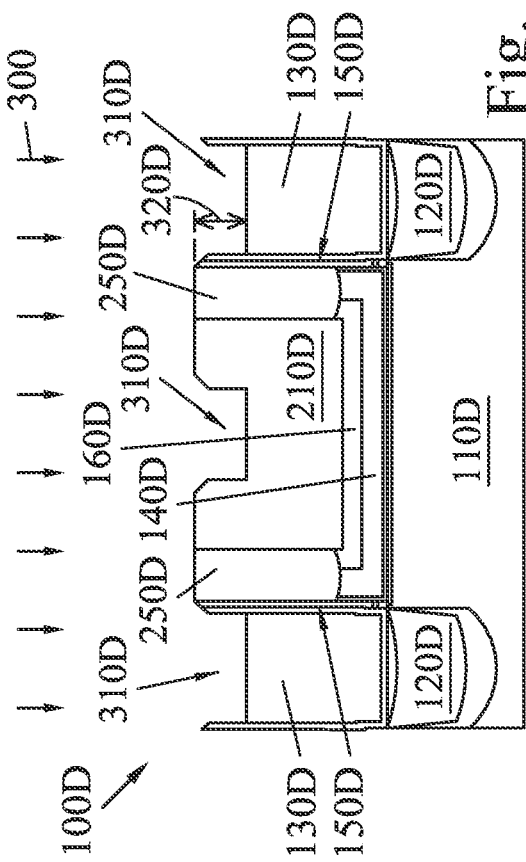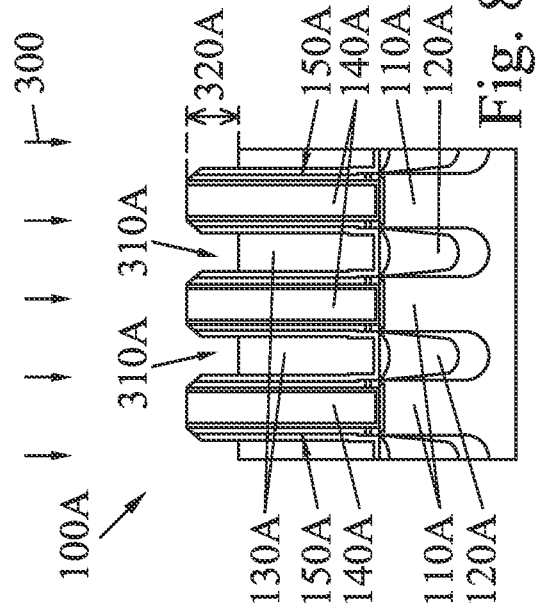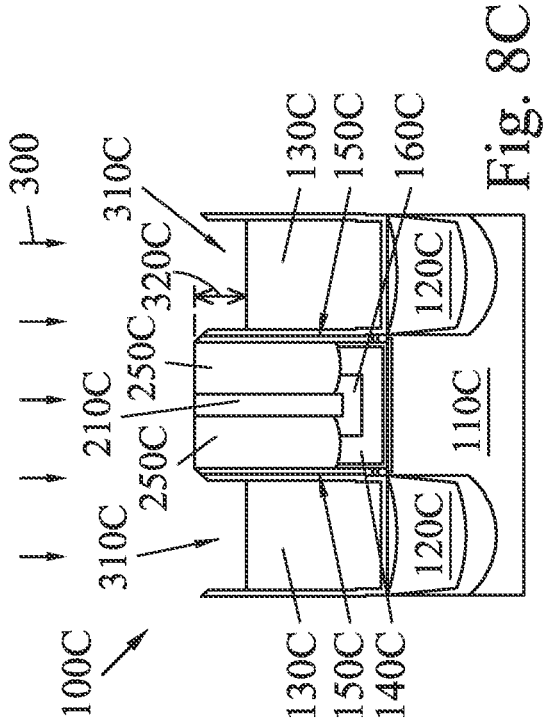

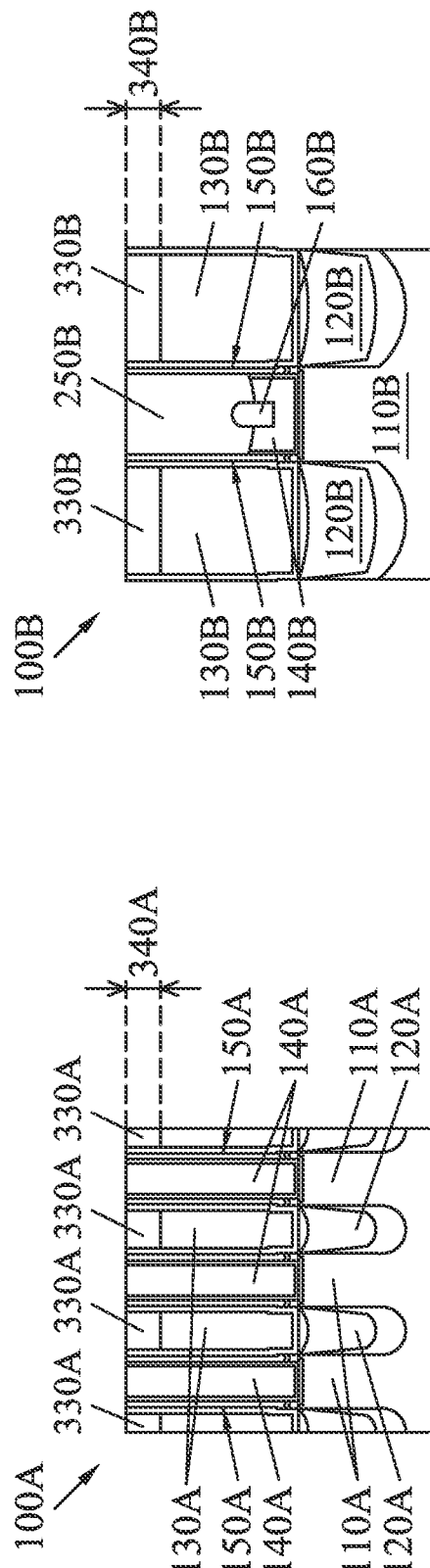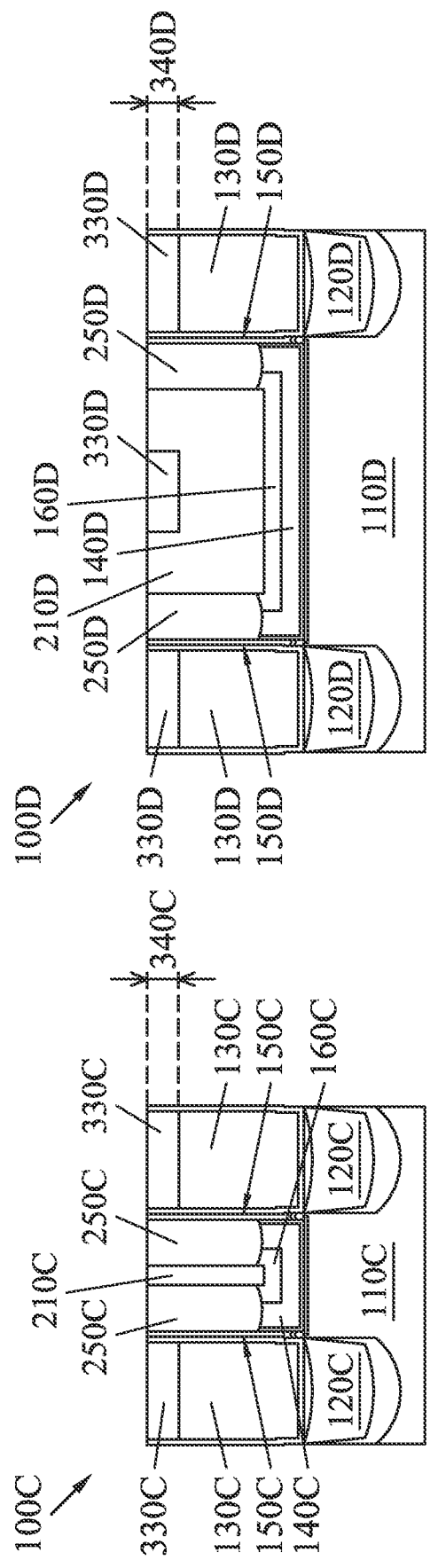

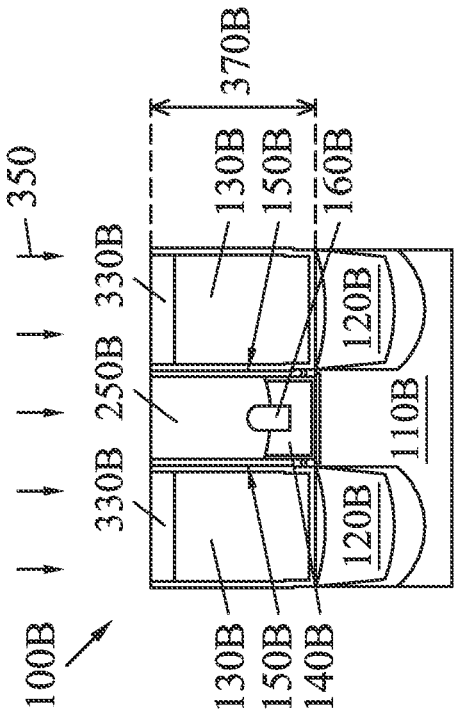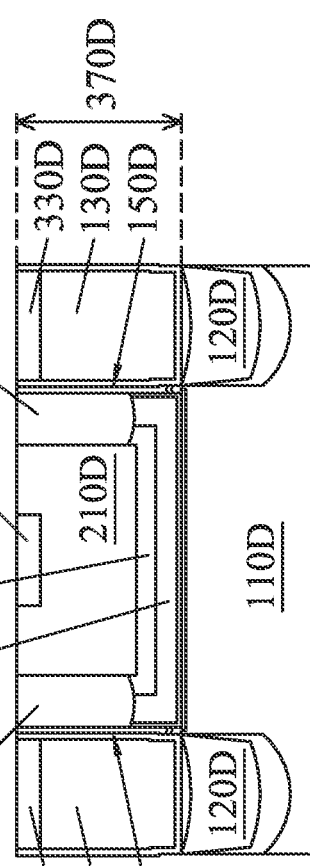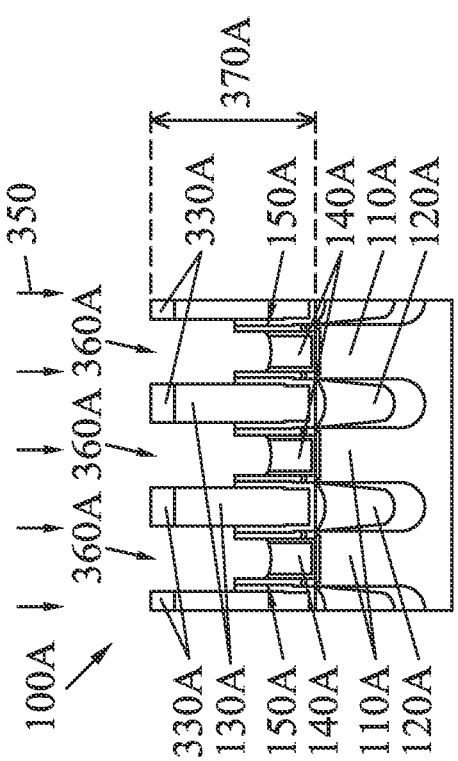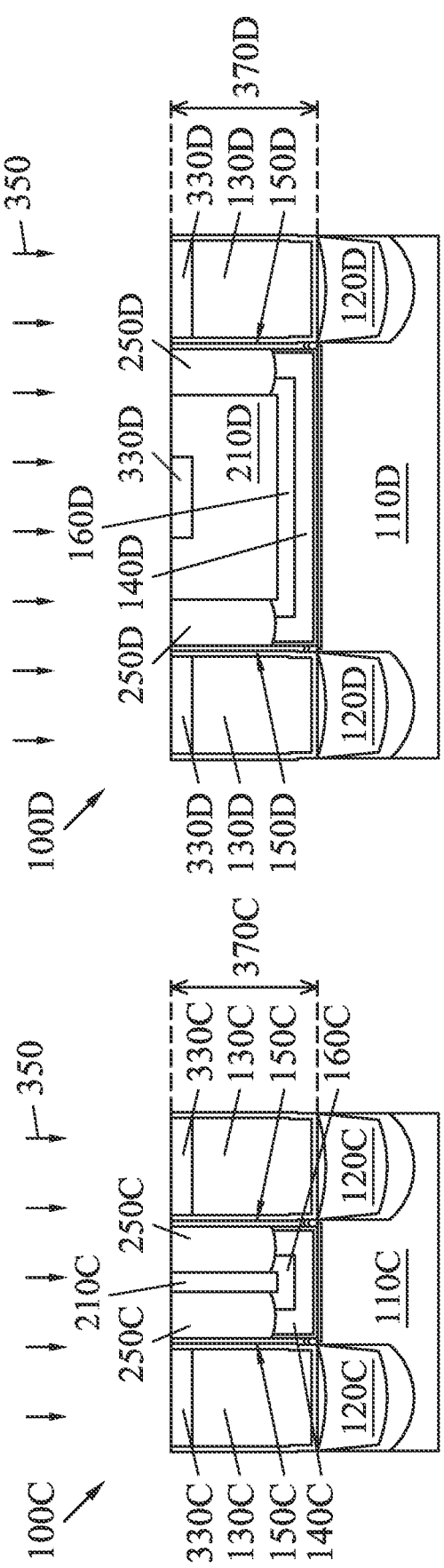
Fig. 10A
Fig. 10B
Fig. 10C
Fig. 10D

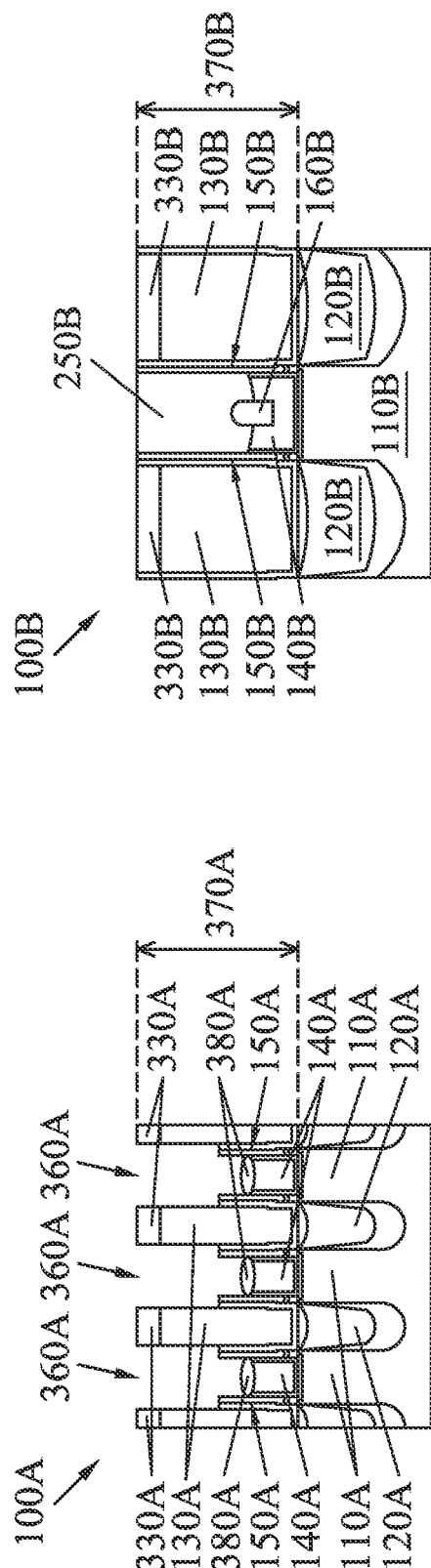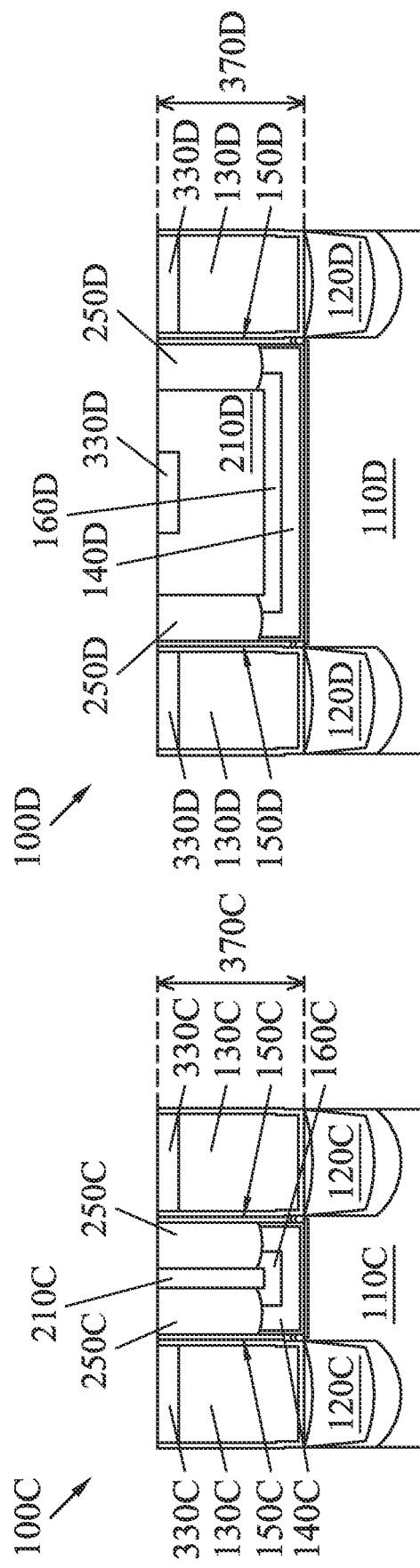

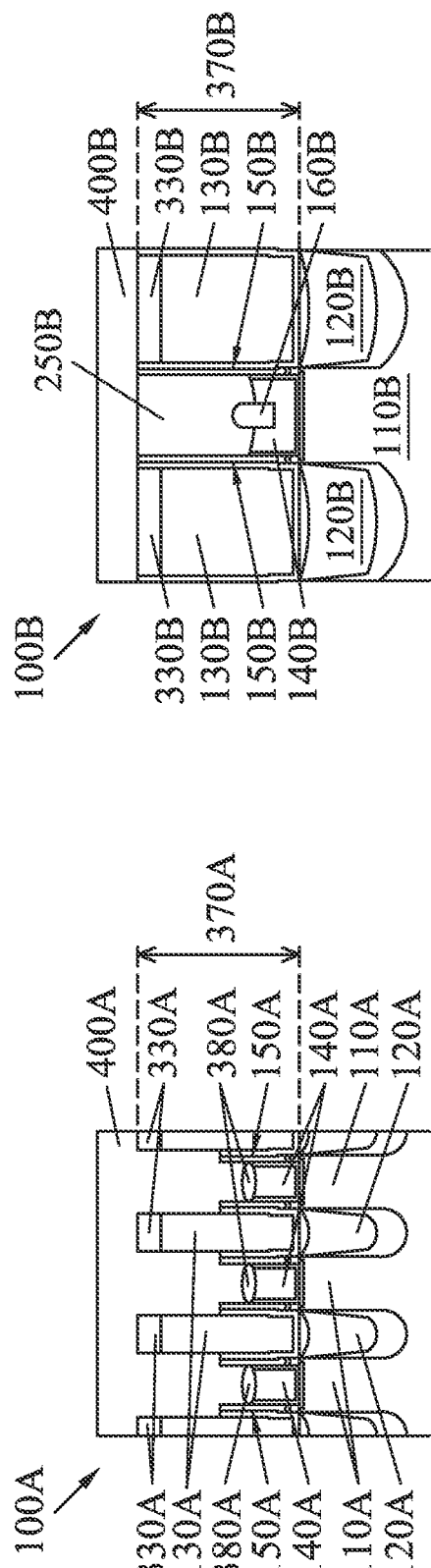
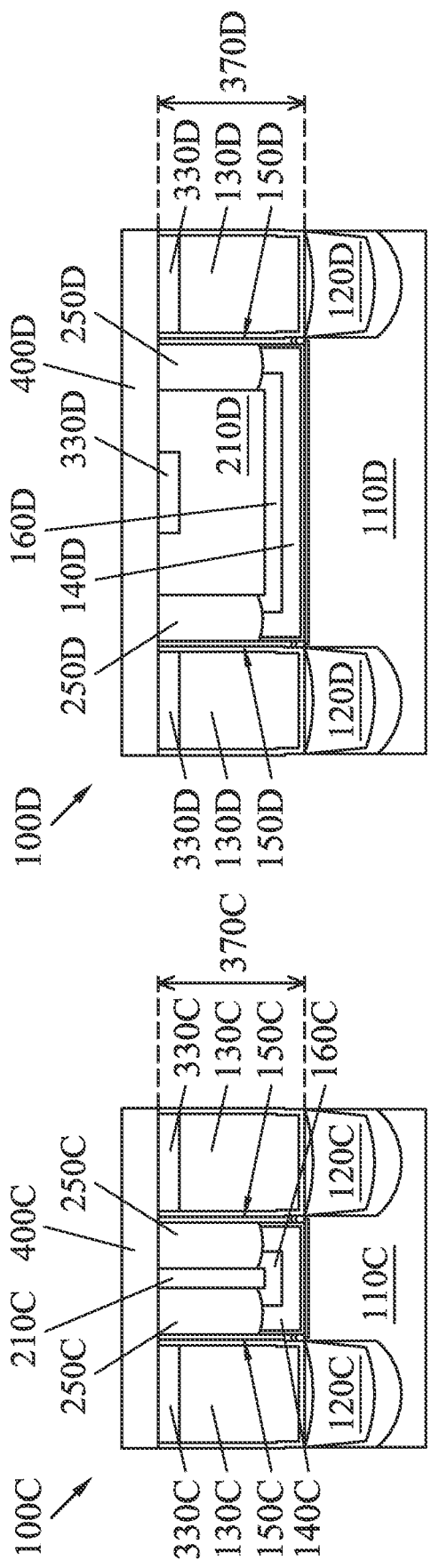
Fig. 12A
Fig. 12B
Fig. 12C
Fig. 12D

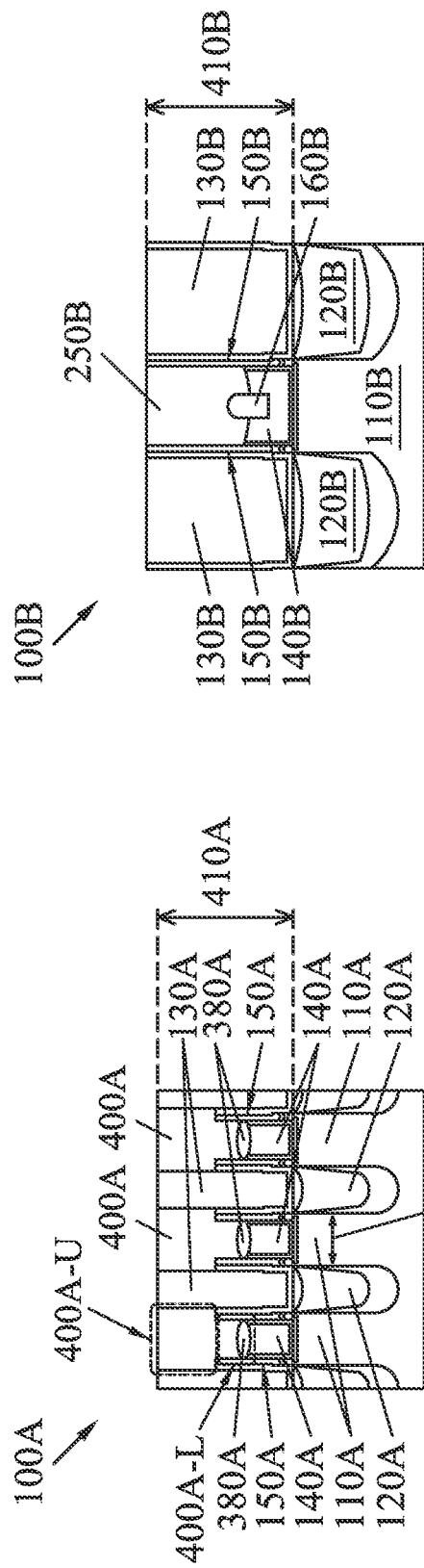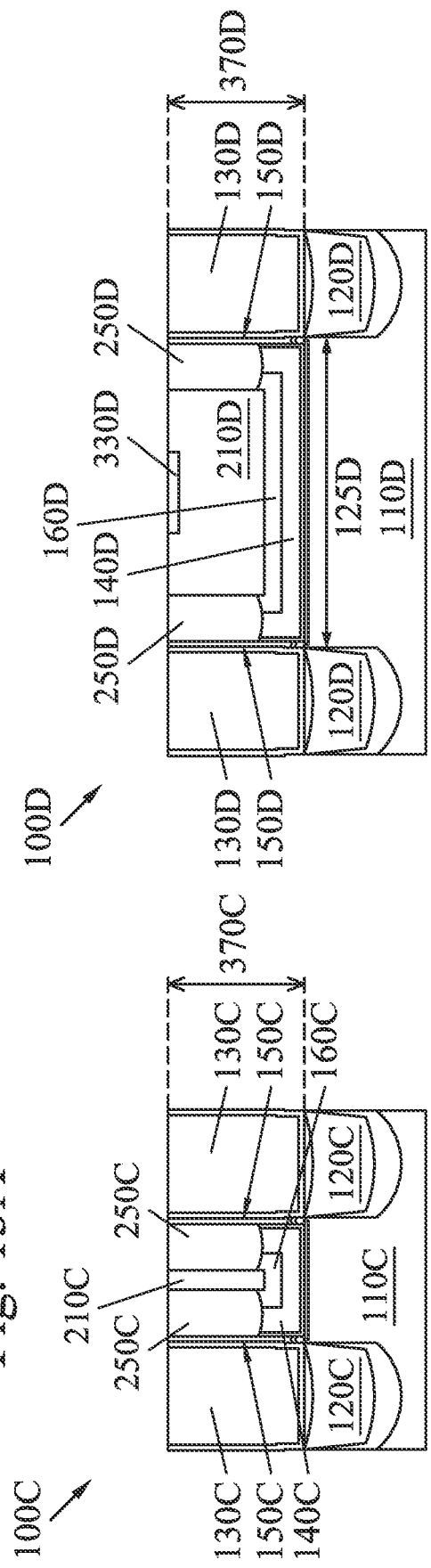
Fig. 13A
Fig. 13B
Fig. 13C
Fig. 13D

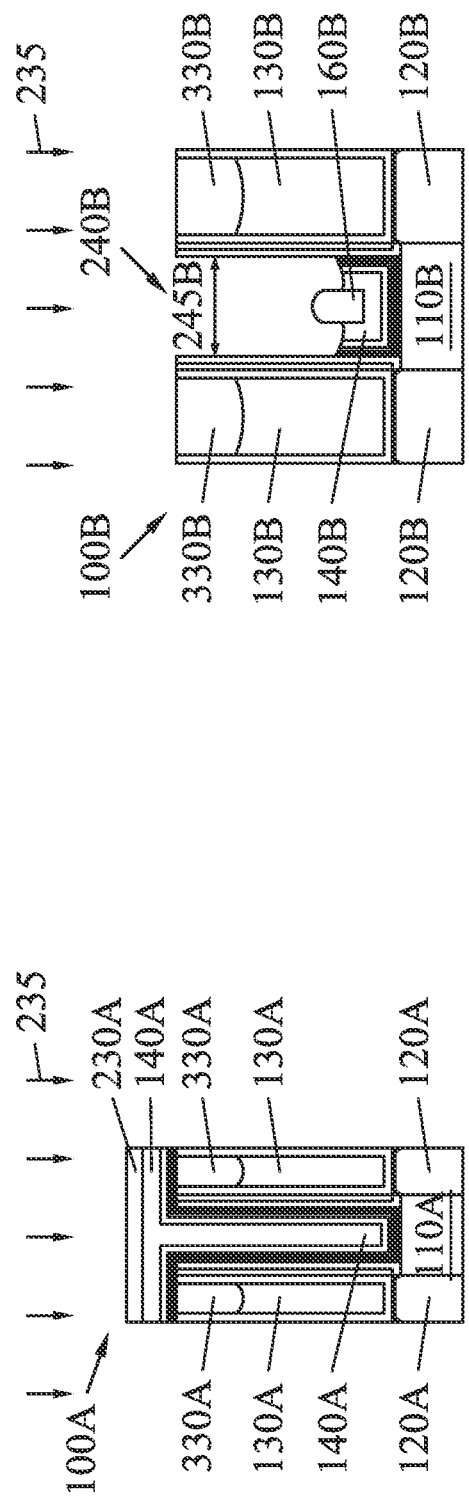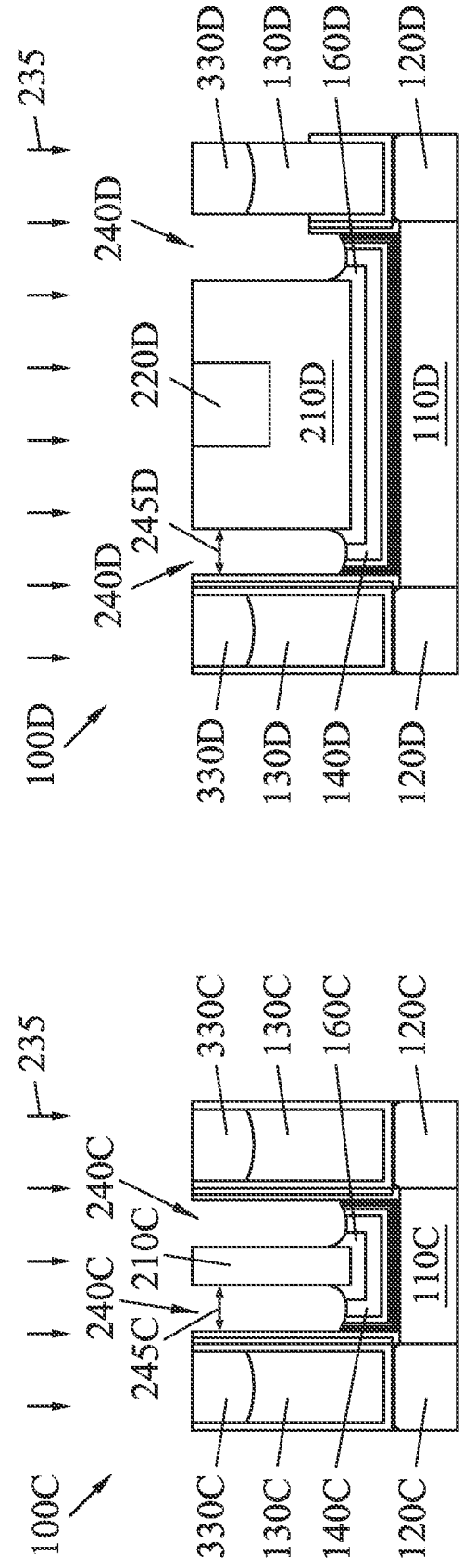

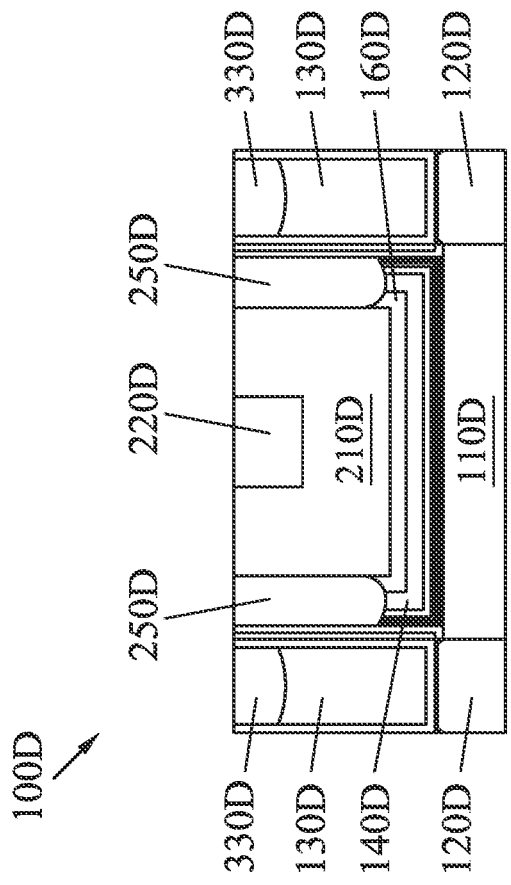
Fig. 18A
Fig. 18B
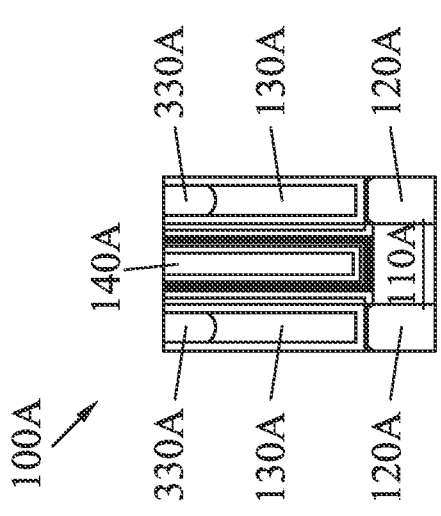
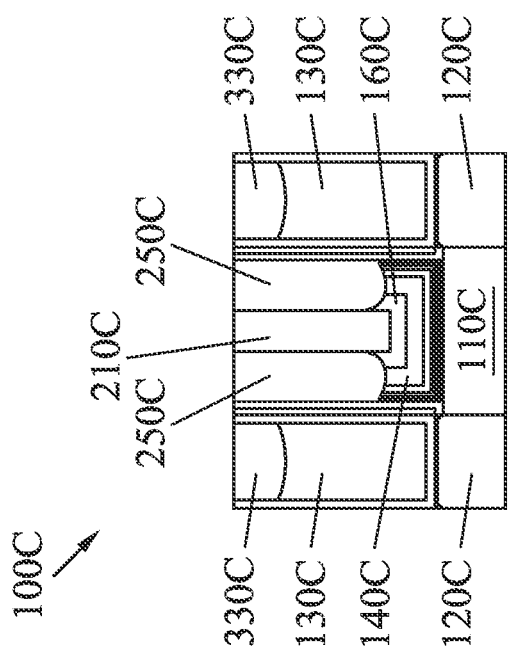
Fig. 18C
Fig. 18D

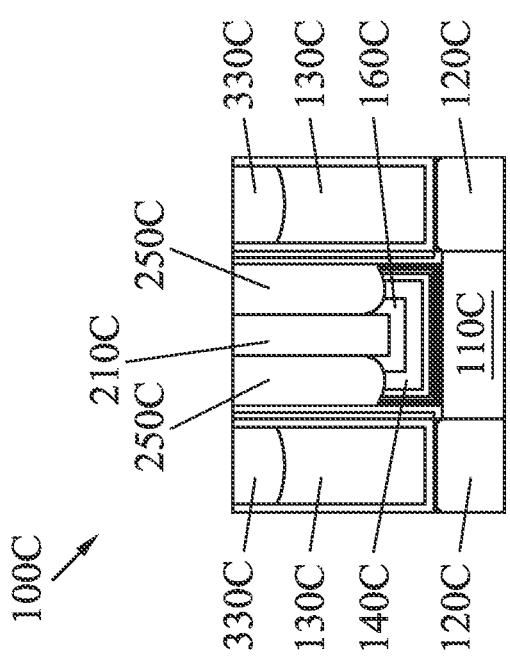

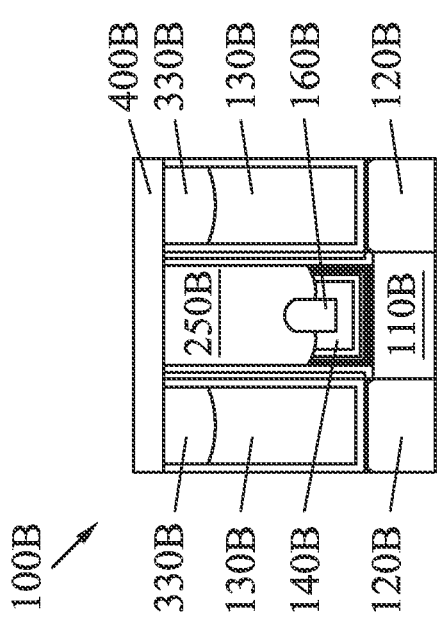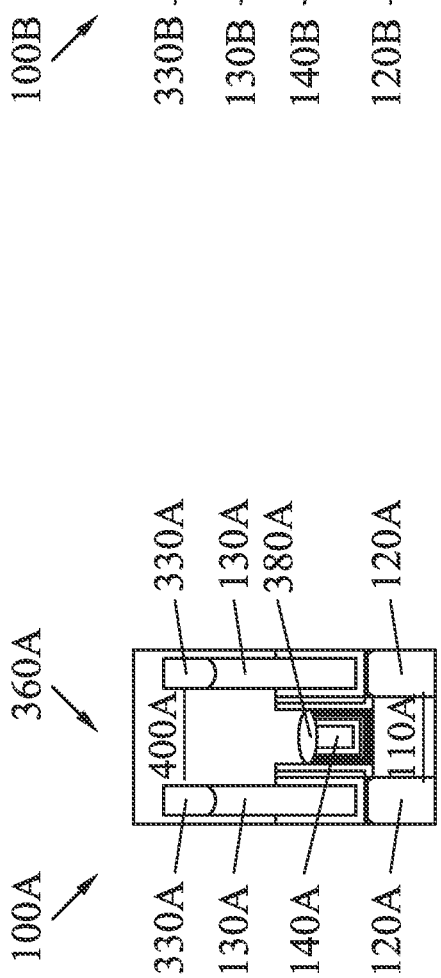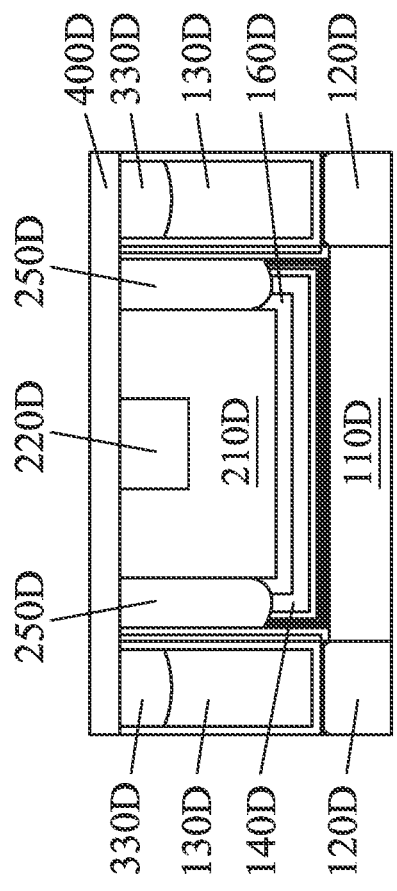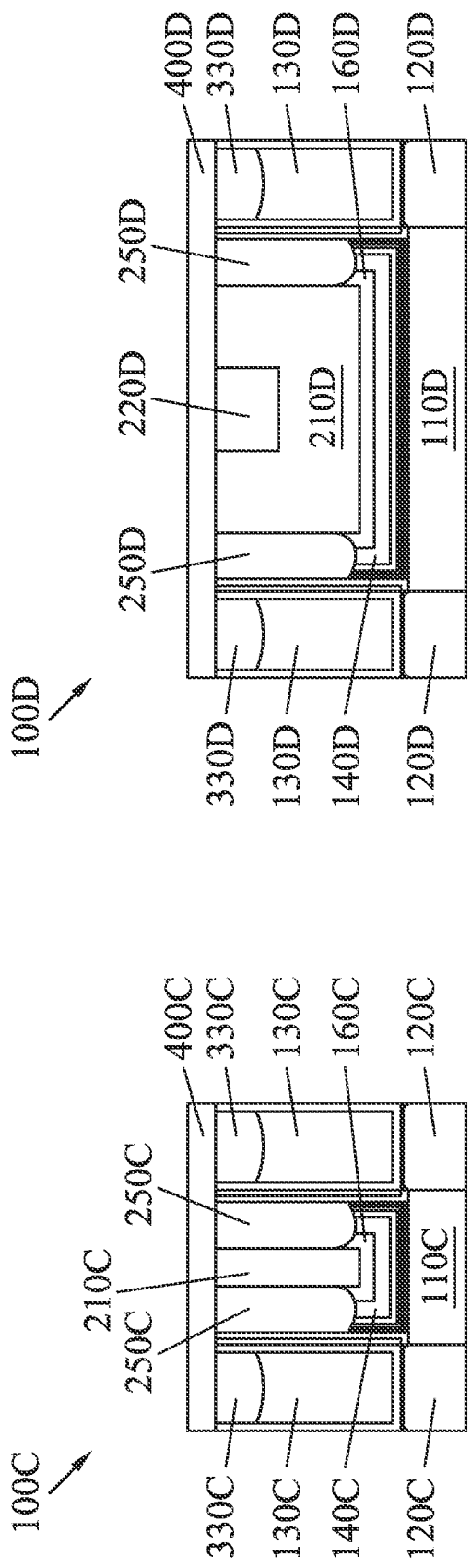

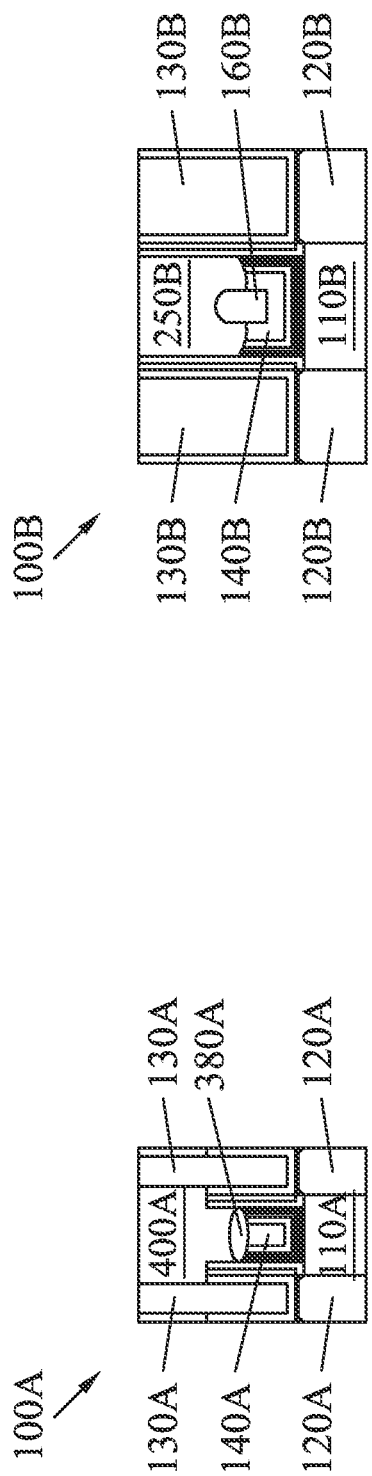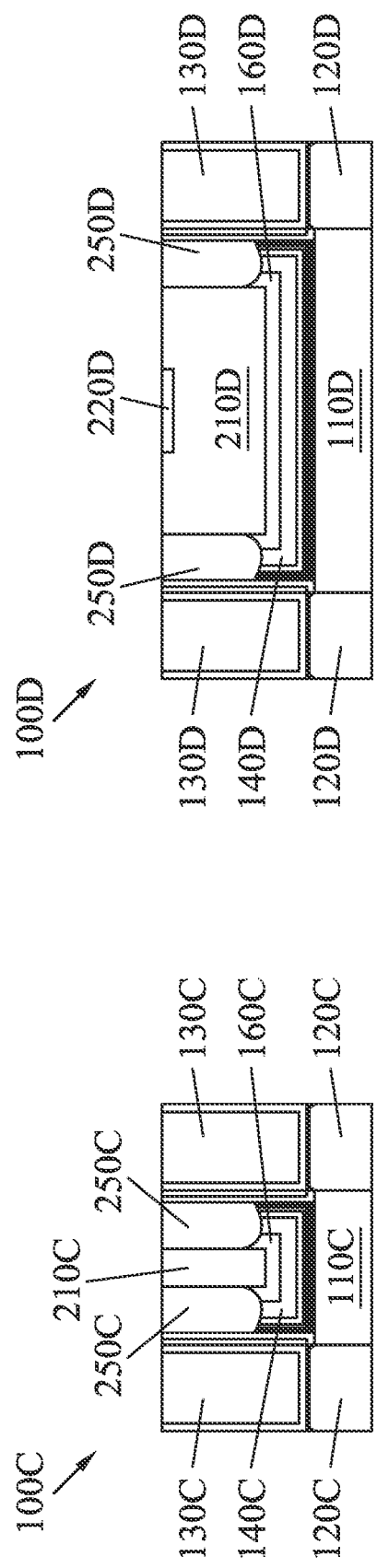

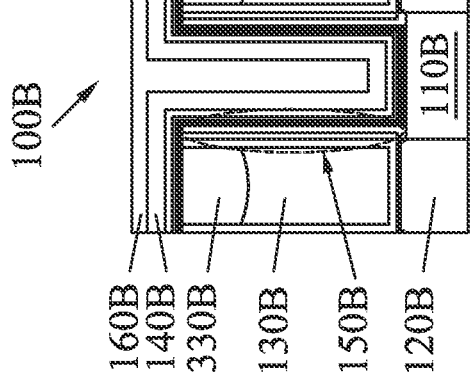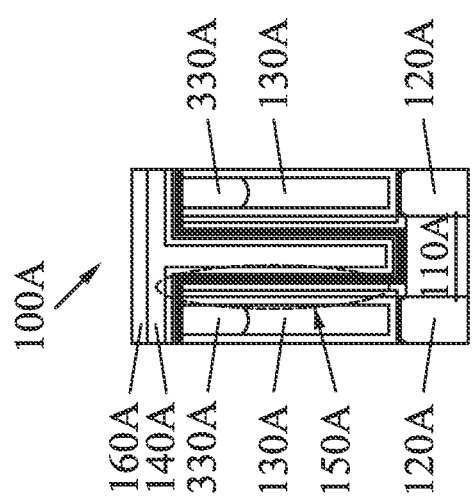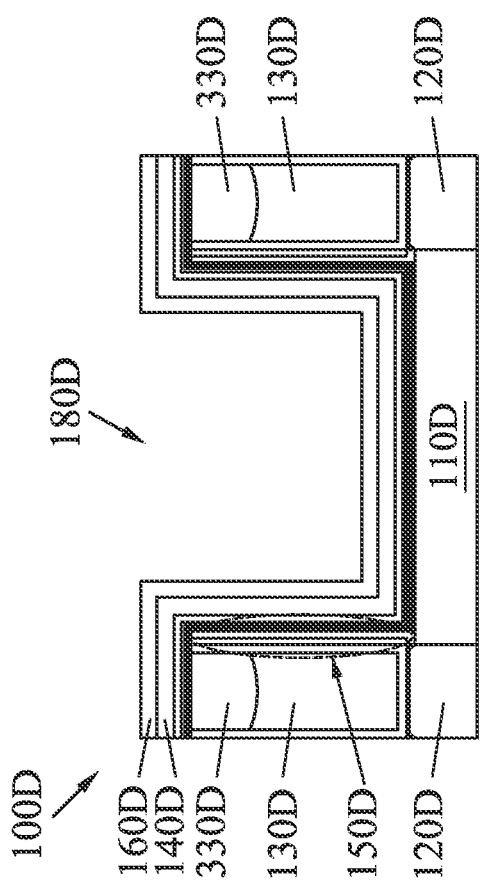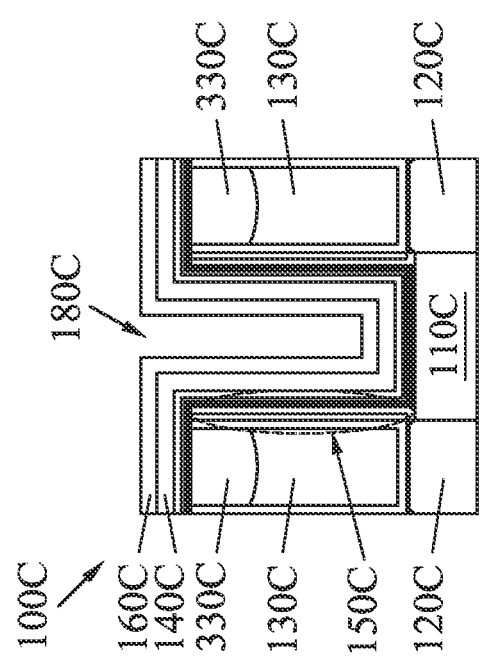

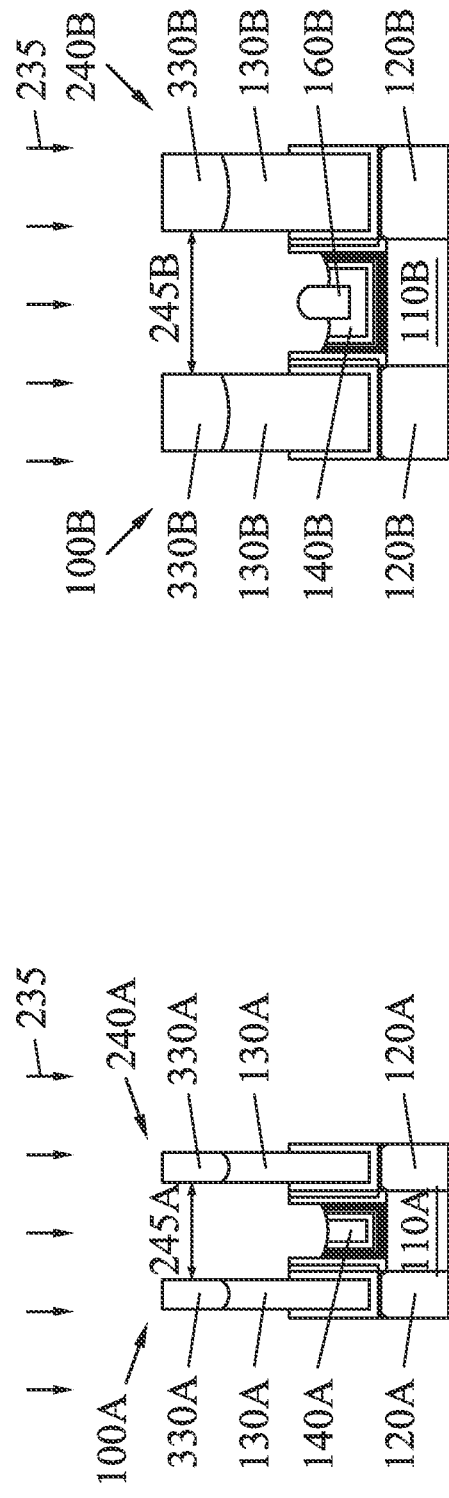
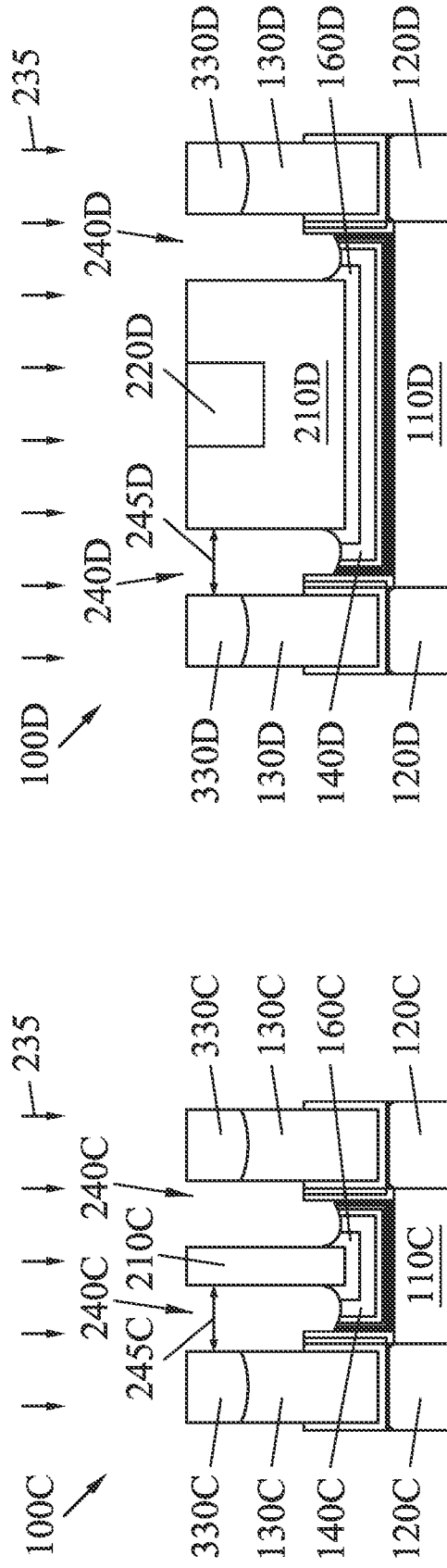

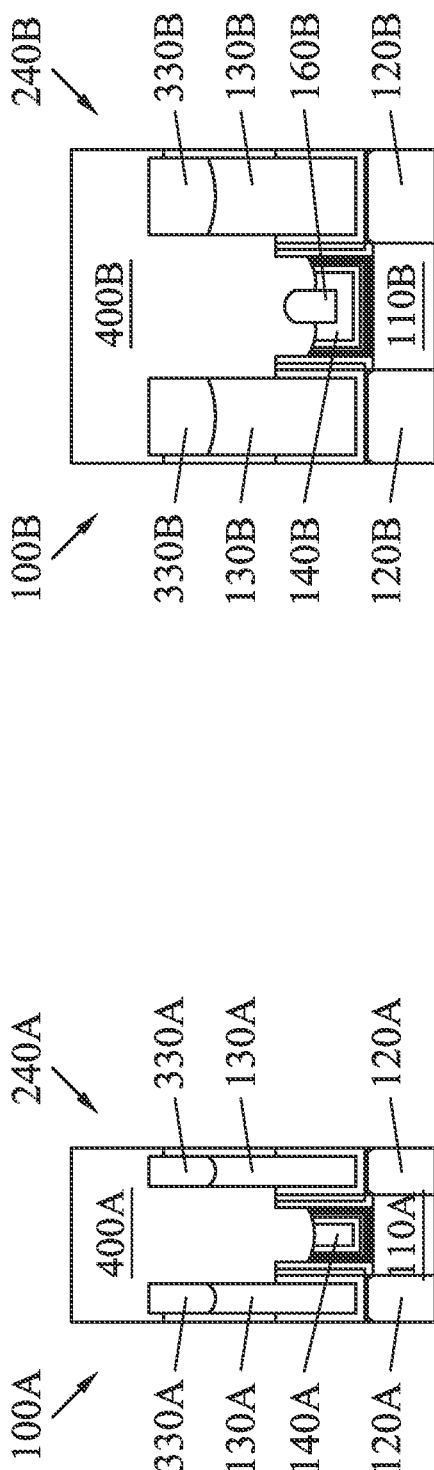
Fig. 26A
Fig. 26B
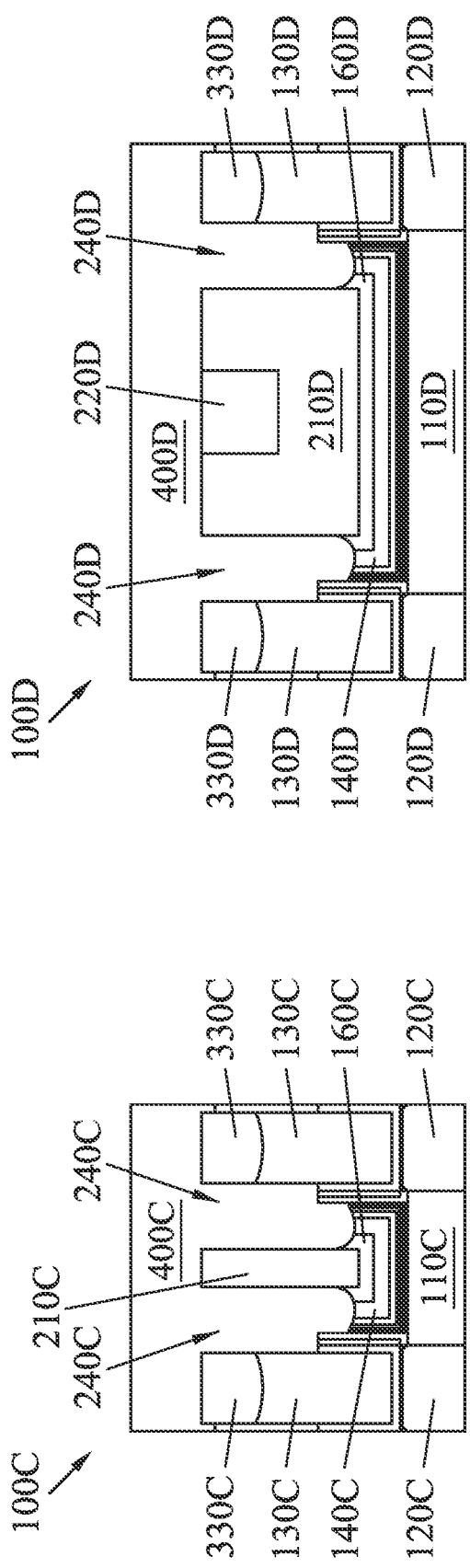
Fig. 26C
Fig. 26D

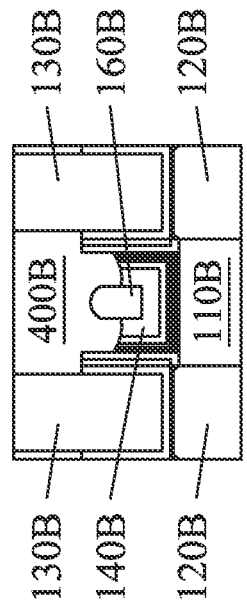
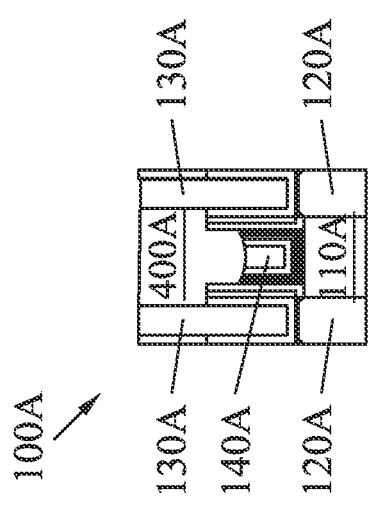
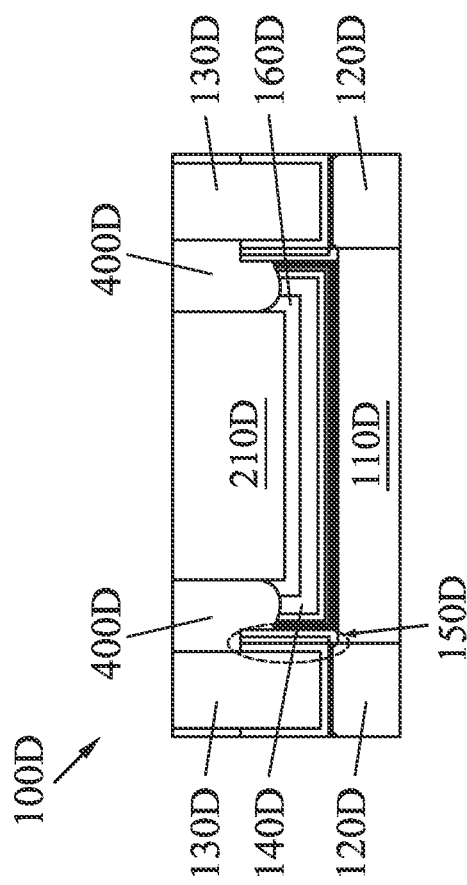
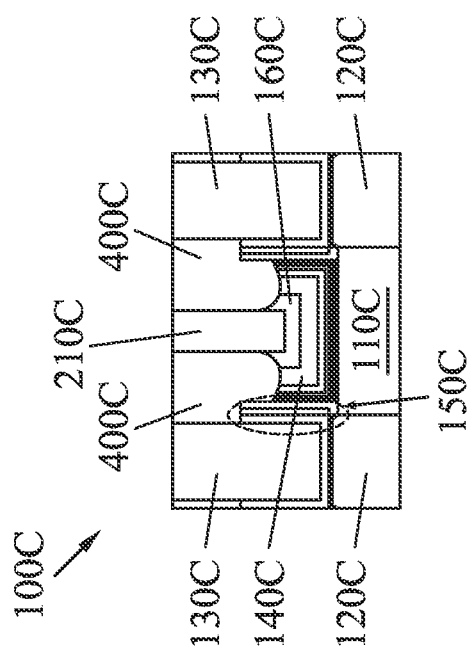

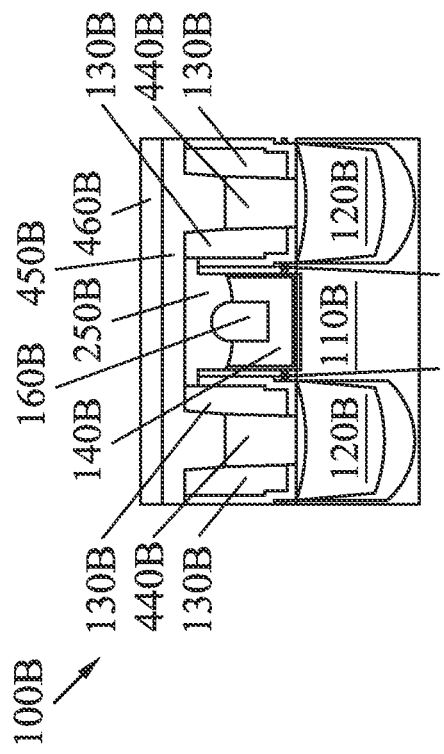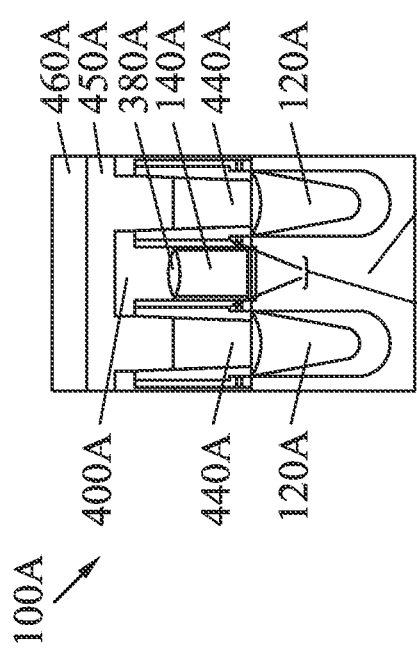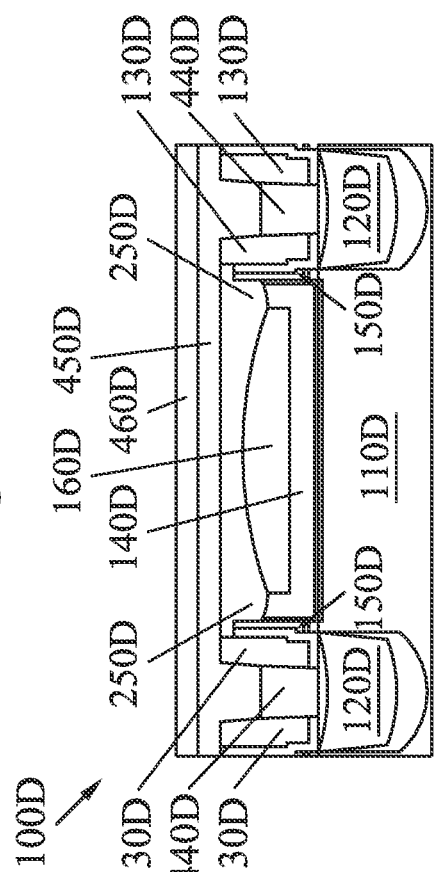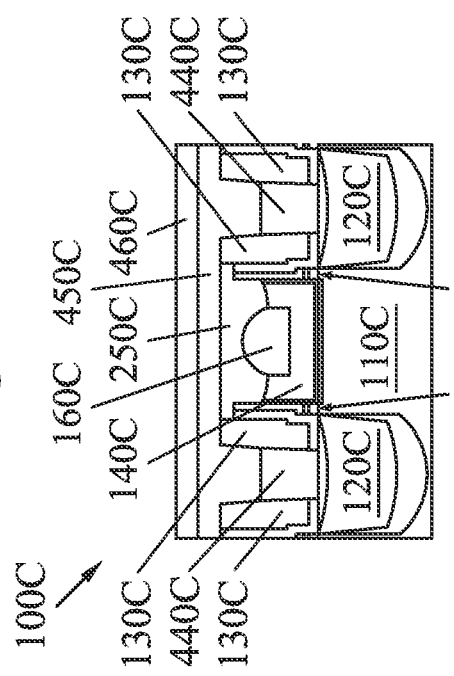

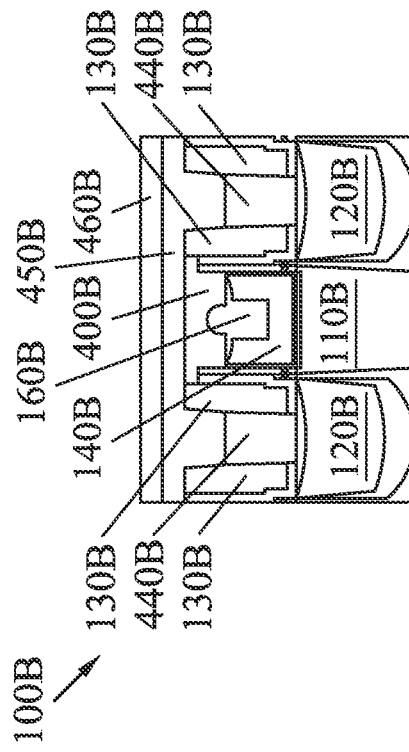
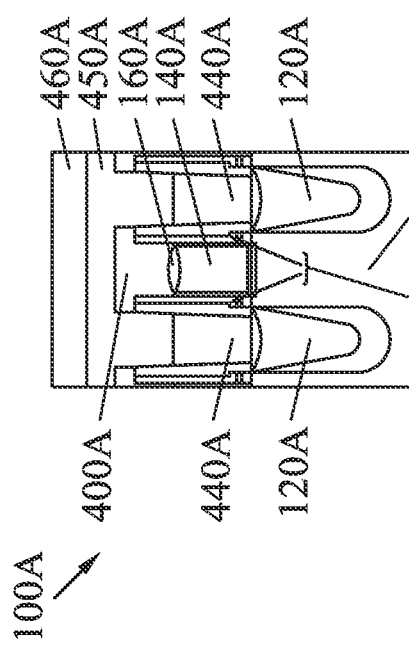
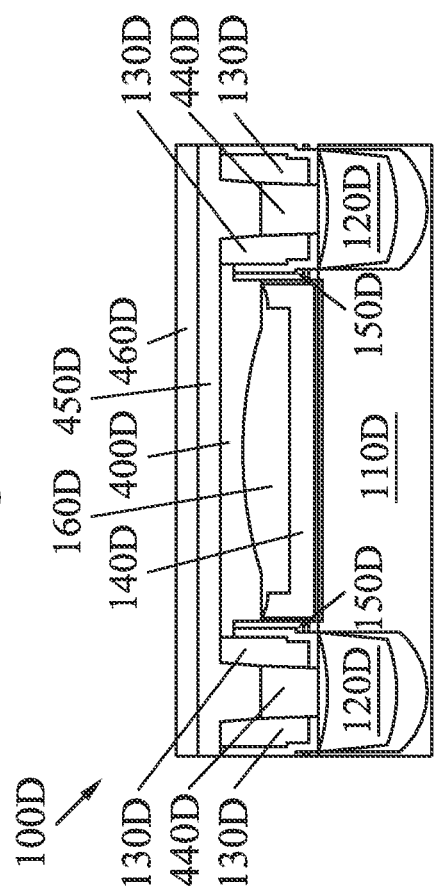
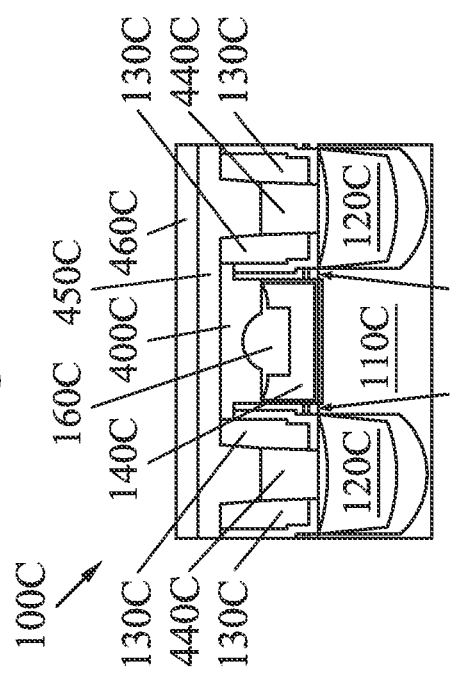

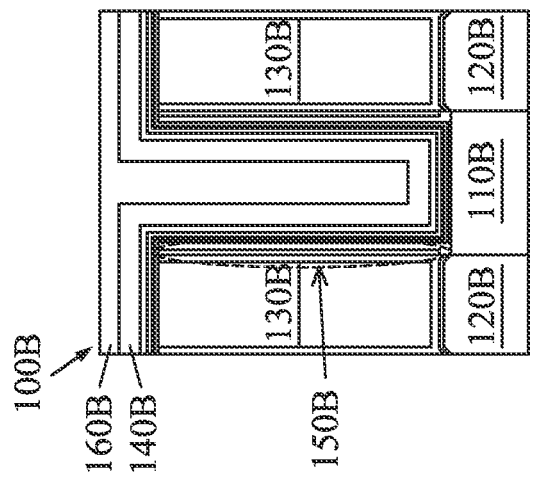
Fig. 35A
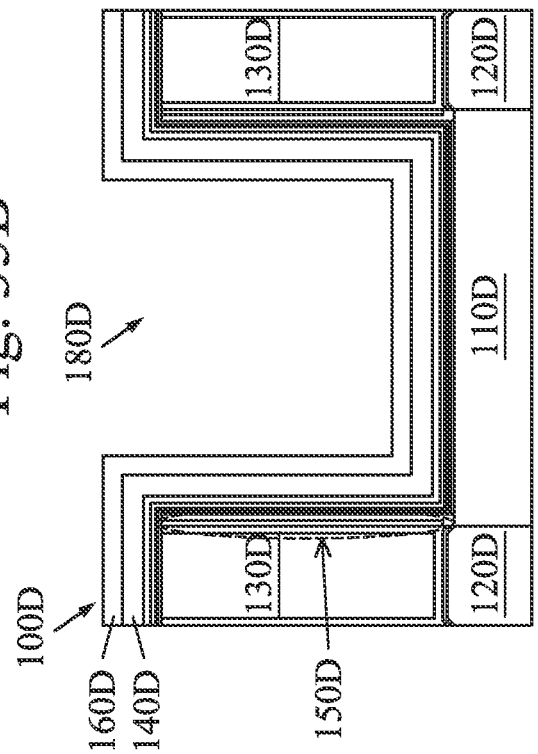
Fig. 35B
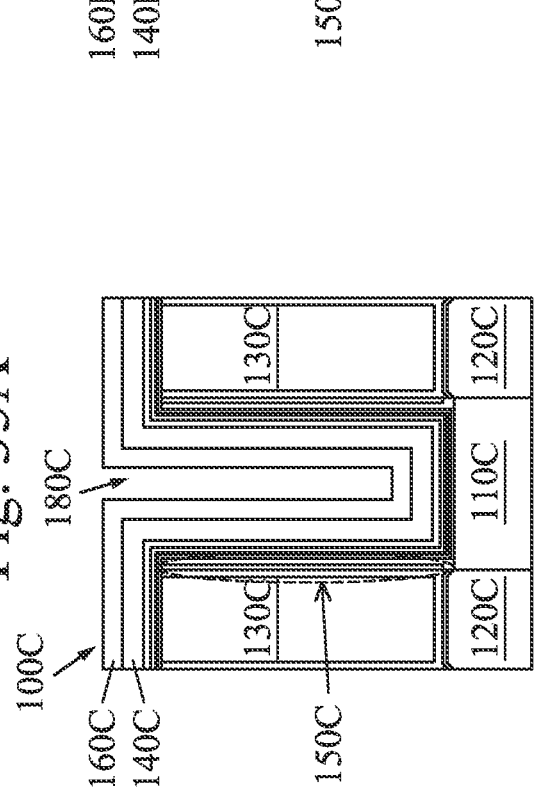
Fig. 35C
Fig. 35D

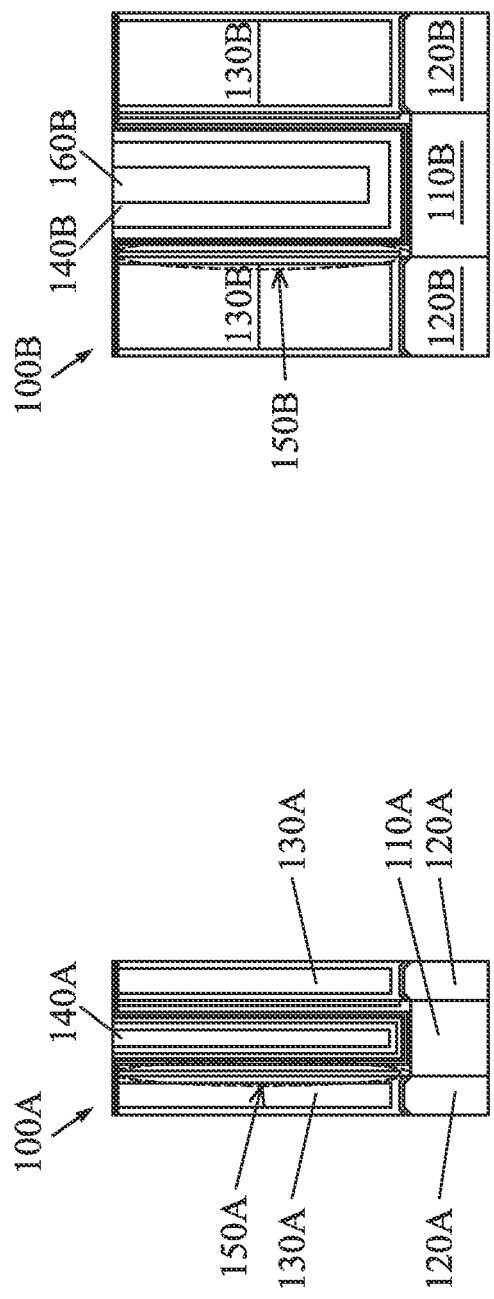
Fig. 36A
Fig. 36B
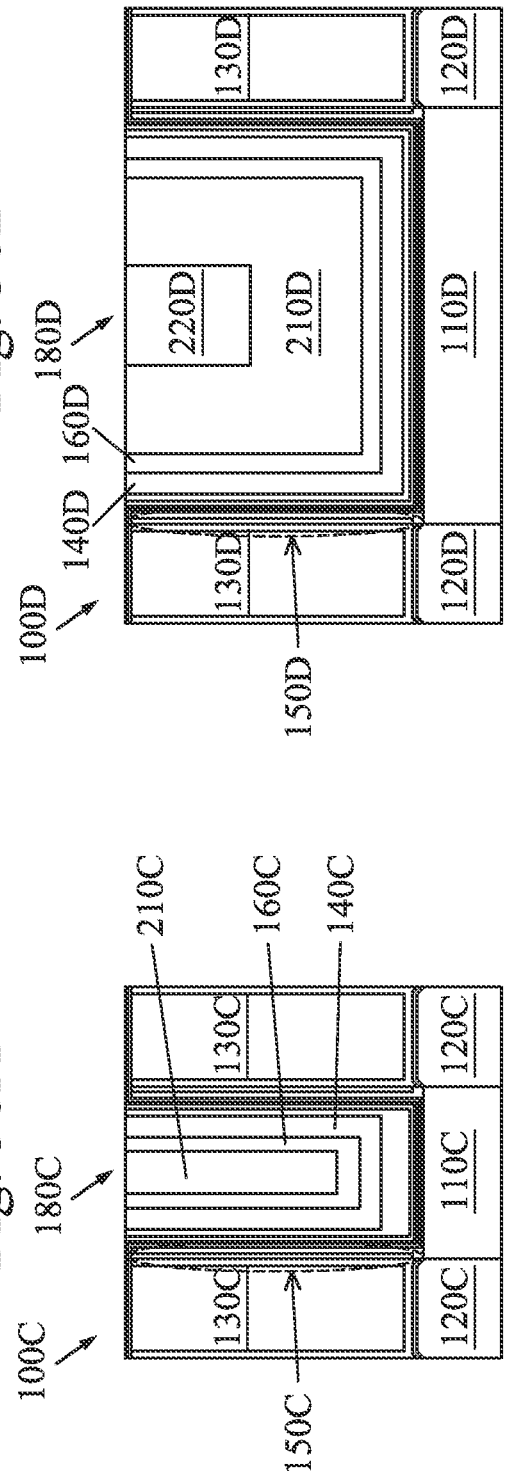
Fig. 36C
Fig. 36D

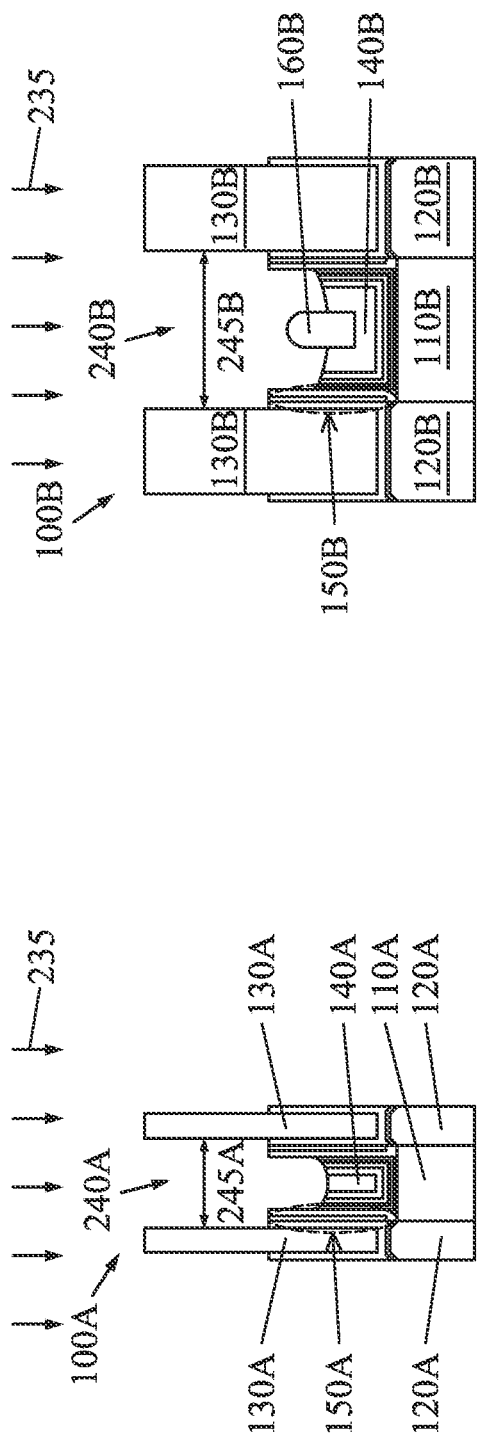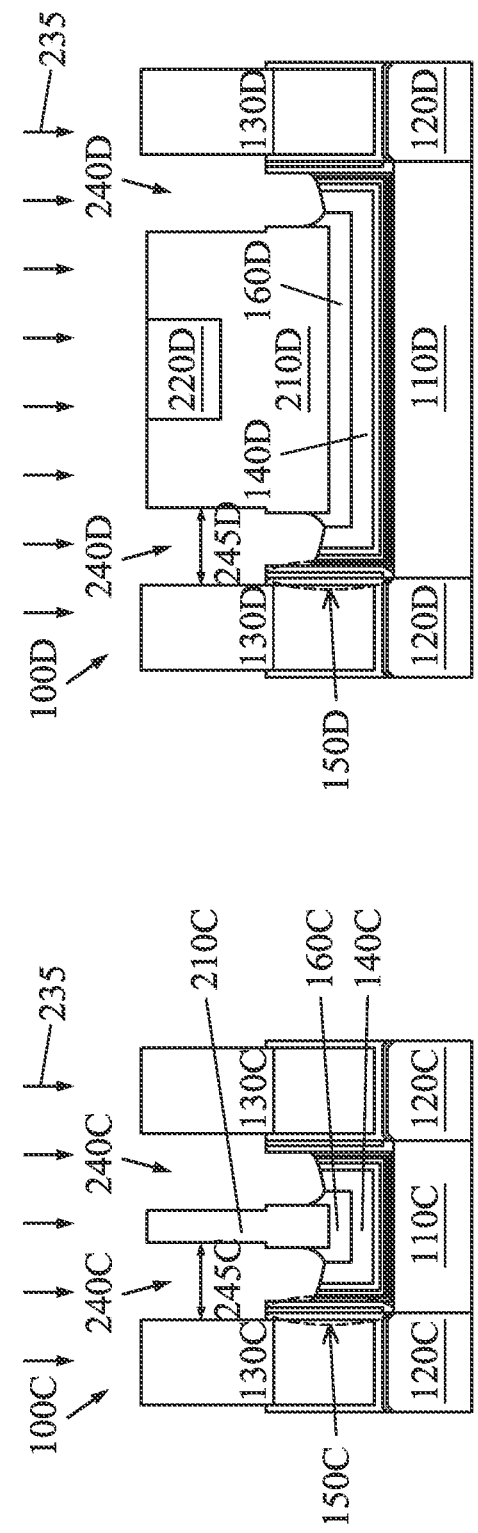
Fig. 37A
Fig. 37B
Fig. 37C
Fig. 37D

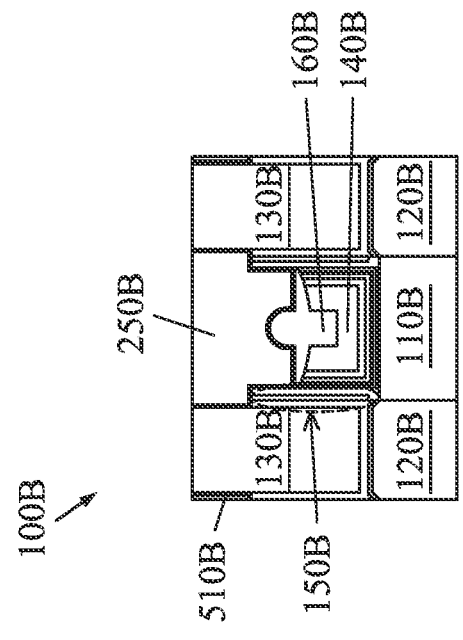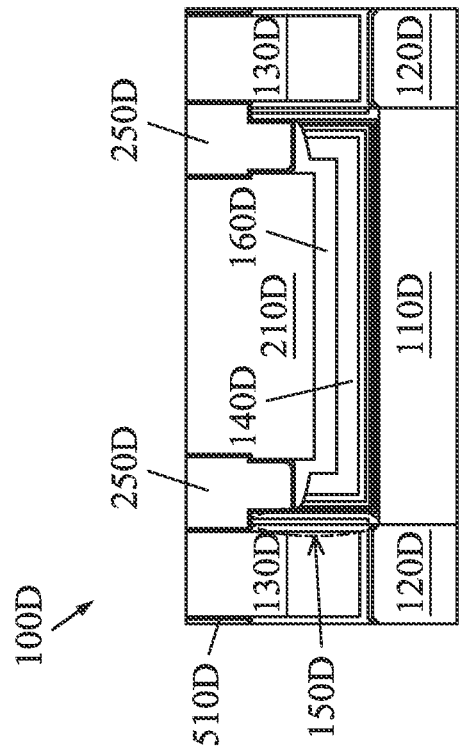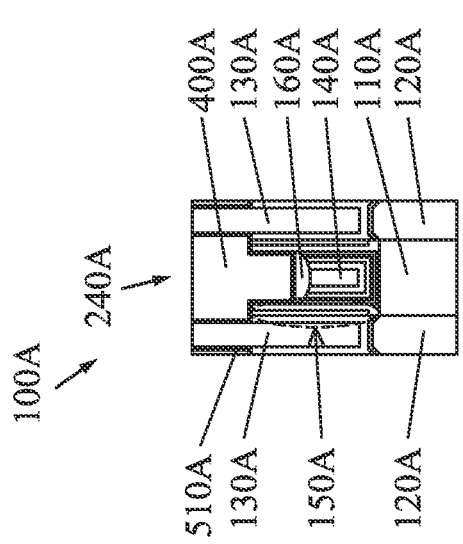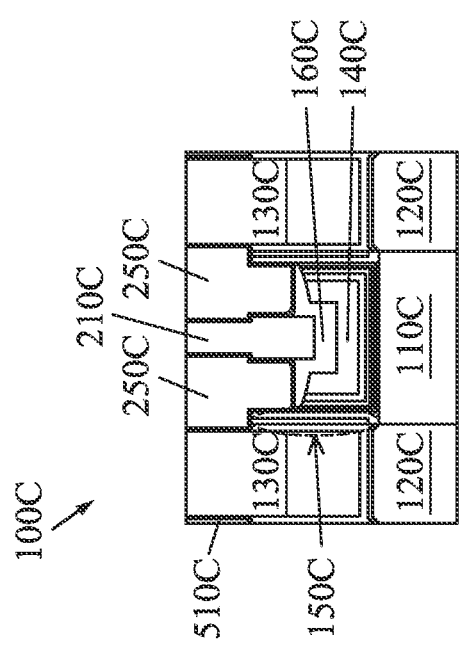
Fig. 41A
Fig. 41B
Fig. 41C
Fig. 41D

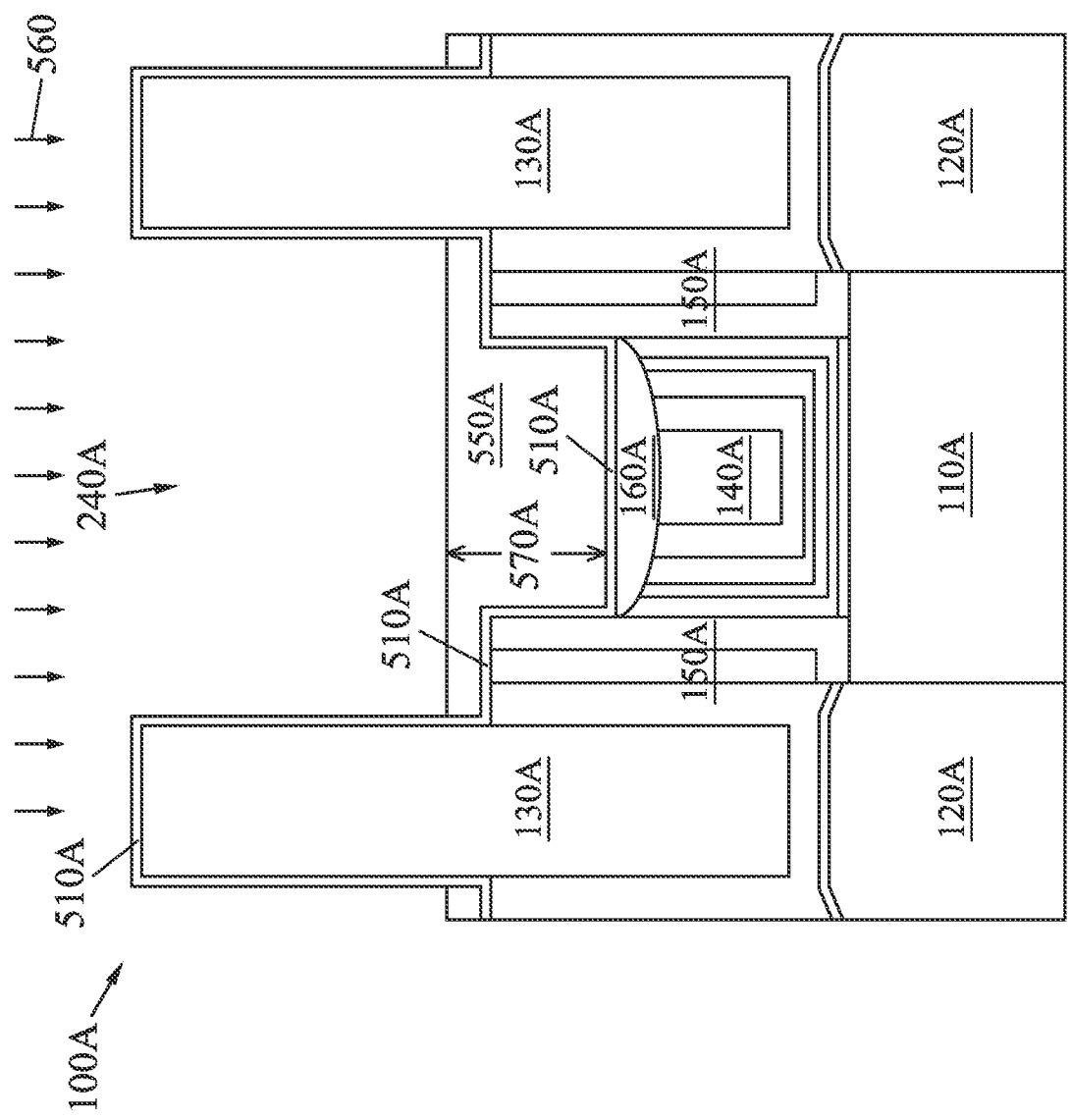

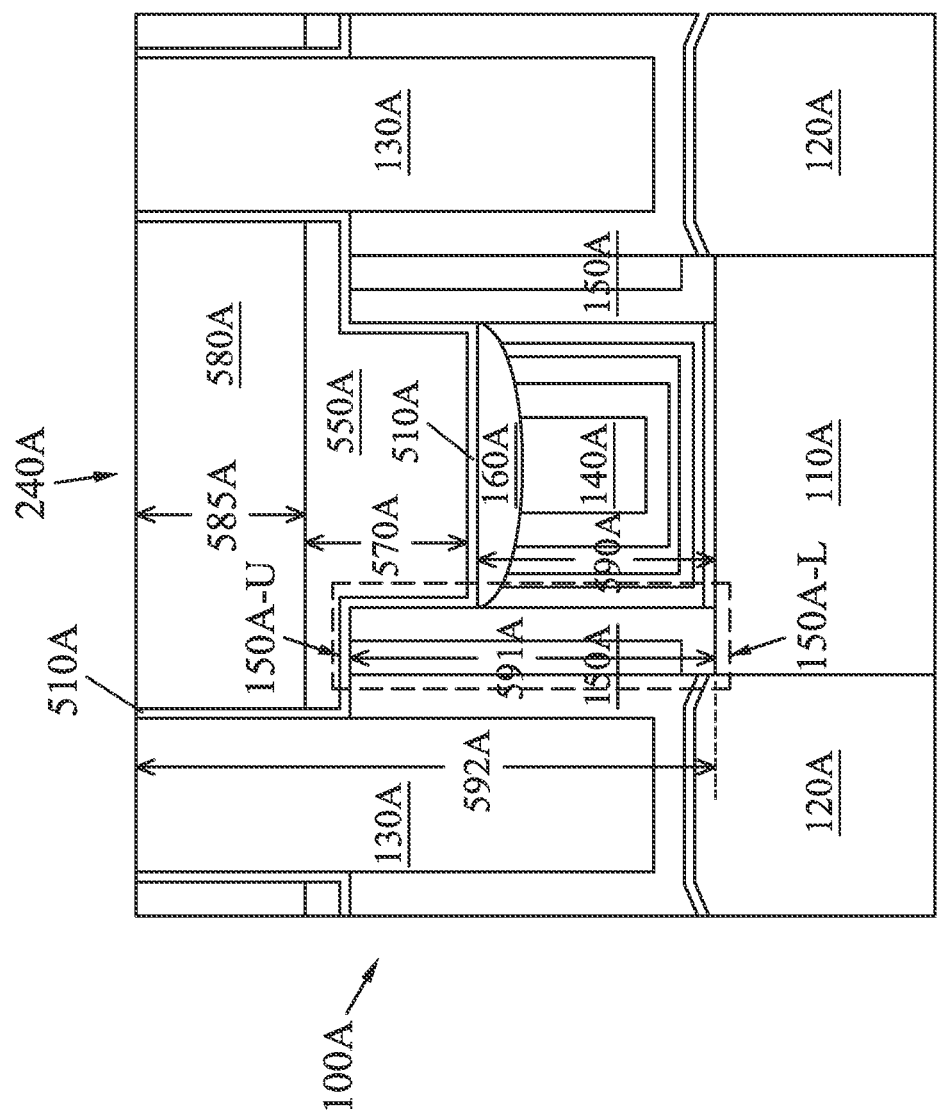

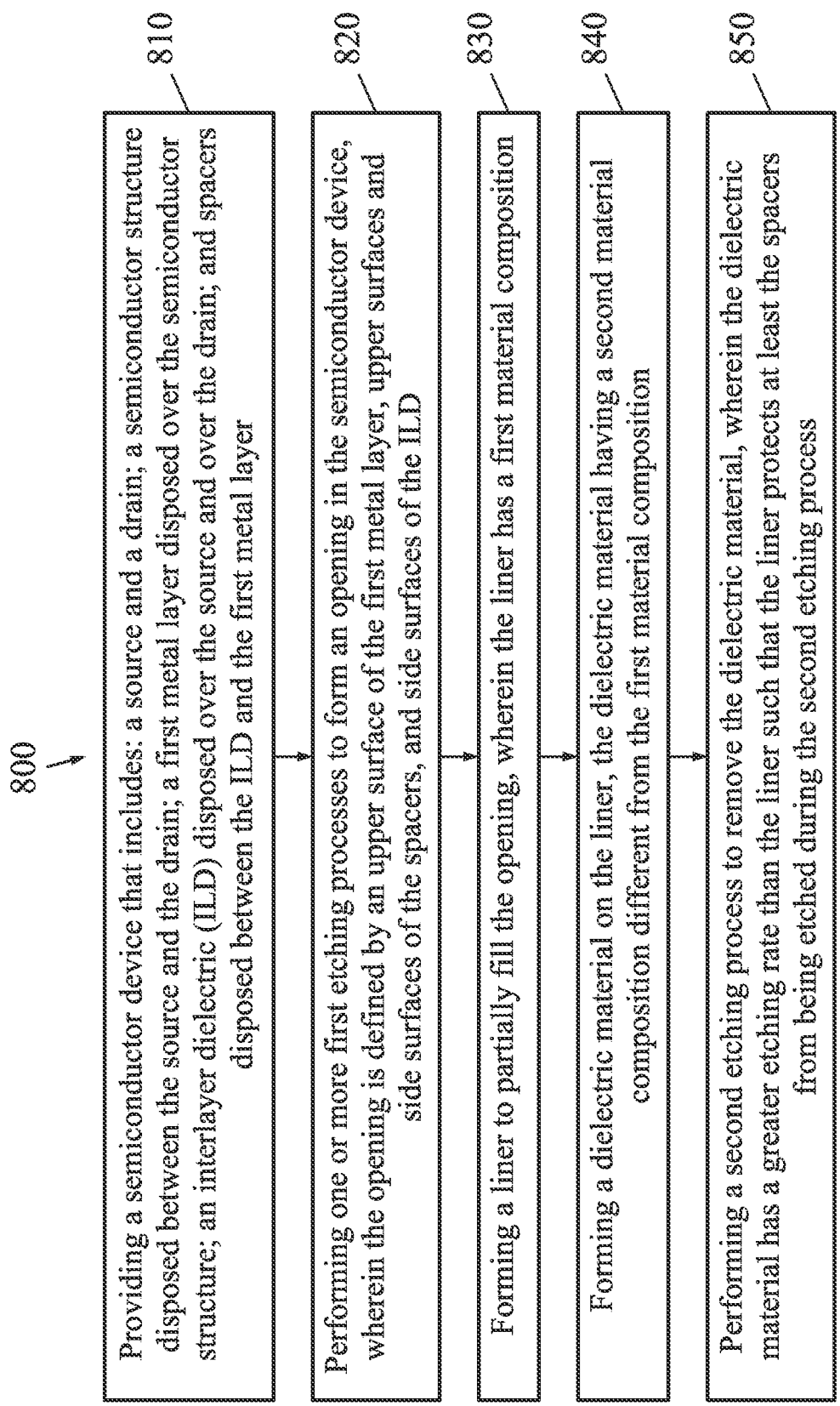

LINER FOR A BI-LAYER GATE HELMET AND THE FABRICATION THEREOF

PRIORITY DATA

The present application is a divisional application of U.S. patent application Ser. No. 16/510,554, filed on Jul. 12, 2019, which is a utility application of U.S. Provisional Patent Application No. 62/734,013, filed on Sep. 20, 2018, entitled "Liner For A Bi-Layer Gate Helmet And The Fabrication Thereof", the contents of which are hereby incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreased geometry sizes lead to challenges in semiconductor fabrication. For example, as geometry sizes continue to decrease, loading (e.g., due to components having different sizes) may become a concern. For example, loading issues could lead to excessive loss of a gate height of a transistor. When this occurs, the result is degraded device performance or even device failures.

Therefore, while existing semiconductor devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-33A, 2B-33B, 2C-33C, and 2D-33D are cross-sectional views of semiconductor devices at various stages of fabrication according to various embodiments of the present disclosure.

FIGS. 35A-41A, 35B-41B, 35C-41C, and 35D-41D are cross-sectional views of semiconductor devices at various stages of fabrication according to an embodiment of the present disclosure.

FIGS. 42A-46A are cross-sectional views of a semiconductor device at various stages of fabrication according to an embodiment of the present disclosure.

FIG. 47 is a flow chart of a method for fabricating a semiconductor device in accordance with embodiments of the present disclosure.

DETAILED DESCRIPTION

Figure 1:
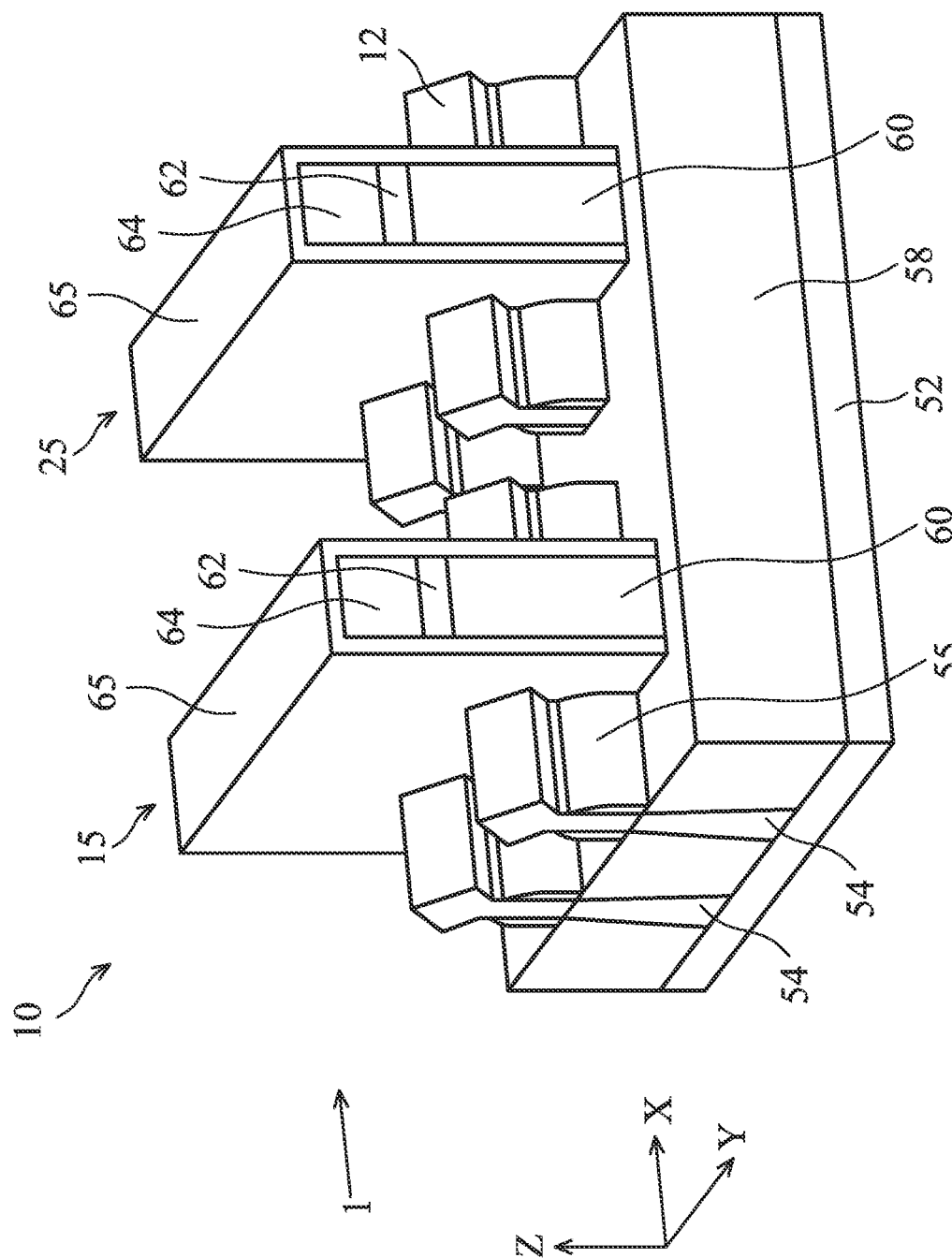
FIG. 1 is a perspective view of an example FinFET device.
Figure 6B:
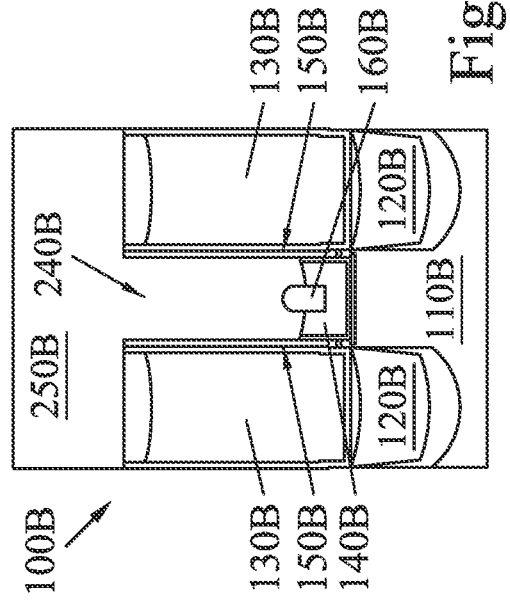
Figure 6D:
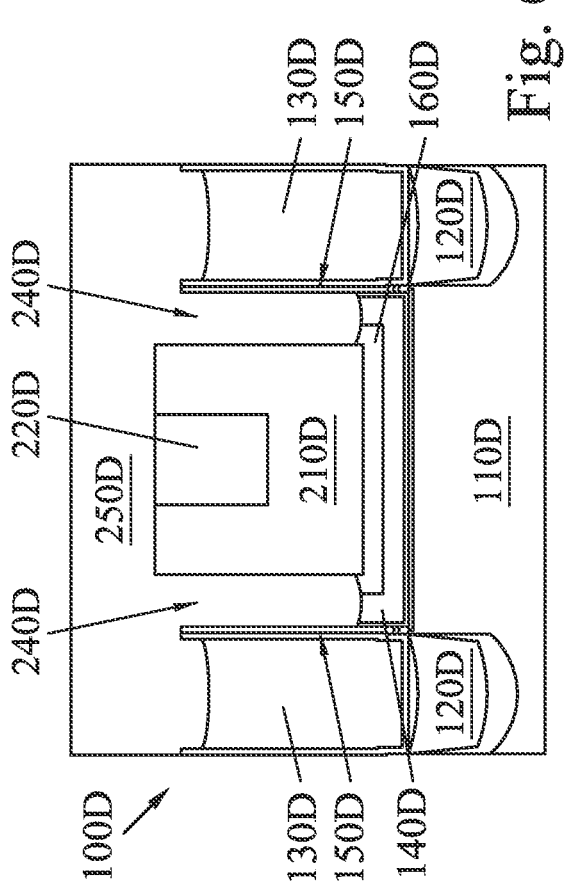
Figure 6A:
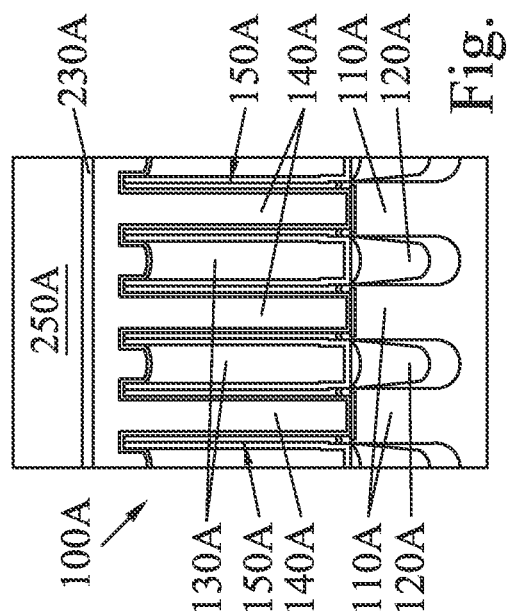
Figure 6C:
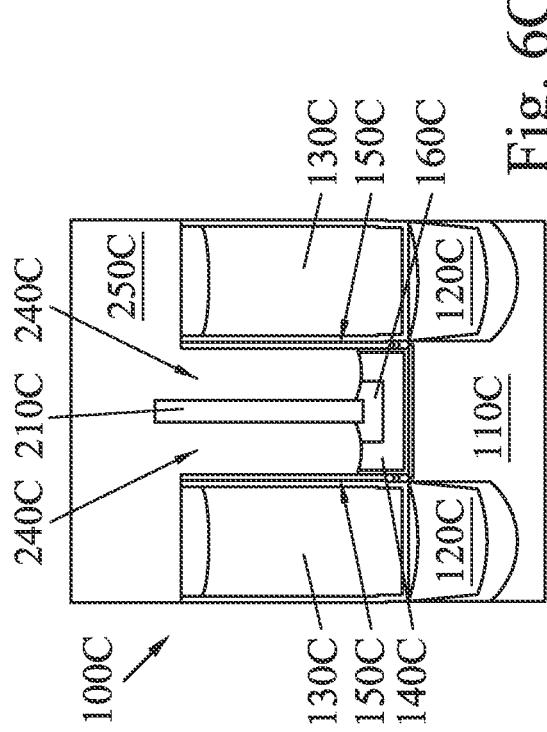
Figure 14A:
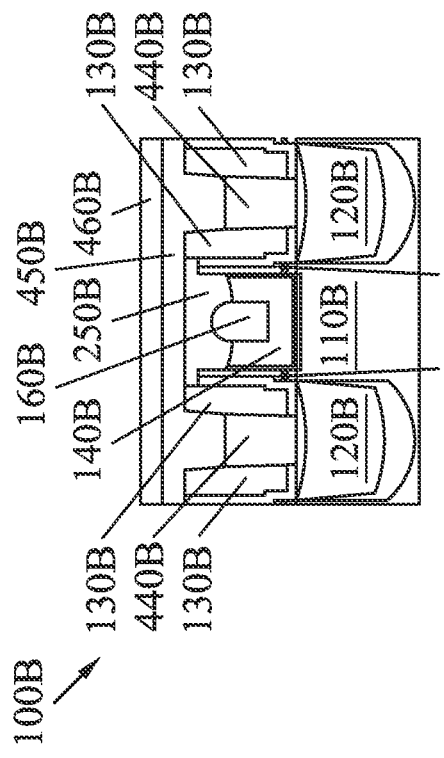
Figure 14C:
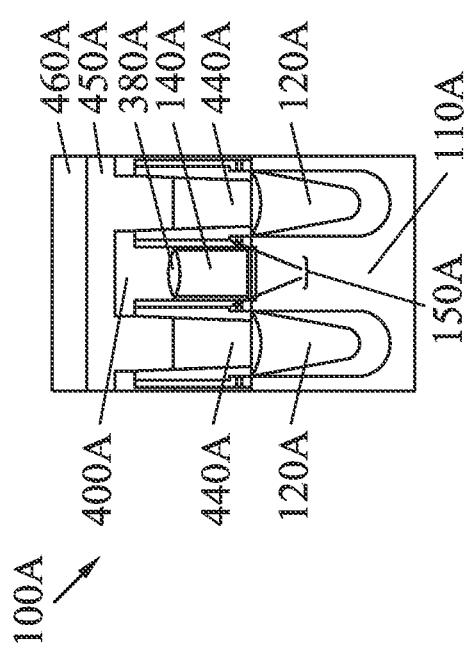
Figure 14B:
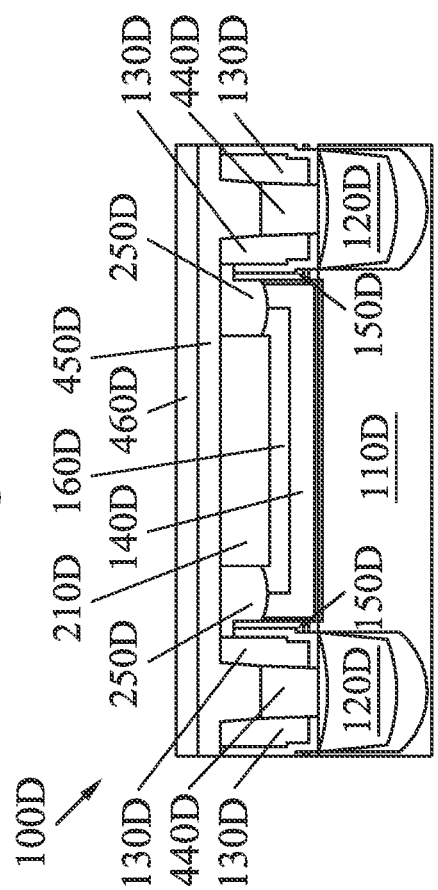
Figure 14D:
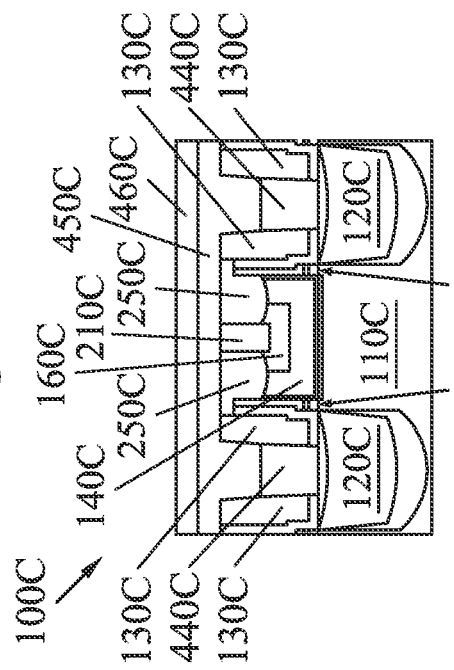
Figure 15A:
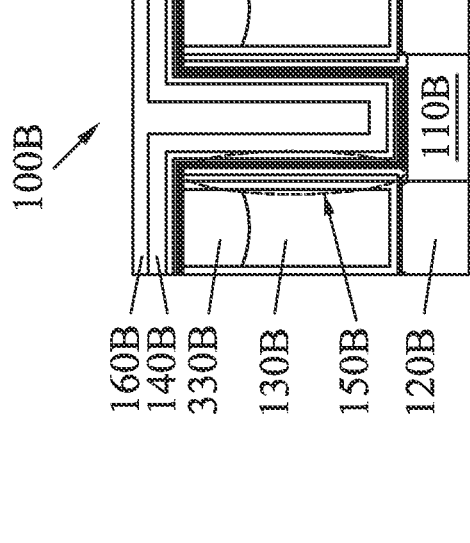
Figure 15B:
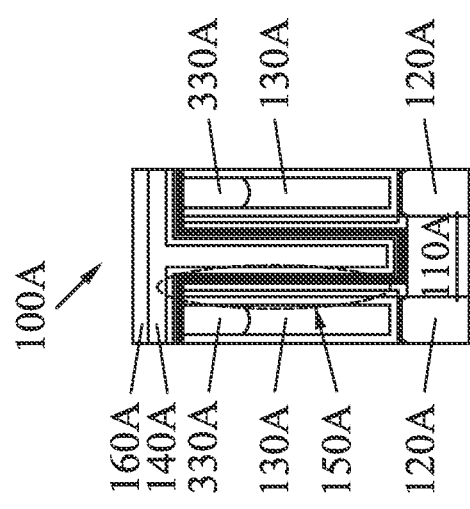
Figure 15C:
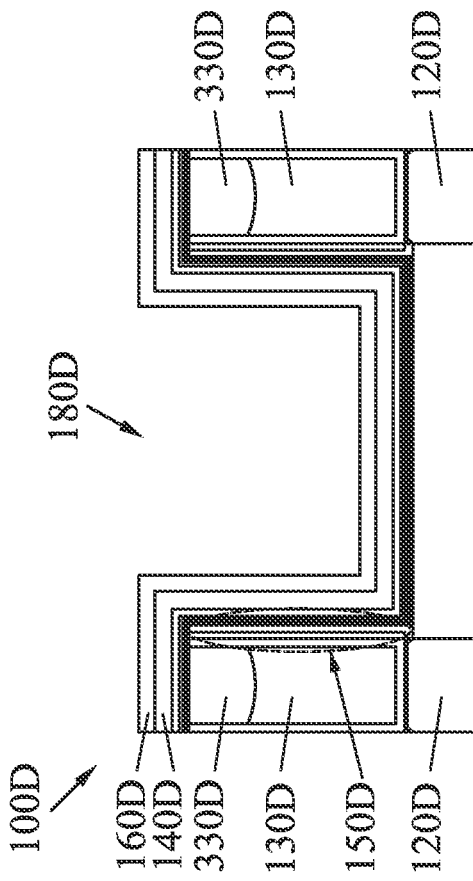
Figure 15D:
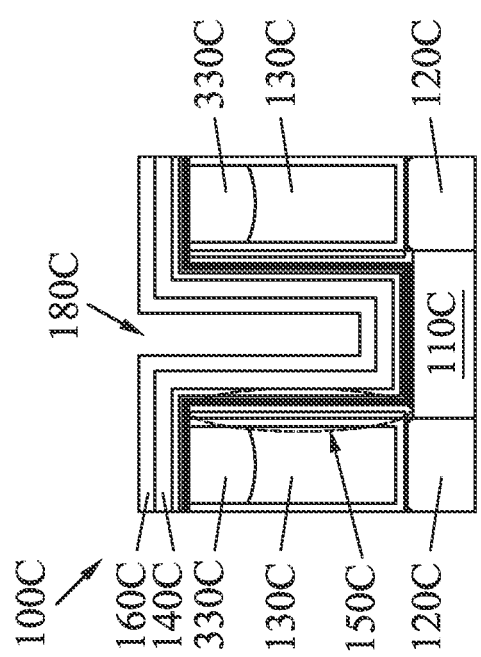
Figure 16A:
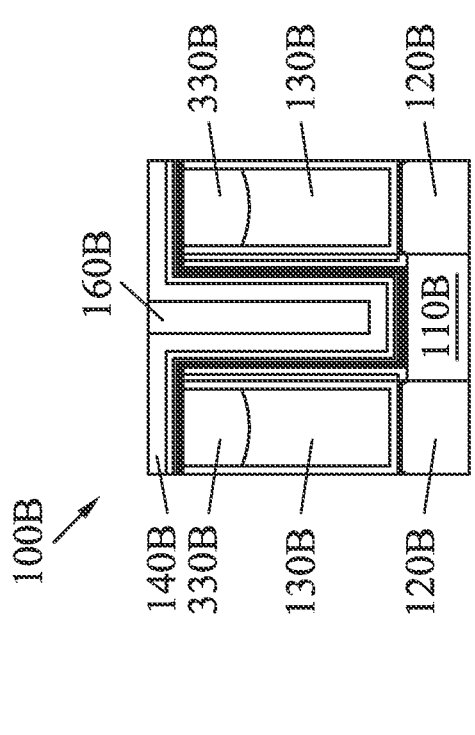
Figure 16B:
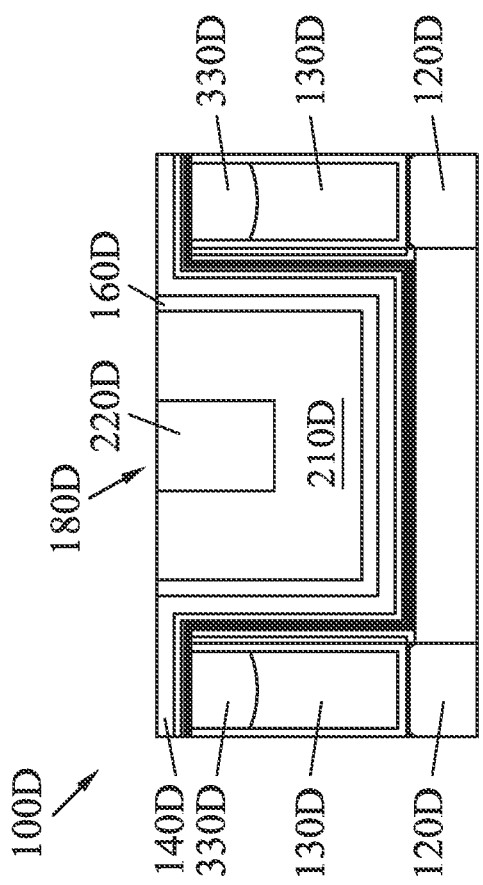
Figure 16C:
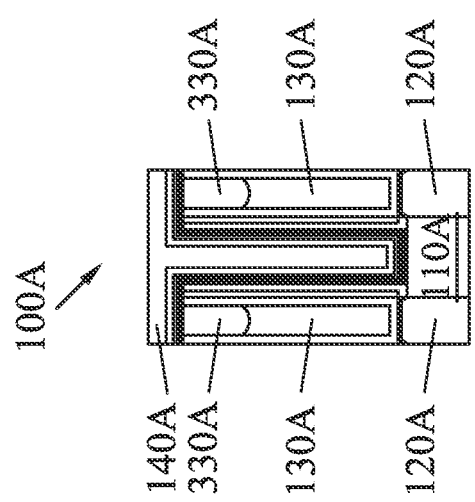
Figure 16D:
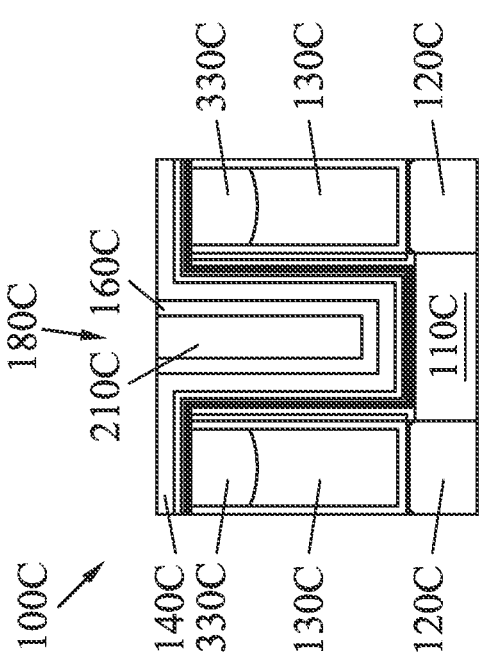
Figure 21A:
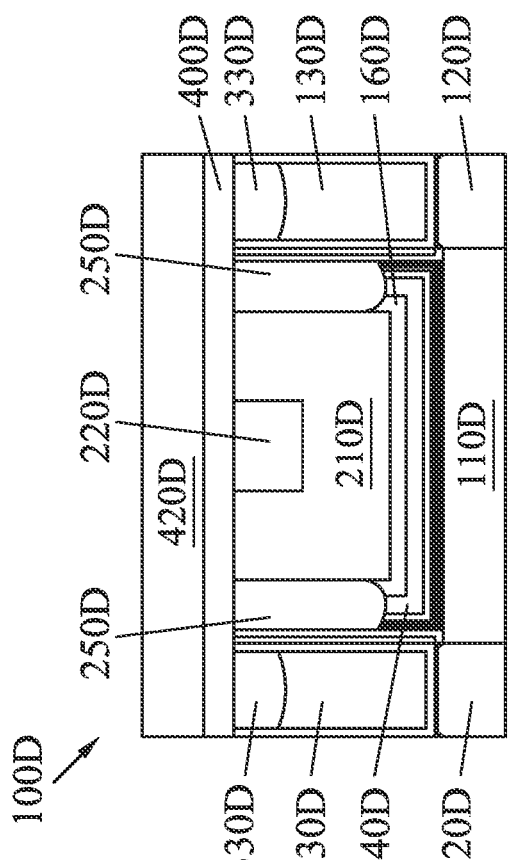
Figure 21B:
Figure 21C:
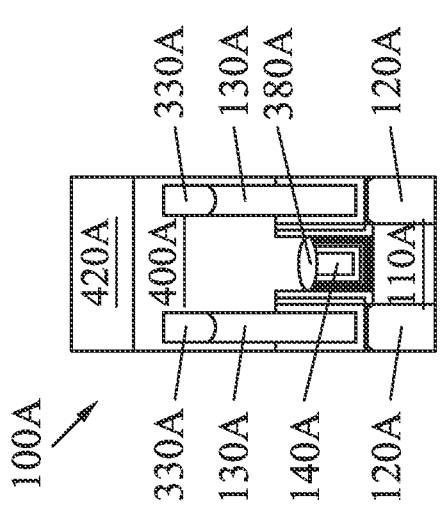
Figure 21D:
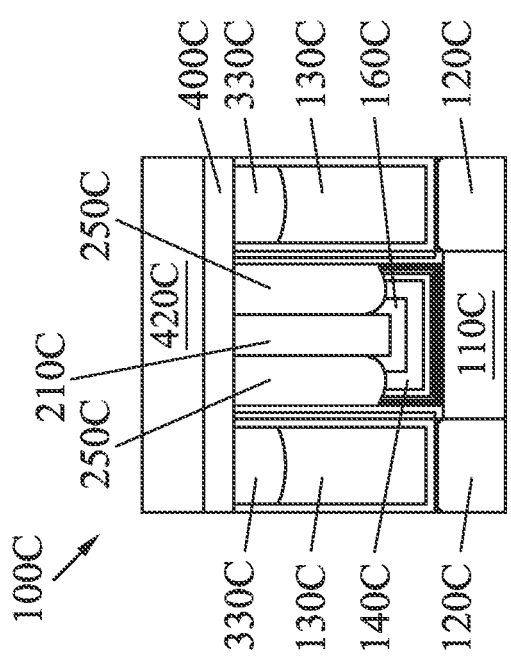
Figure 24A:
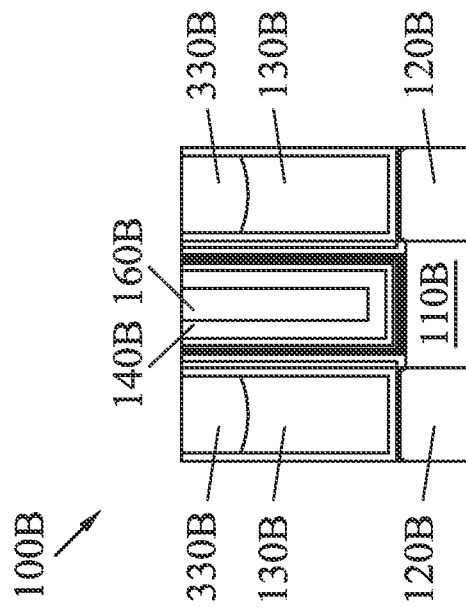
Figure 24C:
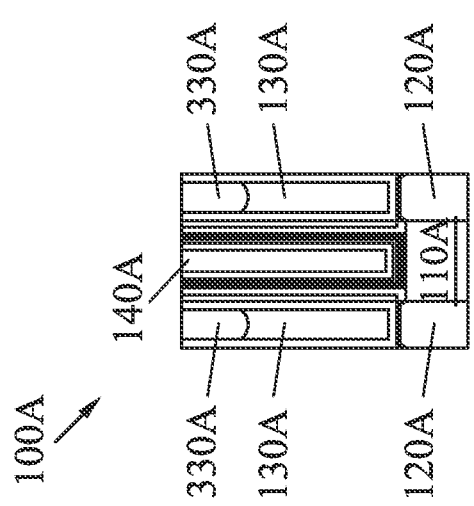
Figure 24B:
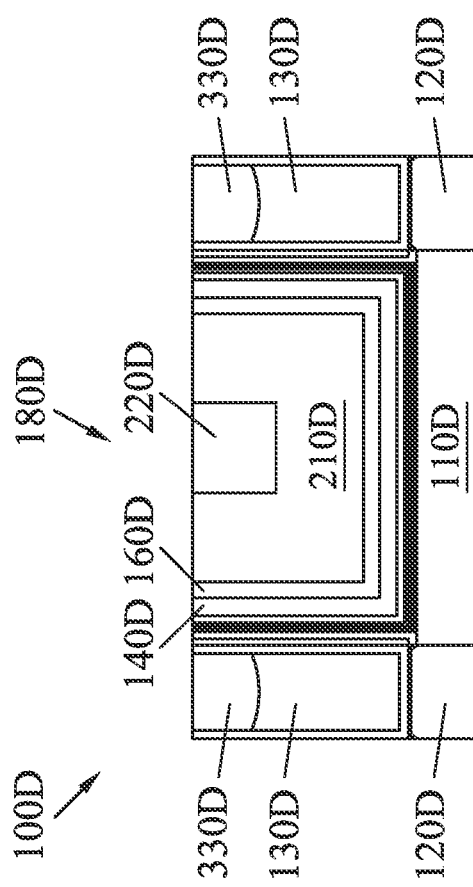
Figure 24D:
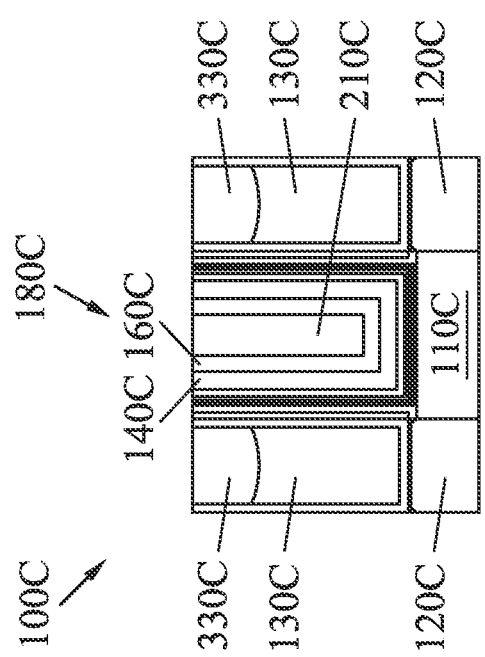
Figure 27A:
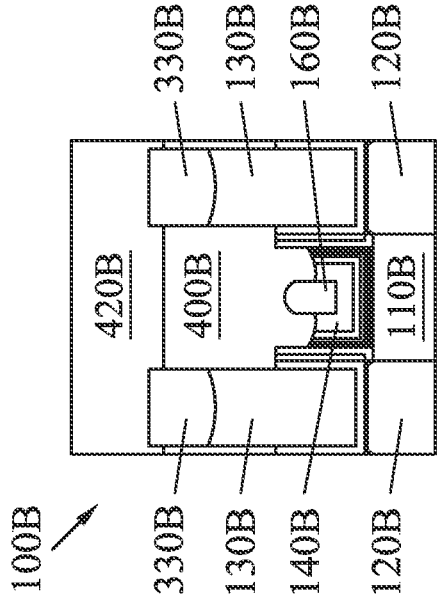
Figure 27C:
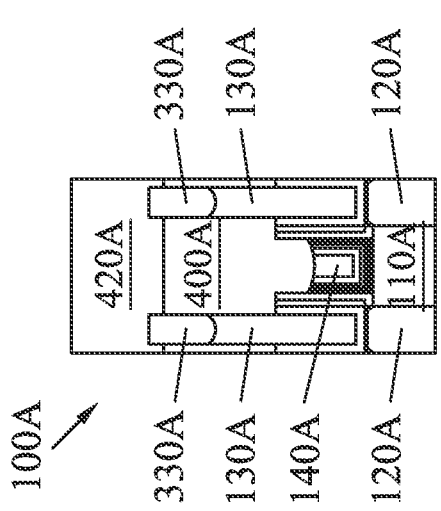
Figure 27B:
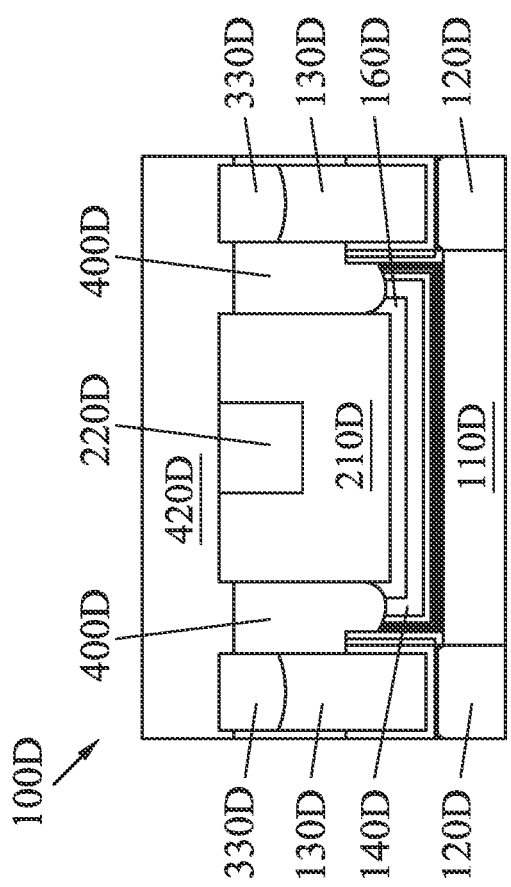
Figure 27D:
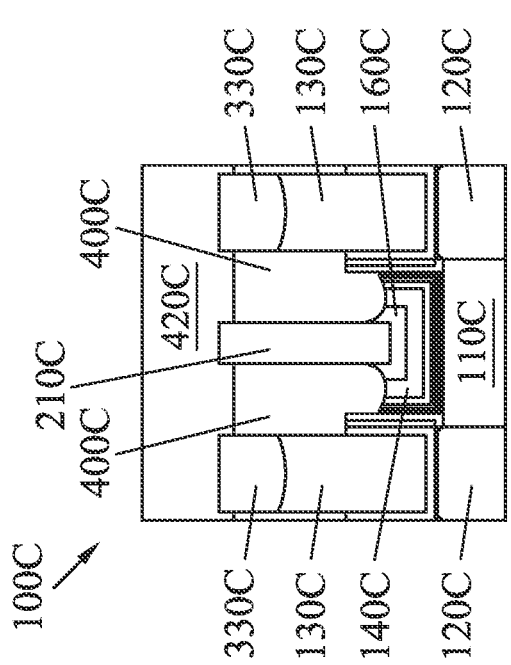
Figure 29A:
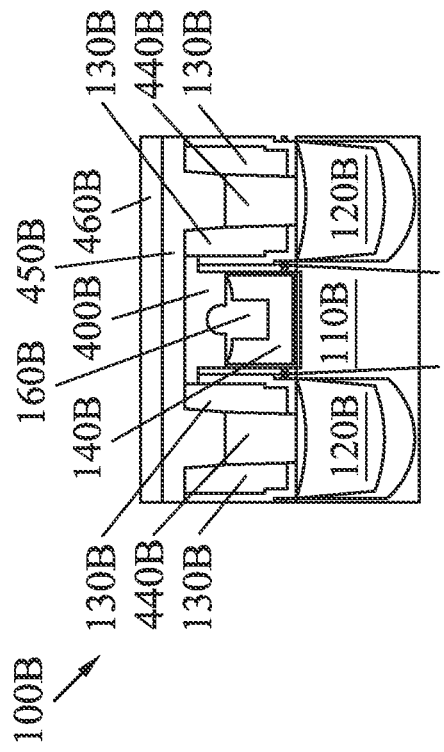
Figure 29C:
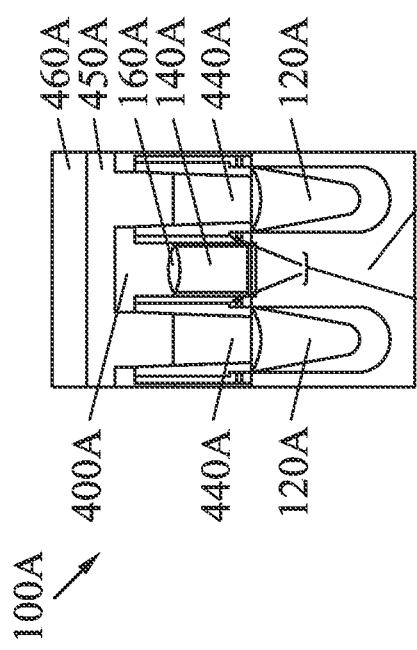
Figure 29B:
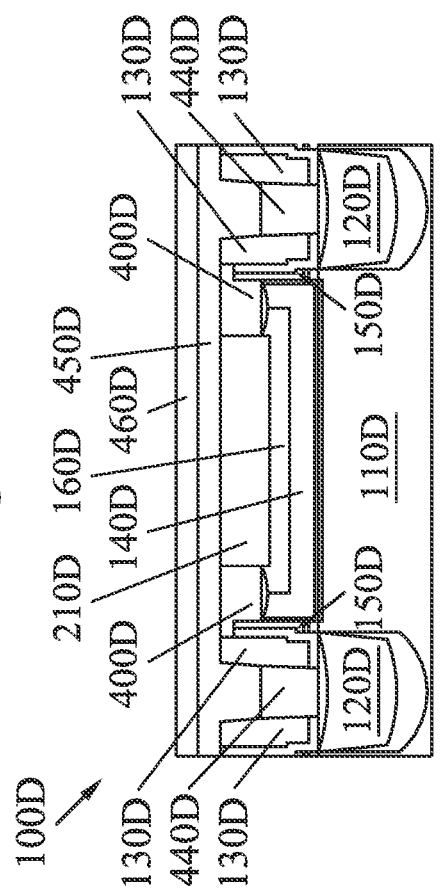
Figure 29D:
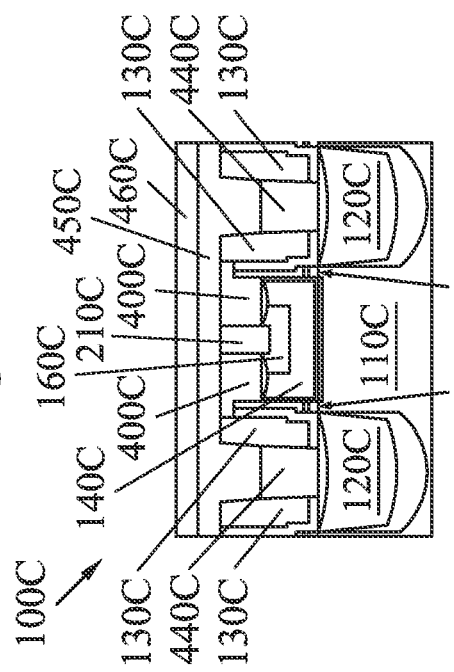
Figure 30A:
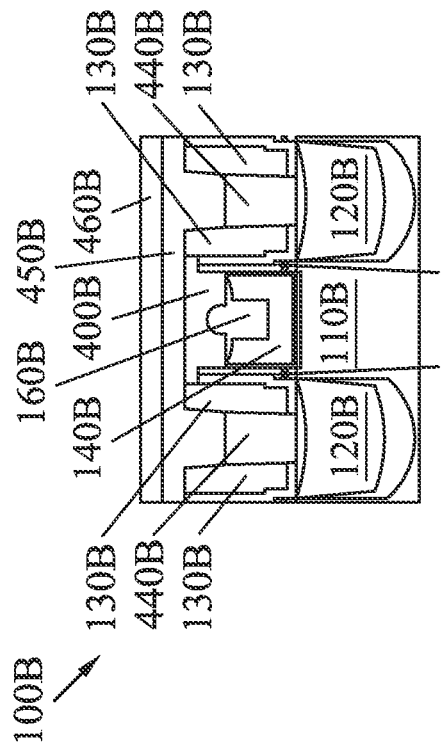
Figure 30C:
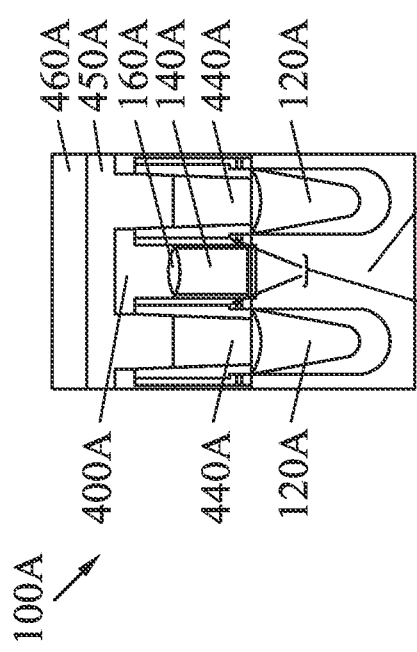
Figure 30B:
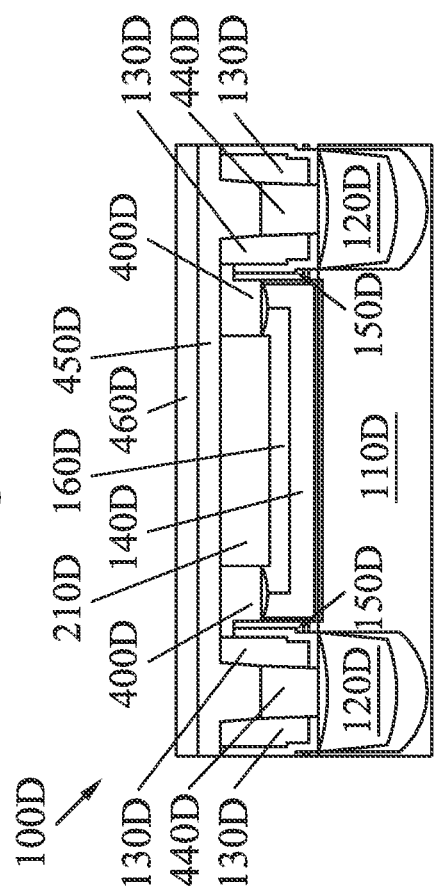
Figure 30D:
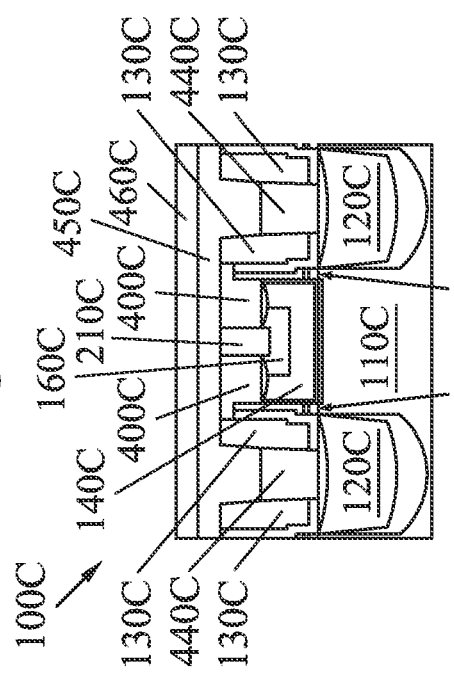
Figure 31A:
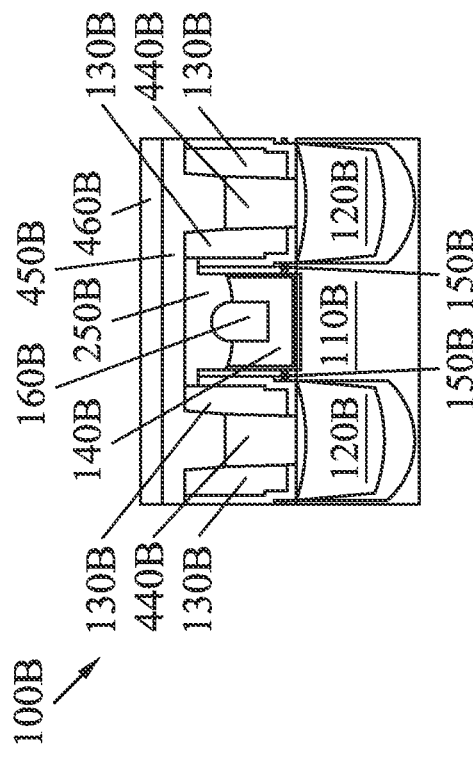
Figure 31C:
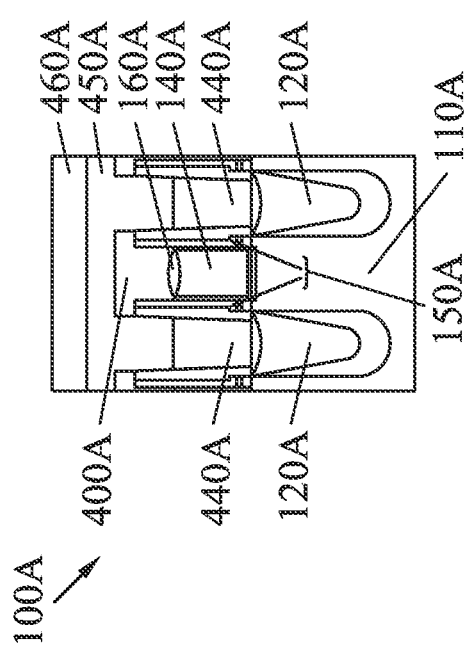
Figure 31B:
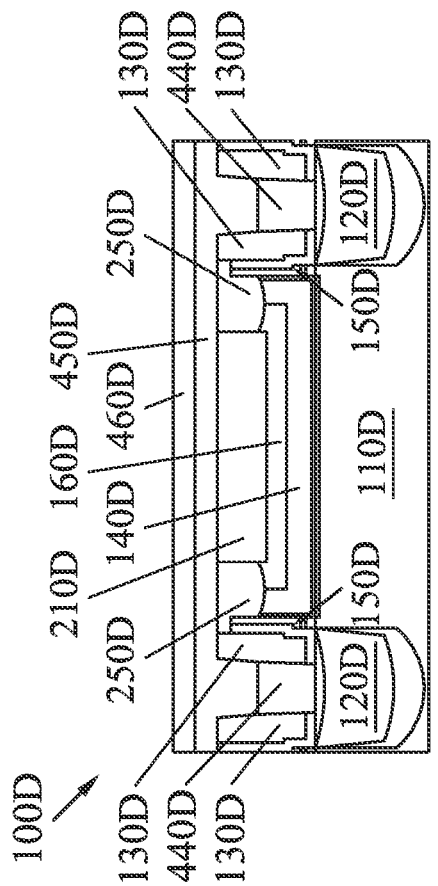
Figure 31D:
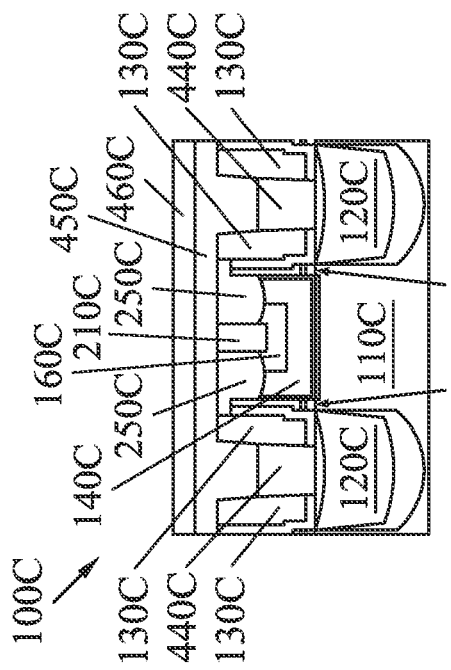

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a method to perform semiconductor fabrication, for example an aspect of semiconductor fabrication pertaining to metal gate electrode formation. To illustrate the various aspects of the present disclosure, a FinFET fabrication process is discussed below as a non-limiting example. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure, but it is understood that the application is not limited to the FinFET device, except as specifically claimed. In other words, the various aspects of the present disclosure may be applied in the fabrication of two-dimensional planar transistors too.

Referring to FIG. 1, a perspective view of an example FinFET device 10 is illustrated. The FinFET device structure 10 includes a N-type FinFET device structure (NMOS) 15 and a P-type FinFET device structure (PMOS) 25. The FinFET device structure 10 includes a substrate 52. The substrate 52 may be made of silicon or other semiconductor materials. Alternatively or additionally, the substrate 52 may include other elementary semiconductor materials such as germanium. In some embodiments, the substrate 52 is made of a compound semiconductor such as silicon carbide, gallium arsenic, indium arsenide, or indium phosphide. In some embodiments, the substrate 52 is made of an alloy semiconductor such as silicon germanium, silicon germanium carbide, gallium arsenic phosphide, or gallium indium phosphide. In some embodiments, the substrate 52 includes an epitaxial layer. For example, the substrate 52 may include an epitaxial layer overlying a bulk semiconductor.

The FinFET device structure 10 also includes one or more fin structures 54 (e.g., Si fins) that extend from the substrate 52 in the Z-direction and surrounded by spacers 55 in the Y-direction. The fin structures 54 are elongated in the X-direction and may optionally include germanium (Ge). The fin structure 54 may be formed by using suitable processes such as photolithography and etching processes. In some embodiments, the fin structure 54 is etched from the substrate 52 using dry etch or plasma processes. In some other embodiments, the fin structure 54 can be formed by a double-patterning lithography (DPL) process. DPL is a method of constructing a pattern on a substrate by dividing the pattern into two interleaved patterns. DPL allows enhanced feature (e.g., fin) density. The fin structure 54 also includes an epi-grown material 12, which may (along with portions of the fin structure 54) serve as the source/drain of the FinFET device structure 10.

An isolation structure 58, such as a shallow trench isolation (STI) structure, is formed to surround the fin structure 54. In some embodiments, a lower portion of the fin structure 54 is surrounded by the isolation structure 58, and an upper portion of the fin structure 54 protrudes from the isolation structure 58, as shown in FIG. 1. In other words, a portion of the fin structure 54 is embedded in the isolation structure 58. The isolation structure 58 prevents electrical interference or crosstalk.

The FinFET device structure 10 further includes a gate stack structure including a gate electrode 60 and a gate dielectric layer (not shown) below the gate electrode 60. The gate electrode 60 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 60 may be formed in a gate last process (or gate replacement process). Hard mask layers 62 and 64 may be used to define the gate electrode 60. A dielectric layer 65 may also be formed on the sidewalls of the gate electrode 60 and over the hard mask layers 62 and 64.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 54. In some other embodiments, multiple gate stack structures are formed over the fin structure 54. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, FinFET fabrication may still have challenges. For example, loading may become an issue in processes such as etching, where devices having substantially different sizes may have different etching performances. In the formation of metal gate electrodes, conventional processes may form a bulk tungsten material with a wide lateral dimension (e.g., long channel devices) as a part of the metal gate electrode. This could cause loading issues and may lead to excessive loss of gate height, particularly if other smaller devices (e.g., short channel devices) are present. In addition, conventional processes had to etch a work function metal and the bulk tungsten separately, which adds to the fabrication process complexity and cost.

To reduce the excessive loss of the gate height and to improve loading, the present disclosure utilizes unique fabrication process flows, which allows the metal gate electrode materials to be etched to not have substantially different dimensions from one another. Furthermore, the present disclosure allows the work function metal and the metal material (e.g., tungsten) formed above the work function metal to be etched together, which reduces process complexity and cost. The present disclosure also forms T-shape helmets having a high-k dielectric material above gate spacers. During the formation of source/drain contacts, a contact hole etching process is supposed to etch an interlayer dielectric (ILD) material adjacent to the gate spacers to form the contact holes. However, due to the similarity in material compositions between the ILD and the gate spacers, the gate spacers could be inadvertently etched, particularly for short channel devices where an overlay shift may exacerbate this problem. Here, the high-k dielectric material composition of the T-shaped helmet is more resistant to etching and therefore protects the gate spacers underneath from being inadvertently etched during the contact hole formation.

The various aspects of the present disclosure will now be discussed below in more detail with reference to FIGS. 2A-33A, 2B-33B, 2C-33C, 2D-33D and 34 below. In that regard, FIGS. 2A-33A illustrate fragmentary cross-sectional side views of a portion of a FinFET device 100A at various stages of fabrication, FIGS. 2B-33B illustrate fragmentary cross-sectional side views of a portion of a FinFET device 100B at various stages of fabrication, FIGS. 2C-33C illustrate fragmentary cross-sectional side views of a portion of a FinFET device 100C at various stages of fabrication, and FIGS. 2D-33D illustrate fragmentary cross-sectional side views of a portion of a FinFET device 100D at various stages of fabrication. It is understood that the cross-sectional views of FIGS. 2A-33A, 2B-33B, 2C-33C, and 2D-33D correspond to the cross-sectional views taken in the X-direction shown in FIG. 1, and as such they may be referred to as X-cuts.

The FinFET devices 100A, 100B, 100C, and 100D may be devices on the same wafer but may have different sizes, for example different gate lengths (Lg). In the illustrated embodiment, the FinFET device 100A has the smallest gate length (e.g., Lg in a range between about 3 nm and about 5 nm), the FinFET device 100B has a gate length (e.g., Lg in a range between about 15 nm and about 25 nm) larger than the gate length of the FinFET device 100A, the FinFET device 100C has a gate length (e.g., Lg in a range between about 31 nm and about 41 nm) larger than the gate length of the FinFET device 100B, and the FinFET device 100D has the largest gate length (e.g., Lg in a range between about 72 nm and about 240 nm). The FinFET device 100A may be referred to as a short channel (SC) device. The FinFET devices 100B and 100C may each be referred to as middle channel (SC) device. The FinFET device 100D may be referred to as a long channel (LC) device.

Due to their differences in size, the FinFET device 100A, 100B, 100C, and 100D may have different applications or may be used differently on an IC. As a non-limiting example, the short channel FinFET device 100A may be suitable for "core" devices, which may include logic devices (that do not need to handle the input/output voltages/currents directly), such as the various logic gates such as NAND, NOR, INVERTER, etc. In some embodiments, the core devices may include transistors of a static random-access memory (SRAM) device. In comparison, the long channel FinFET device 100D may include, as non-limiting examples, input/output (I/O) devices that are configured to handle the input and/or output voltages/currents, and as such they need to be able to tolerate a greater amount of voltage or current swing than non-I/O devices. The middle channel FinFET devices 100B and 100C may be used for other suitable IC applications.

Referring now to FIGS. 2A, 2B, 2C, and 2D, the FinFET devices 100A, 100B, 100C, and 100D include fin structures 110A, 110B, 110C, and 110D, respectively. The fin structures 110A, 110B, 110C, and 110D may each be similar to the fin structure 54 discussed above with reference to FIG. 1. The fin structures 110A, 110B, 110C, and 110D may include a semiconductor material such as silicon or silicon germanium. In some embodiments, the fin structures 110A-110D may serve as channel regions of transistors.

The FinFET devices 100A, 100B, 100C, and 100D also include source/drain regions 120A, 120B, 120C, and 120D, respectively. The source/drain regions 120A, 120B, 120C, and 120D may each include a dopant, for example boron, arsenic, phosphorous, etc., depending on whether the respective FinFET device is a P-type transistor or an N-type transistor. In some embodiments, the gate length Lg of the respective FinFET device 100A, 100B, 100C, and 100D roughly correspond to distances 125A, 125B, 125C, and 125D between the two adjacent source/drain regions for the FinFET devices 100A, 100B, 100C, and 100D, respectively. As such, the FinFET device 100A has the most closely located source/drain regions 120A (e.g., 125A being the smallest), the FinFET device 100B has source/drain regions 120B that are farther apart (e.g., 125B>125A), the FinFET device 100C has source/drain regions 120C that are even farther apart (e.g., 125C>125B>125A), and the FinFET device 100D has the most spaced-apart source/drain regions 120D (e.g., 125D>125C>125B>125A).

The FinFET devices 100A, 100B, 100C, and 100D include interlayer dielectric (ILD) layers 130A, 130B, 130C, and 130D, respectively. The ILD layers 130A, 130B, 130C, and 130D may each be a bottommost ILD layer and may be referred to as ILD0 layers. The ILD layers 130A, 130B, 130C, and 130D each include a dielectric material, for example a low-k dielectric material (e.g., a dielectric material having a smaller dielectric constant than silicon oxide) in some embodiments, or silicon oxide in some other embodiments. In some embodiments, the low-k dielectric material may include fluorine-doped silicon dioxide, carbon-doped silicon dioxide, porous silicon dioxide, porous carbon-doped silicon dioxide, spin-on organic polymeric dielectrics, or spin-on silicon based polymeric dielectric, or combinations thereof.

The ILD layers 130A, 130B, 130C, and 130D are disposed over, and vertically aligned with, the source/drain regions 120A, 120B, 120C, and 120D, respectively.

The FinFET devices 100A, 100B, 100C, and 100D include work function metal layers 140A, 140B, 140C, and 140D, respectively. The work functional metal layers 140A, 140B, 140C, and 140D are configured to tune a work function of their corresponding FinFET device to achieve a desired threshold voltage Vt. In various embodiments, the work function metal layers 140A, 140B, 140C, and 140D may contain: TiN, TaN, TiAl, TiAlN, or TaCN, or combinations thereof. The work function metal layers 140A, 140B, 140C, and 140D are disposed over, and vertically aligned with, the fin structures 110A, 110B, 110C, and 110D, respectively.

The FinFET devices 100A, 100B, 100C, and 100D include spacers 150A, 150B, 150C, and 150D, respectively. The spacers 150A are disposed between the ILD layer 130A and the work function metal layers 140A. The spacers 150B are disposed between the ILD layer 130B and the work function metal layer 140B. The spacers 150C are disposed between the ILD layer 130C and the work function metal layers 140C. The spacers 150D are disposed between the ILD layer 130D and the work function metal layers 140D. The spacers 150A, 150B, 150C, and 150D include a dielectric material, for example, a low-k dielectric material in some embodiments, or silicon nitride ($SiN_x$), silicon carbon nitride (SiCN), silicon oxynitride (SiON), silicon oxycarbide nitride (SIOCN), or combinations thereof in other embodiments. The spacers 150A, 150B, 150C, and 150C may each be formed by a deposition process followed by one or more etching and polishing processes. If not sufficiently protected, the spacer 150A may become inadvertently damaged during source/drain contact hole etching processes performed later. According to the various aspects of the present disclosure, a T-shaped helmet may be formed to protect the spacers 150A from etching damages, as discussed below in more detail.

The FinFET devices 100A, 100B, 100C, and 100D include metal layers 160A, 160B, 160C, and 160D, respectively. The metal layers 160A, 160B, 160C, and 160D are formed over the work function metal layers 140A, 140B, 140C, and 140D, respectively. The work function metal layers 140A, 140B, 140C, 140D and the metal layers 160A, 160B, 160C, and 160D collectively form the gate electrodes of the FinFET devices 100A, 100B, 100C, and 100D, respectively. In some embodiments, the metal layers 160A, 160B, 160C, and 160D include tungsten (W). In some embodiments, the metal layers 160A, 160B, 160C, and 160D are formed by atomic layer deposition (ALD). In some embodiments, the metal layers 160A, 160B, 160C, and 160D may have a thickness that is in a range between about 60 angstroms and about 100 angstroms. Compared to conventional processes where a bulk tungsten is formed (with a much greater thickness), the thickness of the metal layers 160A-160D is substantially smaller, which makes it easier to etch in later processes, as well as reducing etching loading concerns.

The FinFET devices 100A, 100B, 100C, and 100D have gate heights 170A, 170B, 170C, and 170D, respectively. The gate heights 170A, 170B, 170C, and 170D may approximately correspond to the vertical dimensions of the spacers 150A, 150B, 150C, and 150D, respectively. In some embodiments, the gate heights 170A, 170B, 170C, and 170D may be in a range between about 90 nm and about 120 nm.

As shown in FIGS. 2A-2D, the size differences (e.g., different gate lengths Lg) between the FinFET devices 100A, 100B, 100C, and 100D lead to the different shapes or cross-sectional profiles between the work function metal layers 140A, 140B, 140C, 140D, as well as different shapes or cross-sectional profiles between the metal layers 160A, 160B, 160C, 160D. For example, since the FinFET device 100A has the shortest gate length, the portions of the work function metal layer 140A disposed on sidewalls of the spacers 150A merge together, while an upper portion of the work function metal layer 140A is disposed above the ILD layer 130A and the spacers 150A.

In comparison, the FinFET device 100B has a longer gate length than the FinFET device 100A, and thus the portions of the work function metal layer 140B disposed on sidewalls of the spacers 150B do not merge together, but rather define an opening. This opening is then filled by a portion of the metal layer 160B.

For the FinFET device 100C, it has an even longer gate length than the FinFET device 100B. Similar to the FinFET device 100B, the portions of the work function metal layer 140C disposed on sidewalls of the spacers 150C do not merge together but define an opening, which is partially filled by the metal layer 160C. However, due to the longer gate length of the FinFET device 100C, the opening defined by the work function metal layer 140C is sufficiently wide, such that the metal layer 160C does not completely fill it. Instead, the portions of the metal layer 160C disposed on the sidewalls of the work function metal layer 140C define an opening 180C.

Meanwhile, the FinFET device 100D has the longest gate length, and similar to the FinFET device 100C, the FinFET device 100D also has an opening 180D defined by the portions of the metal layer 160D that are disposed on the sidewalls of the work function metal layer 140D. Alternatively stated, the metal layers 140D and 160D partially, but do not completely, fill the opening defined by the sidewalls of the spacers 150D and the upper surface of the fin structure 110D, and by doing so, the metal layer 160D defines the opening 180D.

Referring now to FIGS. 3A-3D, dielectric layers 210A, 210B, 210C, and 210D are formed over the metal layers 160A, 160B, 160C, and 160D, respectively. The dielectric layers 210A-210D may be formed by a suitable deposition process, for example by ALD. In some embodiments, the dielectric layers 210A-210D include silicon nitride. In other embodiments, the dielectric layers 210A-210D may include silicon oxide. Note that for FinFET devices 100C and 100D, the dielectric layer 210C and 210D fill the openings 180C and 180D, respectively. Thereafter, dielectric layers dielectric layers 220A, 220B, 220C, and 220D are formed over the dielectric layers 210A, 210B, 210C, and 210D, respectively. The dielectric layers 220A-220D may also be formed by one or more suitable deposition processes. For example, the dielectric layers 220A-220D may be formed by ALD, or plasma enhanced chemical vapor deposition (PECVD), or a combination of ALD and PECVD (e.g., a lower portion being formed by ALD, and an upper portion being formed by PECVD).

The dielectric layers 220A-220D may contain different materials than the dielectric layers 210A-210D. For example, in embodiments where the dielectric layers 210A-210D contain silicon nitride, the dielectric layers 220A-220D may contain silicon oxide, or vice versa. In other alternative embodiments, the dielectric layers 210A-210D and the dielectric layers 220A-220D may include the same type of materials. Note that in the case of FinFET device 100D, the dielectric layer 210D and the dielectric layer 220D collectively fill the opening 180D.

Referring now to FIGS. 4A-4D, a planarization process such as a chemical mechanical polishing (CMP) process is performed to the FinFET devices 100A-100D. The planarization process removes portions of the dielectric layers 210A-210D and 220A-220D, as well as portions of the metal layers 160A-160D, until the work function metal layers 140A-140D are reached. In other words, the work function metal layers 140A-140D serve as polishing-stop layers for the planarization process.

Referring now to FIGS. 5A-5D, a dielectric layer 230A is formed over the work function metal layer 140A for the FinFET device 100A. Thereafter, one or more etching processes 235 may be performed to the FinFET devices 100B-100D. The dielectric layer 230A serves as an etching mask during the one or more etching processes 235 and protects the FinFET device 100A from being etched. Meanwhile, the one or more etching processes 235 etch away portions of the metal layers 160B-160D and portions of the work function metal layers 140B-140D. In some embodiments, the one or more etching processes 235 may use one or more of the following materials as etchants: $BCl_3$, $Cl_2$, $CF_4$, $NF_3$, $HBr/NF_3$, $Cl_2/O_2/N_2/NF_3$, $CHF_3/H_2/Ar$, or combinations thereof.

As a result of the one or more etching processes 235, openings 240B, 240C, and 240D are formed in the FinFET devices 100B, 100C, and 100D, respectively. For the FinFET device 100B, the opening 240B exposes a remaining portion of the work function metal layer 140B and a remaining portion of the metal layer 160B. For the FinFET device 100C, the opening 240C exposes a remaining portion of the work function metal layer 140C and a remaining portion of the metal layer 160C. For the FinFET device 100D, the opening 240D exposes a remaining portion of the work function metal layer 140D and a remaining portion of the metal layer 160D. The dielectric layer 210C remains in the FinFET device 100C, and the dielectric layers 210D and 220D remain in the FinFET device 100D. It may be said that the openings 240C and 240D each have a U-shaped cross-sectional profile, as defined by the upper surfaces of the work function metal layers 140C/140D and the side surfaces of the dielectric layers 210C/210D and the spacers 150C/150D, respectively. The U-shaped cross-sectional profile is another unique characteristic of the present disclosure.

The openings 240B, 240C, and 240D have lateral dimensions 245B, 245C, and 245D, respectively, which are not too different from one another. For example, the lateral dimension 245B is in a range between about 30 nm and about 40 nm, the lateral dimension 245C is in a range between about 15 nm and about 25 nm, and the lateral dimension 245D is in a range between about 15 nm and about 25 nm. In some embodiments, a ratio between the largest one of the lateral dimensions 245B/245C/245D and the smallest one of the lateral dimensions 245B/245C/245D is in a range from about 2:1 and about 1:1.

Due to the similarity between the lateral dimensions 245B-245D, the lateral dimensions for the metal layers 160B-160D and 140B-140D that are etched by the etching processes 235 are not too different from one another either. This reduces etching loading problems. For example, if bulk metal layers had been formed for the FinFET devices 100B, 100C and 100D, then the bulk metal layers would have substantially different lateral dimensions (e.g., FinFET device 100D having the largest bulk metal layer, and the FinFET device 100B having the smallest metal layer). As a result, the etching of the differently-sized metal layers would have had substantially different loading, which could lead to lack of uniformity.

Here, the formation of the thin metal layers 160B-160D allows dielectric layers 210C-210D and 220D to be formed, and the lateral dimensions of the metal layers 160B-160D that need to be etched are defined by the sizes 245B-245D of the openings 240B-240D, respectively. Since there is not a big difference between the lateral dimensions 245B-245D, the etching loading concerns are greatly reduced when the metal layers 160B-160D are etched. In addition, the present disclosure allows the work function metal layers 140B-140D and the metal layers 160B-160D to be etched simultaneously during the etching processes 235, rather than separately. This reduces fabrication process complexity and cost.

Referring now to FIGS. 6A-6D, dielectric layers 250A, 250B, 250C, and 250D are formed for the FinFET devices 100A, 100B, 100C, and 100D, respectively. The dielectric layer 250A is formed over the dielectric layer 230A. The dielectric layer 250B is formed over the ILD 130B, the spacers 150B, the work function metal layer 140B, and the metal layer 160B, and fills the opening 240B. The dielectric layer 250C is formed over the ILD 130C, the spacers 150C, the work function metal layer 140C, the metal layer 160C, and the dielectric layer 210C, and fills the opening 240C. The dielectric layer 250D is formed over the ILD 130D, the spacers 150D, the work function metal layer 140D, the metal layer 160D, and the dielectric layers 210D-220D, and fills the opening 240D. The dielectric layers 250A-250D are formed by a suitable deposition process such as an ALD process. In some embodiments, the dielectric layers 250A-250D include silicon nitride.

Referring now to FIGS. 7A-7D, a planarization process such as a chemical mechanical polishing (CMP) process is performed to the FinFET devices 100A-100D. The planarization process removes portions of the dielectric layers 250A-250D and the upper portions of the spacers 150A-150D, as well as the dielectric layer 230A and portions of the work function metal layer 140A of FinFET device 100A, until the ILD layers 130A-130D are reached. In other words, the ILD layers 130A-130D serve as polishing-stop layers for the planarization process. As a result of the planarization process, the FinFET devices 100A, 100B, 100C, and 100D now have reduced gate heights 270A, 270B, 270C, and 270D, respectively. The gate heights 270A, 270B, 270C, and 270D may approximately correspond to the vertical dimensions of the ILD layers 130A, 130B, 130C, and 130D, respectively. In some embodiments, the gate heights 270A, 270B, 270C, and 270D may be in a range between about 75 nm and about 105 nm.

Referring now to FIGS. 8A-8D, one or more etching processes 300 may be performed to the FinFET devices 100A-100D. The one or more etching processes 300 remove portions of the ILD 130A, 130B, 130C, and 130D to form recesses 310A, 310B, 310C, and 310D in the FinFET devices 100A, 100B, 100C, and 100D. The recesses 310A, 310B, 310C, and 310D are etched to have vertical dimensions 320A, 320B, 320C, and 320D, respectively, which each correspond to a distance from the top surface of the respective ILD layer 130A/B/C/D to a top surface of the respective work function metal layer 140A/B/C/D. In some embodiments, the vertical dimensions 320A, 320B, 320C, and 320D are in a range between about 20 nm and about 30 nm.

Referring now to FIGS. 9A-9D, dielectric layers 330A, 330B, 330C, and 330D are formed to fill the recesses 310A, 3101B, 310C, and 310D, respectively. The dielectric layers 330A, 330B, 330C, and 330D are formed over the ILD layers 130A, 130B, 130C, and 130D, respectively. The dielectric layers 330A-330D may be formed using a suitable deposition process, such as ALD, CVD, etc. In some embodiments, the dielectric layers 330A-330D may include yttrium silicon oxide ($YSiO_x$). In other embodiments, the dielectric layers 330A-330D may include silicon nitride (SiN), silicon oxy-carbide (SiOC), silicon carbon nitride (SiCN), or silicon oxy-carbon nitride (SiOCN). Following the deposition of the dielectric layers 330A-330D, a planarization process such as a CMP process may be performed to polish the surface of the dielectric layers 330A-330D, until the upper surface of the dielectric layer 330A is coplanar with the upper surface of the work function metal layers 140A, and the upper surfaces of the dielectric layers 330B-330D are coplanar with the upper surfaces of the dielectric layers 250B-250D, respectively. The dielectric layers 330A-330D have vertical dimensions 340A-340D, respectively. Due to the planarization process removing some portions of the work function metal layer 140A and the dielectric layers 250B-250D, the vertical dimensions 340A-340D are smaller than the vertical dimensions 320A-320D. In some embodiments, the vertical dimensions 340A-340D are in a range between about 15 nm and about 21 nm.

Referring now to FIGS. 10A-10D, one or more etching processes 350 are performed to the FinFET devices 100A-100D. The one or more etching processes 350 form T-shaped recesses 360A in the FinFET device 100A by removing portions of the work function metal layer 140A and the spacers 150A. For example, in some embodiments, the one or more etching processes 350 may first perform an etch-back process in which the work function metal layer 140A and the spacers 150A are etched away at a substantially even rate. Thereafter, an etching process is performed to selectively remove the work functional metal layer 140A without substantially etching the spacers 150A. In other embodiments, the one or more etching processes 350 may include an etching process in which an etching selectivity exists between the spacers 150A and the work function metal layer 140A, such that the work function metal layer 140A is etched away at a faster rate while the spacers 150A are etched away at a slower rate. Regardless, the end result is that, after the one or more etching process 350 are performed, the spacers 150A are taller than the work function metal layers 140A. As a result, the recesses 360A now have a T-shaped profile in the cross-sectional view of FIG. 10A. The one or more etching processes also etch away portions of the dielectric layers 330A-330D. As a result, the FinFET devices 100A-100D now have reduced heights 370A-370D, respectively. In some embodiments, the heights 370A-370D are in a range between about 69 nm to about 79 nm.

Referring now to FIGS. 11A-11D, metal layers 380A are formed over the work function metal layers 140A for the FinFET device 100A. In some embodiments, the metal layers 380A may include the same material as the metal layers 160B-160D, for example they may all include tungsten. The metal layers 380A and the work function metal layers 140A collectively form the gate electrodes of the FinFET device 100A. The metal layers 160B-160D and the work function metal layers 140B-140D collectively form the gate electrodes of the FinFET devices 100B, 100C, and 100D, respectively.

Referring now to FIGS. 12A-12D, dielectric layers 400A, 400B, 400C, and 400D are formed for the FinFET devices 100A, 100B, 100C, and 100D, respectively. The dielectric layers 400A are formed over the dielectric layers 330A, the spacers 150A, and the metal layers 380A and fill the T-shaped recesses 360A. The dielectric layers 400B-400D are formed over the dielectric layers 330B-330D, the spacers 150B-150D, and the dielectric layers 250B-250D. The dielectric layers 400A-400D may include a high-k dielectric material (e.g., a dielectric material having a dielectric constant greater than the dielectric constant of silicon dioxide). In some embodiments, the dielectric layers 400A-400D may include zirconium oxide ($ZrO_x$). In other embodiments, the dielectric layers 400A-400D may include yttrium silicon oxide ($YSiO_x$), silicon oxy-carbide (SiOC), or another suitable high-k dielectric material.

It is understood that other processes may be performed after the stage of fabrication shown in FIGS. 12A-12D. For example, a cut-metal-gate (CMG) may be formed, the details of which are discussed in U.S. patent application Ser. No. 16/021,344, filed on Jun. 28, 2018, and entitled "Method And Device For Forming Cut-Metal-Gate Feature", the content of which is incorporated herein for its entirety. For reasons of simplicity, these other processes are not discussed in detail herein.

Referring now to FIGS. 13A-13D, a planarization process such as a chemical mechanical polishing (CMP) process is performed to the FinFET devices 100A-100D. The planarization process removes portions of the dielectric layers 400A-400D and portions of the dielectric layers 330B-330D. The planarization process is performed until the ILD layers 130A-130D are reached. In other words, the ILD layers 130A-130D serve as polishing-stop layers for the planarization process. At the end of the planarization process, the upper surfaces of the dielectric layers 400A are substantially co-planar with the upper surfaces of the ILD layers 130A. The FinFET devices 100A-100D also have reduced heights 410A-410D, respectively. In some embodiments, the reduced heights 410A-410D are in a range between about 54 nm and about 64 nm.

As shown in FIG. 13A, the dielectric layers 400A each have a T-shaped cross-sectional profile, since they inherit the cross-sectional profiles of the T-shaped recesses 360A. The dielectric layers 400A also serve as "helmets" for the spacers 150A and the gate electrode (e.g., the metal layers 380A and 140A) below during later etching processes. As such, the dielectric layers 400A may also be referred to as T-shaped helmets 400A. Each T-shaped helmet 400A has an upper portion 400A-U and a lower portion 400A-L that is disposed below and narrower than the upper portion. The upper surface of the upper portion 400A-U is coplanar with the upper surfaces of the ILD layers 130A. The side surfaces of the upper portion are in contact with the side surfaces of the ILD layers 130A. The bottom surfaces of the upper portion 400A-U are in contact with the upper surfaces of the spacers 150A. The side surfaces of the lower portion 400A-L are in contact with the side surfaces of the spacers 150A. The bottom surfaces of the lower portion 400A-L are in contact with the metal layers 380A. The T-shaped helmets 400A are one of the unique physical characteristics of the present application.

One of the advantages of the process flow discussed above is that it reduces loss of gate height. Starting with a gate height of 170A-170D shown in FIGS. 2A-2D (e.g., in a range between about 90 nm and about 120 nm), the FinFET devices 100A-100D end up with a gate height of 410A-410D shown in FIGS. 13A-13D (e.g., in a range between about 54 nm and about 64 nm). The loss of gate height is small compared to conventional processes. Another advantage is that the present disclosure reduces loading, for example loading in etching processes. For example, conventional processes may require a bulk tungsten to be formed and then etched as a part of the gate electrode formation, which leads to loading problems, particularly for devices having a big difference in sizes such as the short channel, middle channel, and long channel devices discussed above. In comparison, the present disclosure does not form a bulk tungsten but rather a thin layer of metal such as the metal layer 160D (e.g., tungsten), as discussed above with reference to FIGS. 2A-2D. Furthermore, the flow of the present disclosure results in similar lateral dimensions of the metal layer 160B-160D, which allows the metal layers 160B-160D to be easily etched without causing loading, as discussed above with reference to FIGS. 5A-5D. The resulting U-shape cross-sectional profile of the openings 240C and 240D is another unique characteristic of the present disclosure.

Additional fabrication processes may be performed to finish the fabrication of FinFET devices 100A-100D. For example, referring now to FIGS. 14A-14D, source/drain contacts 440A, 440B, 440C, and 440D may be formed for the FinFET devices 100A, 100B, 100C, and 100D, respectively. The source/drain contacts 440A-440D are formed over, and provide electrical connectivity to, the source/drain regions 120A-120D. The source/drain contacts 440A-440D may include an electrically conductive material such as metal or metal compound. The T-shaped helmets 400A serve as hard masks—to protect the spacers 150A and/or the gate electrode therebelow-when contact holes are etched in the formation of the source/drain contacts 440A-440D. Due to the high-k material composition of the T-shaped helmets 400A, they may be more resistant to etching and therefore function well as etching hard masks. This is beneficial for the FinFET device 100A, since its small size means that it may be prone to overlay issues. When overlay shifts occur, the contact hole etching processes may expose the spacers 150A and possibly the gate electrode (e.g., metal layers 140A and 380A) to the etching, if the T-shaped helmet 400A had not been formed. Here, the T-shaped helmet 400A will protect the spacers 150A and the gate electrode from being etched, which is another advantage of the present disclosure.

Dielectric layers 450A, 450B, 450C, and 450D are disposed above the source/drain contacts 440A, 440B, 440C, 440D, respectively. The dielectric layers 450A-450D may have the same material composition as the dielectric layers 250B-250D, for example silicon nitride. ILD layers 460A, 460B, 460C, and 460D are formed over the dielectric layers 450A, 450B, 450C, and 450D, respectively.

FIGS. 2A-2D to 14A-14D pertain to a first embodiment of the present disclosure. A second embodiment of the present disclosure is discussed below with reference to FIGS. 15A-15D to 22A-22D. For reasons of simplicity and consistency, similar components in both the first and second embodiments are labeled the same.

Referring now to FIGS. 15A-15D, the FinFET devices 100A-100D are in a similar stage of fabrication as the stage shown in FIGS. 2A-2D. For example, work function metal layers 140A-140D are formed over the fin structures 110A-110D. Metal layers 160A-160D are formed over the work function metal layers 140A-140D. As discussed above, for the middle channel FinFET device 100C and the long channel FinFET device 100D, the work function metal layers 140C/140D and the metal layers 160C/160D do not completely fill the openings 180C and 180D. Unlike the first embodiment, however, the dielectric layers 330A-330D are formed over the ILD layers 130A-130D, respectively. As discussed above, the dielectric layers 330A-330D may have different material compositions from the ILD layers 130A-130D. In some embodiments, the dielectric layers 330A-330D may include $YSiO_x$, SiN, SiOC, SiCN, or SiOCN.

Referring now to FIGS. 16A-16D, the dielectric layer 210C is formed to fill the opening 180C for the FinFET device 100C, and the dielectric layers 210D and 220D are formed to fill the opening 180D for the FinFET device 100D. As discussed above with reference to FIGS. 3A-3D and 4A-4D, the dielectric layers 210C/210D and 220D are formed by deposition processes followed by a planarization process.

Referring now to FIGS. 17A-17D, the dielectric layer 230A is formed over the FinFET device 100A (as a mask layer). Etching processes 235 are then performed (while the dielectric layer 230A protects the FinFET device 100A underneath) to partially etch away the metal layers 160B-160D and the work function metal layers 140B-140D of the FinFET devices 100B/100C/100D. As a result of the etching processes 235, the openings 240B, 240C, and 240D are formed, which may be said to have "U-shaped" cross-sectional profiles. The lateral dimensions 245B, 245C, and 245D of the openings 240B, 240C, and 240D are not too substantially different from one another, and thus the etching load concerns are substantially reduced.

Referring now to FIGS. 18A-18D, the dielectric layers 250B-250D are formed to fill the openings 240B-240D, respectively. A planarization process is then performed to planarize the upper surfaces of the dielectric layers 250B-250D. The planarization process removes the dielectric layer 230A, as well as portions of the work function metal layer 140A disposed over the dielectric layers 330A. After the planarization process, the upper surfaces of the dielectric layers 250B-250D are substantially coplanar with the upper surfaces of the 330B-330D.

Referring now to FIGS. 19A-19D, the T-shaped recess 360A is etched in the FinFET device 100A. The sidewalls of the T-shaped recess 360A are collectively defined by the side surfaces of the ILD layers 130A and the side surfaces of the dielectric layers 330A. The metal layer 380A is then formed over the work function metal layer 140A in the T-shaped recess 360A.

Referring now to FIGS. 20A-20D, the dielectric layers 400A-400D are formed for the FinFET devices 100A-100D. The dielectric layers 400A-400D may include a high-k material such as zirconium oxide. The dielectric layer 400A fills the T-shaped recess 360A.

Referring now to FIGS. 21A-21D, dielectric layers 420A, 420B, 420C, and 420D are formed over the dielectric layers 400A, 400B, 400C, and 400D, respectively. In some embodiments, the dielectric layers 420A-420D and the dielectric layers 210C-210D and 250B-250D may have the same material compositions (e.g., silicon nitride). The dielectric layers 420A-420D may serve as a hard mask layer for subsequent etching processes such as the cut-metal-gate (CMG) process discussed in U.S. patent application Ser. No. 16/021,344, filed on Jun. 28, 2018, and entitled "Method And Device For Forming Cut-Metal-Gate Feature", the content of which is incorporated herein for its entirety. For reasons of simplicity, these other etching processes are not discussed in detail herein.

Referring now to FIGS. 22A-22D, a planarization process is performed to remove the dielectric layers 420A-420D and portions of the dielectric layers 400A-400D. The FinFET devices 100A-100D have flat upper surfaces after the planarization process is performed. The remaining portion of the dielectric layer 400A in the FinFET devices 100A forms the T-shaped helmet.

Similar to the first embodiment discussed above in association with FIGS. 2A-2D through 14A-14D, the second embodiment of FIGS. 15A-15D through 22A-22D have substantially similar device structures, though the fabrication processes performed to reach the end structures are slightly different. The second embodiment still offers the same advantages as the first embodiment discussed above.

A third embodiment of the present disclosure is discussed below with reference to FIGS. 23A-23D through FIGS. 28A-28D. Again, for reasons of simplicity and consistency, similar components in the first, second, and third embodiments are labeled the same.

Referring now to FIGS. 23A-23D, the FinFET devices 100A-100D are in a similar stage of fabrication as the stage shown in FIGS. 2A-2D or the stage shown in FIGS. 15A-15D. For example, work function metal layers 140A-140D are formed over the fin structures 110A-110D. The upper portions of the work function metal layers 140A-140D are disposed over the dielectric layers 330A-330D, respectively. Metal layers 160A-160D are formed over the work function metal layers 140A-140D. As discussed above, for the middle channel FinFET device 100C and the long channel FinFET device 100D, the work function metal layers 140C/140D and the metal layers 160C/160D do not completely fill the openings 180C and 180D.

Referring now to FIGS. 24A-24D, the dielectric layer 210C is formed to fill the opening 180C for the FinFET device 100C, and the dielectric layers 210D and 220D are formed to fill the opening 180D for the FinFET device 100D. As discussed above with reference to FIGS. 3A-3D and 4A-4D, the dielectric layers 210C/210D and 220D are formed by deposition processes followed by a planarization process, which is performed until the dielectric layers 330A-330D are exposed.

Referring now to FIGS. 25A-25D, etching processes 235 are performed to partially etch away the metal layers 160A-160D, the work function metal layers 140A-140D, as well as the spacers 150A-150D for all the FinFET devices 100A-100D. Unlike the first and second embodiments, no dielectric layer mask is formed over the FinFET device 100A to protect it from being etched during the etching processes 235. In other words, all FinFET devices 100A-100D are being etched in the third embodiment shown in FIGS. 24A-24D.

As a result of the etching processes 235, openings 240A-240D are formed in the FinFET devices 100A-100D, respectively. The lateral dimensions 245A-245D of their respective openings 240A-240D are not too substantially different from one another, and thus the etching load concerns are substantially reduced. Note that both the FinFET devices 100A-100B have openings 240A-240B that have T-shaped profiles at this point.

Referring now to FIGS. 26A-26D, the dielectric layers 400A-400D are formed for the FinFET devices 100A-100D. The dielectric layers 400A-400D may include a high-k material such as zirconium oxide. The dielectric layers 400A-400D fill the openings 240A-240D, respectively.

Referring now to FIGS. 27A-27D, an etching back process is performed to partially remove the dielectric layers 400A-400D. Thereafter, the dielectric layers 420A-420D are formed over the dielectric layers 400A-400D for the FinFET devices 100A-100D, respectively. In some embodiments, the dielectric layers 420A-420D include silicon nitride. The dielectric layers 420A-420D may serve as a hard mask layer for subsequent etching processes such as the cut-metal-gate (CMG) process discussed in U.S. patent application Ser. No. 16/021,344, filed on Jun. 28, 2018, and entitled "Method And Device For Forming Cut-Metal-Gate Feature", the content of which is incorporated herein for its entirety. For reasons of simplicity, these other etching processes are not discussed in detail herein.

Referring now to FIGS. 28A-28D, a planarization process is performed to remove the dielectric layers 400A-400D as well as the dielectric layers 330A-330D. After the performance of the planarization process, the upper surfaces of the ILD layers 130A-130D are substantially coplanar with the dielectric layers 400A-400D, respectively. At this stage of fabrication, the dielectric layers 400A and 400B each have a T-shaped cross-sectional profile. In Meanwhile, the dielectric layers 400C and 400D have cross-sectional profiles that resemble a rotated "L" or a flipped "L". For example, the dielectric layers 400C and 400D each have an upper portion that is wider than a lower portion. One sidewall surface of the upper portion is in contact with the ILD 130C/130D, while an opposite sidewall surface of the upper portion is in contact with the dielectric layer 210C/210D. One sidewall surface of the lower portion is in contact with the spacer 150C/150D, while an opposite sidewall surface of the lower portion is in contact with the dielectric layer 210C/210D. Again, the T-shaped profiles of the dielectric layers 400A/400B and the rotated/flipped L-shaped profiles of the dielectric layers 400C/400D are unique physical characteristics of the present disclosure, which may serve as evidence that the fabrication processes discussed above have been performed.

As discussed above with the first and second embodiments, additional fabrication processes may be performed to finish the fabrication of FinFET devices 100A-100D for the third embodiment. For example, referring now to FIGS. 29A-29D, source/drain contacts 440A-440D may be formed over, and provide electrical connectivity to, the source/drain regions 120A-120D of the FinFET devices 100A-100D, respectively. Due to their high-k material composition, the dielectric layers 400A-400D serve as hard masks to protect the spacers gate electrode therebelow when contact holes are etched in the formation of the source/drain contacts 440A-440D. Dielectric layers 450A-450D are disposed above the source/drain contacts 440A-440D, respectively. The dielectric layers 450A-450D may have the same material composition as the dielectric layers 250B-250D, for example silicon nitride. ILD layers 460A-460D are formed over the dielectric layers 450A-450D, respectively.

It can be seen that the fabrication processes performed according to the first, second, and third embodiments result in a device structure for FinFET device 100A that is substantially the same for all three embodiments—that is, the T-shaped helmet 400A is present for all three embodiments. In comparison, the FinFET devices 100B-100D for the third embodiment end up with high-k dielectric layers 400B-400D, which is not the case for the first and second embodiments. As can be seen from FIGS. 28B-29B, the high-k dielectric layer 400B for the third embodiment also has a T-shaped profile. Meanwhile, as can be seen from FIGS. 28C-28D and 29C-29D, the high-k dielectric layers 400C-400D have rotated or flipped L-shaped profiles.

FIGS. 30A, 30B, 30C, and 30D illustrate FinFET devices 100A, 100B, 100C, and 100D fabricated according to a fourth embodiment of the present disclosure. The fourth embodiment may follow a substantially similar fabrication flow of the third embodiment, with the exception that the dielectric layers 210C, 210D, and 220D are also formed using a high-k dielectric material, for example, the same material as the high-k dielectric layers 400A-400D, such as zirconium oxide. As a result, the resulting device structure for all four of FinFET devices 100A-100D will have a T-shaped helmet 400A-400D, respectively. However, for FinFET devices 100C-100D, the T-shaped helmets 400C-400D are shaped slightly differently. For example, the T-shaped helmet 400C is composed of the dielectric layers 400C and the dielectric layer 210C sandwiched therebetween. The dielectric layer 210C may have a lower bottom surface (e.g., located further below) than the dielectric layers 400C. In addition, though the dielectric layers 400C and 210C may have the same high-k material composition (e.g., zirconium oxide) in some embodiments, they may have different material compositions in alternative embodiments, where the dielectric layers 400C may contain a first type of high-k dielectric material, while the dielectric layer 210C may contain a second type of high-k dielectric material different from the first type. Likewise, the dielectric layer 210D may have a lower bottom surface than the dielectric layers 400D, and they may have the same or different material compositions in various embodiments.

FIGS. 31A, 31B, 31C, and 31D illustrate FinFET devices 100A, 100B, 100C, and 100D fabricated according to a fifth embodiment of the present disclosure. The fifth embodiment may follow a substantially similar fabrication flow of the first embodiment, with the exception that the FinFET device 100A is fabricated using the same processes as the rest of the FinFET devices 100B-100D. For example, in the etching processes 235 discussed above with reference to FIGS. 5A-5D, no dielectric layer 230A is formed as a mask for the FinFET device 100A. Thereafter, no T-shaped helmets are formed for the FinFET device 100A in this fifth embodiment. In other words, the resulting device structure for the FinFET devices 100B-100D are substantially the same for the first embodiment and the fifth embodiment, while the device structure for the FinFET device 100A is different between the first embodiment and the fifth embodiment, in that the FinFET device 100 in the fifth embodiment does not have the T-shaped helmet.

FIGS. 32A, 32B, 32C, and 32D illustrate FinFET devices 100A, 100B, 100C, and 100D fabricated according to a sixth embodiment of the present disclosure. According to the sixth embodiment, the FinFET device 100A still has the same structure (e.g., having a T-shaped helmet) as the FinFET device 100A fabricated according to the first embodiment. However, the FinFET devices 100B-100D have different structures in the sixth embodiment, as the thicknesses of the metal layers 160B-160D in the sixth embodiment are significantly greater than the metal layers 160B-160D in the first embodiment.

FIGS. 33A, 33B, 33C, and 33D illustrate FinFET devices 100A, 100B, 100C, and 100D fabricated according to a seventh embodiment of the present disclosure. According to the seventh embodiment, the FinFET device 100A still has the same structure (e.g., having a T-shaped helmet) as the FinFET device 100A fabricated according to the first embodiment. However, the FinFET devices 100B-100D have different structures in the seventh embodiment. For example, the thicknesses of the metal layers 160B-160D in the seventh embodiment are significantly greater than the metal layers 160B-160D in the first embodiment. In addition, the dielectric layers 400B-400D for the FinFET devices 100B-100D also have T-shaped profiles in the seventh embodiment. In other words, the seventh embodiment may be viewed as a combination of the first embodiment and the sixth embodiment.

It is understood that for the first through seventh embodiments, gate contacts may be formed for the FinFET devices 100A-100D when appropriate. For example, for circuit applications where a transistor's gate needs electrical connectivity, gate contacts may be formed by etching a gate contact hole through the dielectric materials (e.g., the T-shaped helmet 400A or the dielectric layers 210B-210D or 250B-250D) disposed over the work function metal layers 140A-140B and the metal layers 160A-160B, and then filling the gate contact hole with a metal material. For reasons of simplicity, these additional processes are not discussed in detail herein.

Figure 34:
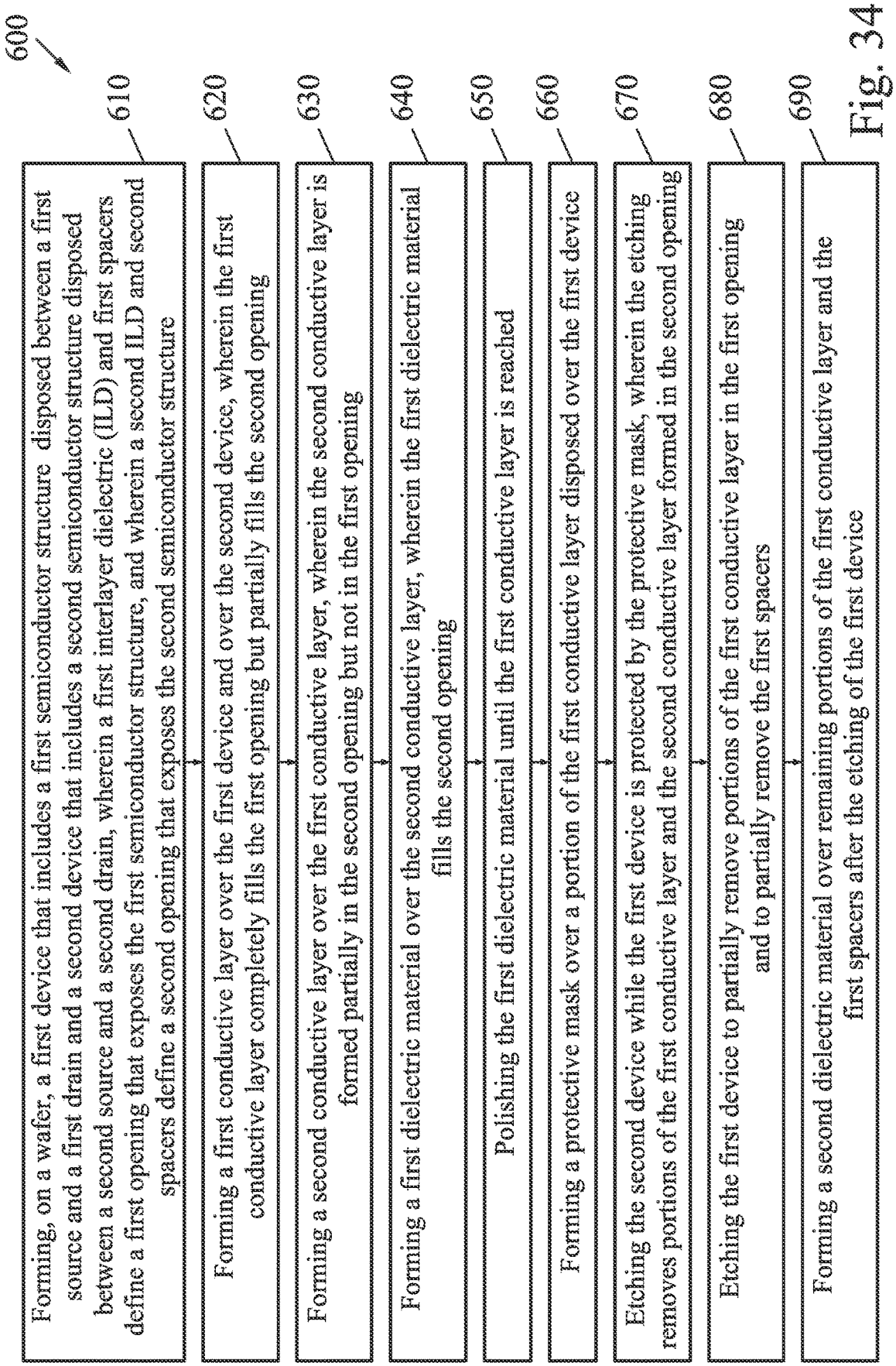
FIG. 34 is a flow chart of a method for fabricating a semiconductor device in accordance with embodiments of the present disclosure.
Figure 38A:
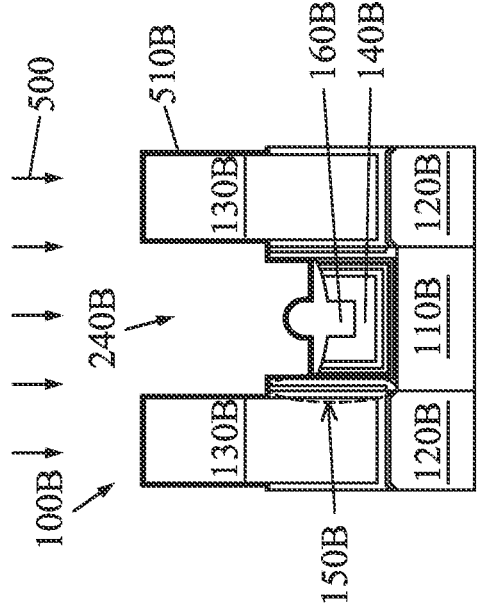
Figure 38B:
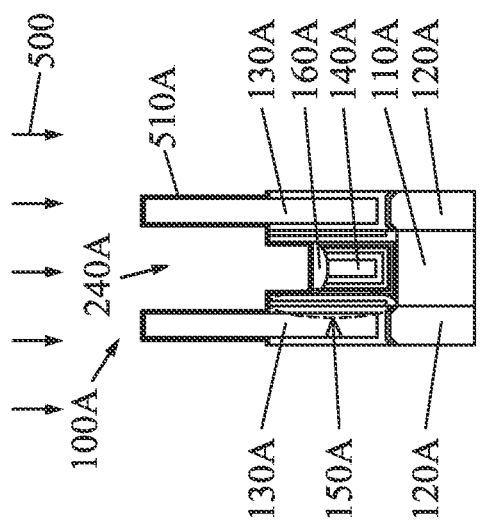
Figure 38C:
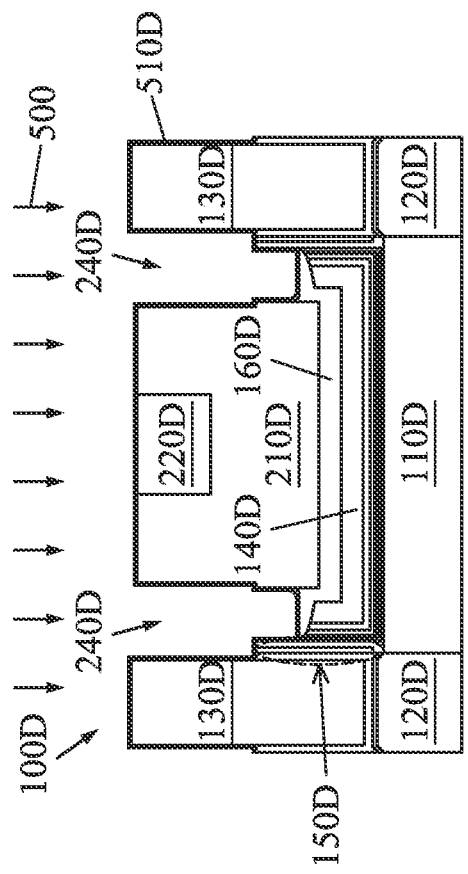
Figure 38D:
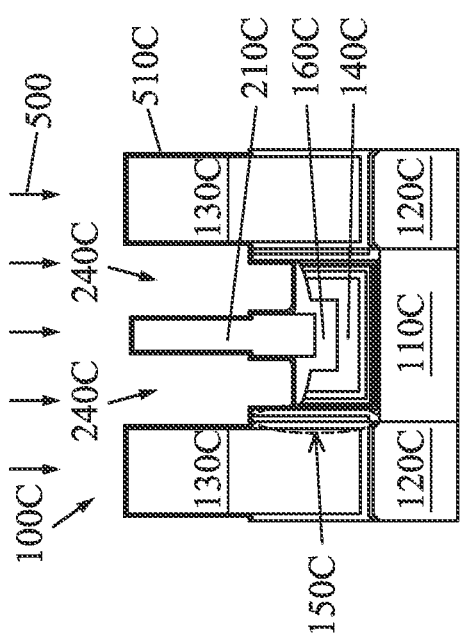
Figure 39A:
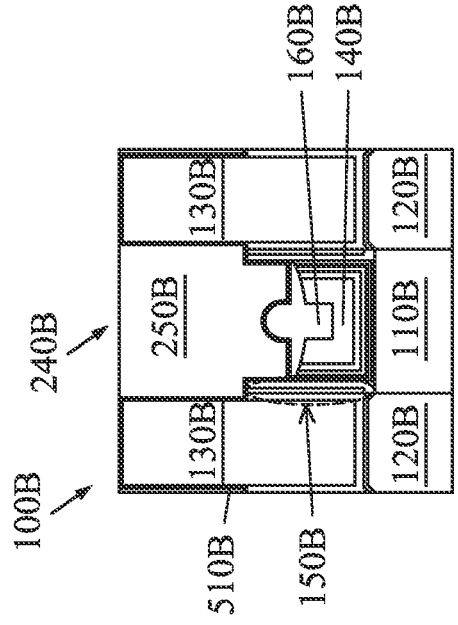
Figure 39B:
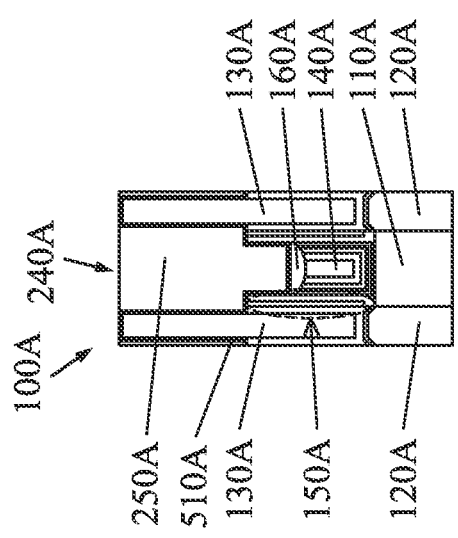
Figure 39C:
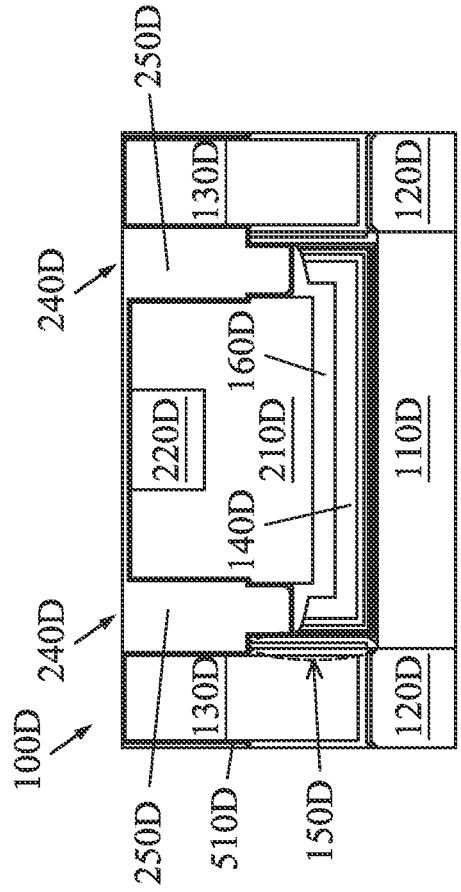
Figure 39D:
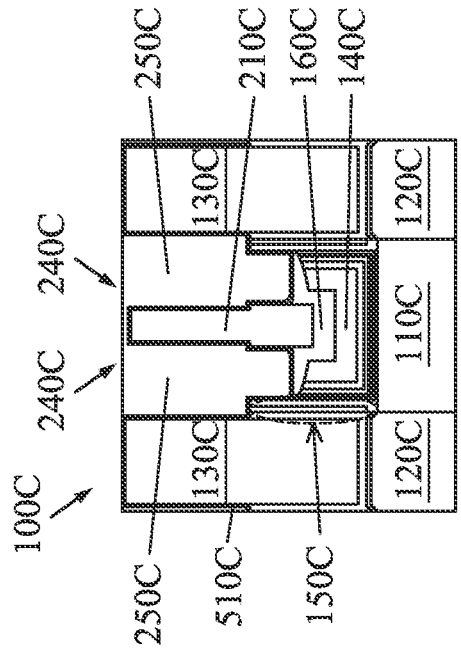

FIG. 34 is a flowchart of a method 600 for fabricating a semiconductor device in accordance with various aspects of the present disclosure. The method 600 includes a step 610 of forming, on a wafer, a first device that includes a first semiconductor structure disposed between a first source and a first drain and a second device that includes a second semiconductor structure disposed between a second source and a second drain. A first interlayer dielectric (ILD) and first spacers define a first opening that exposes the first semiconductor structure. A second ILD and second spacers define a second opening that exposes the second semiconductor structure. A first distance separating the first source and first drain is less than a second distance separating the second source and the second drain.

The method 600 includes a step 620 of forming a first conductive layer over the first device and over the second device. The first conductive layer completely fills the first opening but partially fills the second opening.

The method 600 includes a step 630 of forming a second conductive layer over the first conductive layer. The second conductive layer is formed partially in the second opening but not in the first opening. The first conductive layer and the second conductive layer have different material compositions.

The method 600 includes a step 640 of forming a first dielectric material over the second conductive layer. The first dielectric material fills the second opening.

The method 600 includes a step 650 of polishing the first dielectric material until the first conductive layer is reached.

The method 600 includes a step 660 of forming a protective mask over a portion of the first conductive layer disposed over the first device.

The method 600 includes a step 670 of etching the second device while the first device is protected by the protective mask. The etching removes portions of the first conductive layer and the second conductive layer formed in the second opening.

The method 600 includes a step 680 of etching the first device to partially remove portions of the first conductive layer in the first opening and to partially remove the first spacers. In some embodiments, the etching of the first device is performed such that an upper surface of the first conductive layer is disposed below upper surfaces of the first spacers after the first device is etched.

The method 600 includes a step 690 of forming a second dielectric material over remaining portions of the first conductive layer and the first spacers after the etching of the first device. In some embodiments, the second dielectric material has a greater dielectric constant than the first dielectric material.

It is understood that additional process steps may be performed before, during, or after the steps 610-690 discussed above to complete the fabrication of the semiconductor device. For example, before the step 610 is performed, the method 600 may include forming dummy gate structures (e.g., a polysilicon gate electrode) and removing the dummy gate structures to form the first opening and the second opening. After the step 690 is performed, the method 600 may include the formation of source/drain contacts of the semiconductor device and/or the formation of vias/metal lines. Other steps may be performed but are not discussed herein in detail for reasons of simplicity.

An eighth embodiment of the present disclosure is discussed below with reference to FIGS. 35A-35D through FIGS. 41A-41D. In the eighth embodiment, a high-k dielectric liner is implemented to preserve the T-shape profile of the helmets, as discussed in more detail below. Again, for reasons of simplicity and consistency, similar components in both the eighth embodiment and the previous embodiments discussed above are labeled the same.

Referring now to FIGS. 35A-35D, the FinFET devices 100A-100D are in a similar stage of fabrication as the stage shown in FIGS. 15A-15D for the second embodiment. For example, work function metal layers 140A-140D are formed over the fin structures 110A-110D, respectively. Metal layers 160A-160D are formed over the work function metal layers 140A-140D, respectively. As discussed above, for the middle channel FinFET device 100C and the long channel FinFET device 100D, the work function metal layers 140C/140D and the metal layers 160C/160D do not completely fill the openings 180C and 180D.

Referring now to FIGS. 36A-36D, the dielectric layer 210C is formed to fill the opening 180C for the FinFET device 100C, and the dielectric layers 210D and 220D are formed to fill the opening 180D for the FinFET device 100D. As discussed above with reference to FIGS. 3A-3D and 4A-4D, the dielectric layers 210C/210D and 220D are formed by deposition processes followed by a planarization process such as a CMP process.

Referring now to FIGS. 37A-37D, one or more etching processes 235 are performed to partially etch away the metal layers 160A-160D and the work function metal layers 140A-140D of the FinFET devices 100A-100D. Note that unlike some of the previous embodiments, no mask is formed over the short channel FinFET device 100A. Therefore, all FinFET devices 100A-100D are etched simultaneously by the etching processes 235. As a result of the etching processes 235, openings 240A-240D are formed in FinFET devices 100A-100D, respectively. The openings 240A-240B are each formed to have a T-shaped cross-sectional profile. For example, the work function metal layers 140A-140B and the metal layer 160B are etched more than the spacers 150A-150B, and thus the upper surfaces of the work function metal layers 140A-140B and the metal layer 160B are recessed more than (e.g., further below) the upper surfaces of the spacers 150A-150B. In addition, the spacers 150A-150B are etched more than the ILD layers 130A-130B, and thus the upper surfaces of the spacers 150A-150B are located below the upper surfaces of the ILD layers 130A-130B after the etching processes 235 are performed.

For FinFET devices 100C-100D, the openings 240C-240D are also etched such that the work function metal layers 140C-140D and the metal layers 160C-160D are etched more than the spacers 150C-150D. However, for each opening 240C or 240D, the spacers 150C/150D are located on one side (but not both sides) of the work function metal layers 140C/140D and the metal layers 160C/160D. The openings 240A-240D are also formed to have lateral dimensions 245A-245D that are not too substantially different from one another, and thus the etching load concerns are substantially reduced for reasons similar to those discussed above with reference to FIGS. 5C-5D.

Referring now to FIGS. 38A-38D, one or more metal growth or deposition processes are performed to reform the metal layer 160A over the work function metal layer 140A, and to enlarge the metal layers 160B-160D. Thereafter, a deposition process 500 is performed to the FinFET devices 100A-100D to form liners 510A, 5101B, 510C, and 510D, respectively. The liner 510A is formed over the ILD layers 130A, the spacers 150A, and the metal layer 160A. The liner 510B is formed over the ILD layers 130B, the spacers 150B, and the metal layer 160B. The liner 510C is formed over the ILD layers 130C, the spacers 150C, the metal layer 160C, and the dielectric layer 210C. The liner 510D is formed over the ILD layers 130D, the spacers 150D, the metal layer 160D, and the dielectric layers 210C-220D.

The liners 510A-510D may include a high-k dielectric material, for example a metal oxide with a dielectric constant greater than about 4. In various embodiments, the metal oxide may include, but is not limited to: $ZrO_x$, $YSiO_x$, SiOC, $Al_2O_3$, $HfO_2$, $TiO_2$, $ZrSiO_4$, $HfSiO_4$, $Ta_2O_5$, SrO, $Y_2O_3$, $La_2O_3$, $LaLuO_2$, CaO, MgO, $Gd_2O_3$, $PrO_2$, $CeO_2$, $ZrHfO_2$, or combinations thereof.

In some embodiments, the liners 510A-510D are formed to each have a thickness in a range between about 0.5 nanometers (nm) and about 5 nm. This thickness range is configured such that the liners 510A-510D are thick enough to protect the layers below in a later etching process discussed below, and yet not too thick to interfere with the intended functionalities of the FinFET devices 100A-100D. For example, if the liners 510A-510D are too thin, they may be "etched through" in the later etching process and thus cannot adequately protect the layers below. On the other hand, if the liners 510A-510D are too thick, they may unnecessarily raise a parasitic capacitance (since they contain high-k dielectric materials), which could degrade device performance.

Referring now to FIGS. 39A-39D, dielectric layers 250A-250D are formed to fill in the openings 240A-240D, respectively. Since the liners 510A-510D have already been formed, the dielectric layers 250A-250D are formed on the liners 510A-510D, respectively. As discussed above, the dielectric layers 250A-250D include a non-high-k material, for example silicon nitride. In other words, the dielectric layers 250A-250D and the liners 510A-510D have different material compositions. Other low-k dielectric materials may also be used to implement the dielectric layers 250A-250D.

Referring now to FIGS. 40A-40D, dielectric layers 520B, 520C, and 520D are formed over the FinFET devices 100B, 100C, and 100D, respectively, but not over the FinFET device 100A. The dielectric layers 520B-520D has a different material composition than the dielectric layers 250A-250D. In some embodiments, the dielectric layers 520B-520D includes silicon oxide. The dielectric layers 520B-520D serve as mask layers to protect the FinFET devices 100B-100D therebelow, while leaving the FinFET device 100A unprotected, so that additional patterning may be performed to the FinFET device 100A.

After the formation of the dielectric layers 520B-520D, one or more etching processes 530 are performed to the FinFET devices 100A-100D. In some embodiments, the one or more etching processes may be performed as a part of the CMG formation process, the details of which are discussed in U.S. patent application Ser. No. 16/021,344, filed on Jun. 28, 2018, and entitled "Method And Device For Forming Cut-Metal-Gate Feature", the content of which is incorporated herein for its entirety.

The one or more etching processes 530 are configured to have an etching selectivity (e.g., substantially different etching rates) between the dielectric layers 520B-520D and the dielectric layer 250A, such that the dielectric layer 250A of the FinFET device 100A may be etched away (thereby restoring the T-shaped opening 240A) without substantially affecting the dielectric layers 520B-520D of the FinFET devices 100B-100D. In this manner, the dielectric layers 520B-520D serve as protective masks to protect the components below from being etched.

The one or more etching processes 530 are also configured to have an etching selectivity between the dielectric layer 250A and the liner 510A. As such, the one or more etching processes 530 can etch away the dielectric layer 250A without etching open the liner 510A. In this manner, the liner 510A serves as an etching-stop layer to protect the ILD layer 130A, the spacers 150A, and the metal layer 160A therebelow during the etching processes 530. Without the liner 510A, the etching processes 530 may etch away some portions of the ILD layer 130A, the spacers 150A, and/or the metal layer 160A. This would have been undesirable, because the intended T-shape profile of the opening 240A (and the subsequently formed T-shaped helmet) would have been disrupted, and/or the metal gate electrode would have been damaged. However, with the protection offered by the liner 510A herein, the T-shape profile of the opening 240A (and the helmet formed later) can be properly preserved. The use of the liner 510A as a protective layer to preserve the T-shape profile of the opening 240A is one of the novel aspects of the present disclosure.

Referring now to FIGS. 41A-41D, the dielectric layer 400A is formed in the opening 240A. The dielectric layer 400A may be formed by one or more deposition processes followed by one or more planarization processes such as CMP, which may remove the layers 520B-520D. The dielectric layer 400A is formed on the liner 510A and is located over the spacers 150A and the metal layer 160A. Similar to the previous embodiments discussed above, the dielectric layer 400A may include a high-k dielectric material, such as $ZrO_x$, $YSiO_x$, SiOC, $Al_2O_3$, $HfO_2$, $TiO_2$, $ZrSiO_4$, $HfSiO_4$, $Si_3N_4$, $Ta_2O_5$, SrO, $Y_2O_3$, $La_2O_3$, $LaLuO_2$, CaO, MgO, $Gd_2O_3$, $PrO_2$, $CeO_2$, $ZrHfO_2$, AlON, or combinations thereof. In some embodiments, the dielectric layer 400A and the liners 510A-510D have different types of high-k dielectric materials. In other embodiments, the dielectric layer 400A and the liners 510A-510D have the same type of high-k dielectric material.

The dielectric layer 400A inherits the T-shape profile of the opening 240A and may be referred to as the T-shaped helmet 400A. As discussed with reference to the previous embodiments, the T-shaped helmet 400A protects the layers below (e.g., the spacers and the metal layers) from being damaged in etching processes performed later, such as etching processes for etching source/drain contact openings into the ILD 130C.

It is understood that although the process flow of FIGS. 35A-35D through FIGS. 41A-41D form the T-shaped helmet 400A (containing a high-k dielectric material) just for the FinFET device 100A, similar T-shaped helmets may be formed for the other FinFET devices 100B-100D as well, for example similar to the embodiments shown in FIGS. 29A-29D, 30A-30D, or 33A-33D. In fact, the implementation of a high-k dielectric liner (similar to the liner 510A/510B/510C/510D) may apply to any of the embodiments discussed above, as such a liner will help preserve the T-shape profile for the one or more helmets formed for the respective FinFET device.

A ninth embodiment of the present disclosure is discussed below with reference to FIGS. 42A-45A. In the ninth embodiment, the T-shaped helmet will be implemented using at least two different materials in order to minimize parasitic capacitance, as discussed in more detail below. For reasons of simplicity, the ninth embodiment is discussed using FinFET device 100A as an illustrative example, though it is understood that the various aspects of the ninth embodiment may apply to the FinFET devices 100B-100D as well. Again, for reasons of simplicity and consistency, similar components in both the ninth embodiment and the previous embodiments discussed above are labeled the same.

Figure 40A:
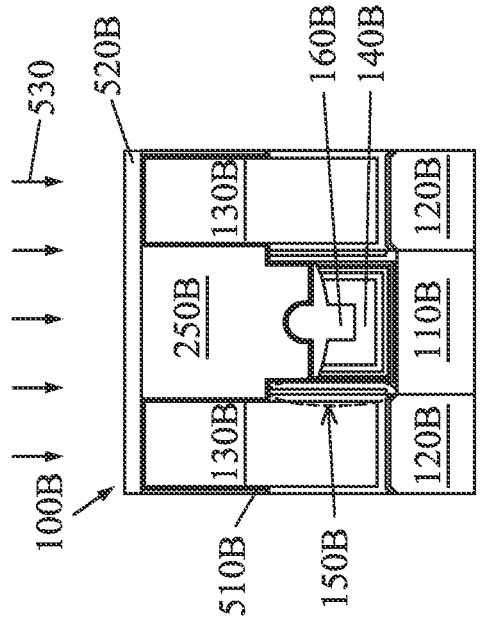
Figure 40B:
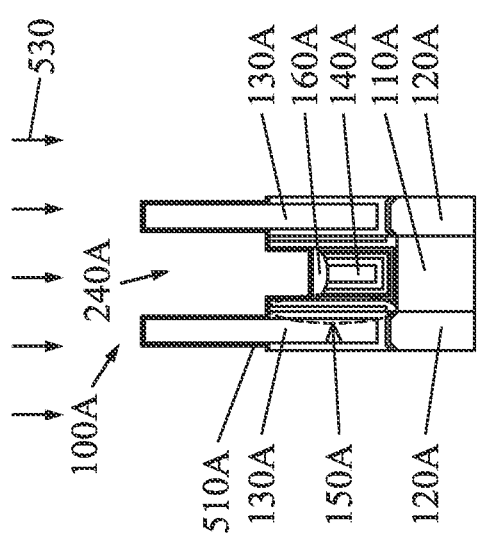
Figure 40C:
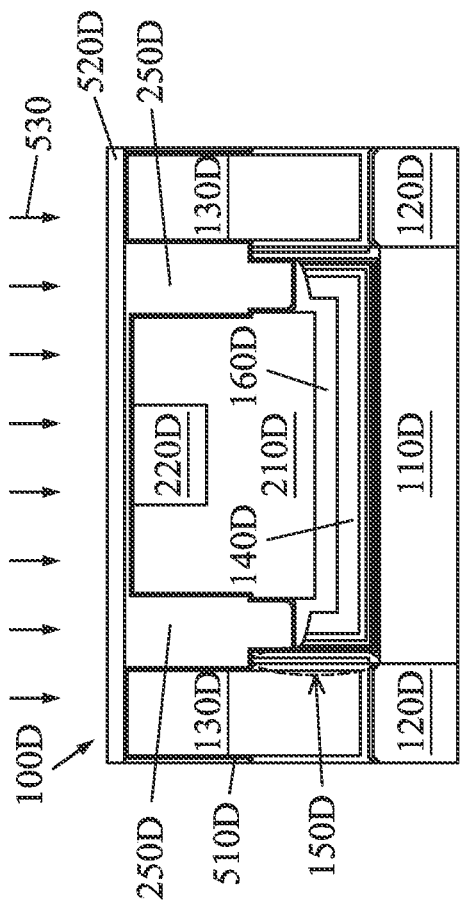
Figure 40D:
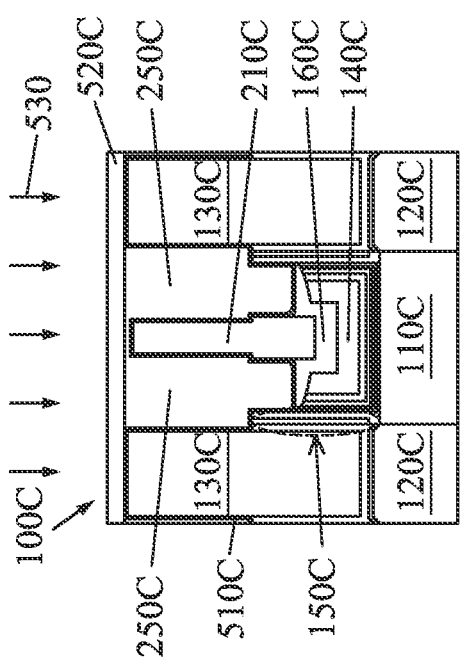
Figure 42A:
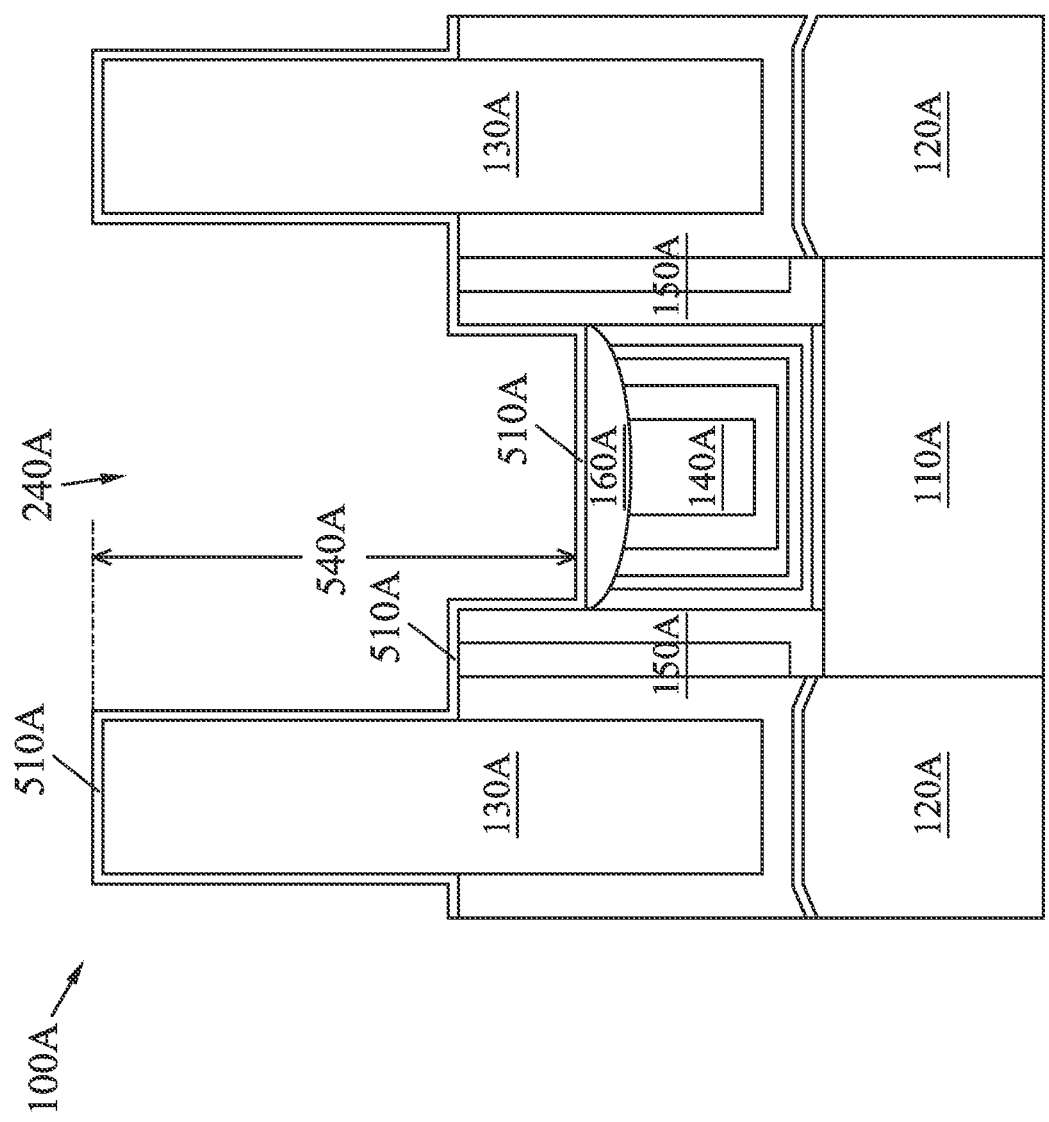

Referring now to FIG. 42A, the FinFET device 100A is in a stage of fabrication similar to FIG. 40A. That is, one or more etching processes 235 (e.g., shown in FIG. 37A) have been performed to etch the T-shaped opening 240A into the FinFET device 100A, and the deposition process 500 has been performed to form the liner 510A over the ILD layers 130A, the spacers 150A, and the metal layer 160A. As discussed above, the liner 510A may have a different material composition than the ILD layers 130A and the spacers 150A. For example, the liner 510A may include a high-k dielectric material, such as a metal oxide material.

As is shown in FIG. 42A, the opening 240A has a depth 540A, which is measured vertically as a distance between an upper surface of a portion of the liner 510A located over the ILD layer 130A and an upper surface of a portion of the liner 510A located over the metal layer 160A. In some embodiments, the depth 540A is in a range between about 10 nm and about 60 nm. The range of the depth 540A is configured to optimize the performance of the T-shaped helmet formed therein later. For example, if the depth 540A is too small, then the T-shaped helmet may not be capable of adequately protecting the layers therebelow, such as the spacers 150A, during etching processes. If the depth 540A is too great, the T-shaped helmet may be taking up too much space from the metal gate electrode below, as well as raising the parasitic capacitance (caused by the T-shaped helmet) needlessly.

Figure 43A:
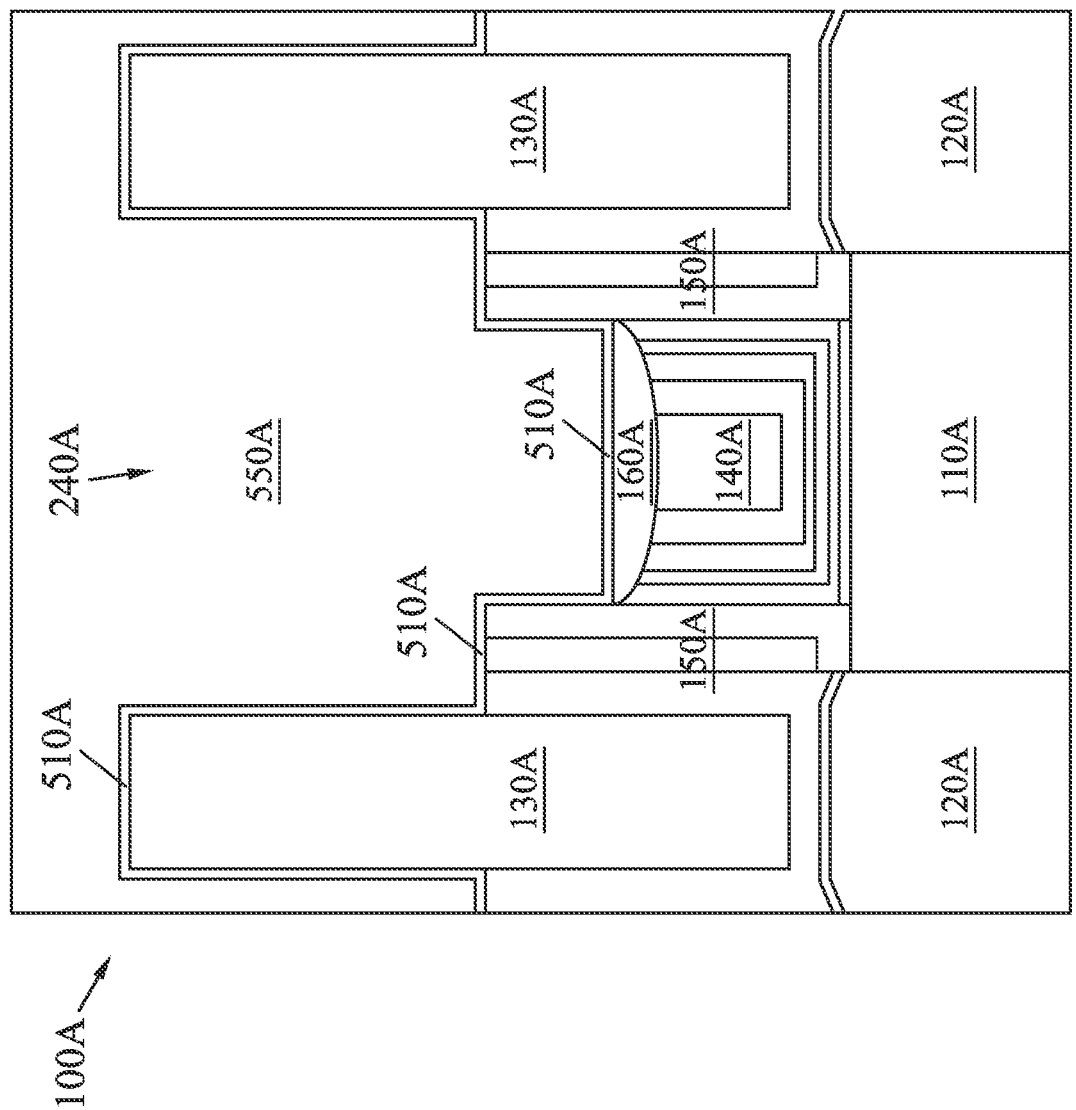

Referring now to FIG. 43A, a dielectric material 550A is formed to fill the opening 240A. The dielectric material 550A may be formed by one or more deposition processes such as CVD, ALD, etc. The dielectric material 550A may be a material that has a relatively low dielectric constant (though not necessarily smaller than the dielectric constant of silicon oxide), for example a material having a dielectric constant smaller than that of the high-k dielectric material of the liner 510A. In some embodiments, the dielectric material 550A may include silicon nitride, which has a dielectric constant of about 7.5. In other embodiments, the dielectric material 550A may include a low-k material having a dielectric constant smaller than about 4. For example, the low-k dielectric material may include fluorine-doped silicon dioxide, carbon-doped silicon dioxide, porous silicon dioxide, porous carbon-doped silicon dioxide, spin-on organic polymeric dielectrics, or spin-on silicon based polymeric dielectric, or combinations thereof.

Referring now to FIG. 44A, an etch-back process 560 is performed to the FinFET device 100A to etch back the dielectric material 550A. The etch-back process 560 is configured to have an etching selectivity between the liner 510A and the dielectric material 550A. For example, the dielectric material 550A may be etched away at a substantially greater rate (e.g., 10 times or more) than the liner 510A. As such, the liner 510A protects the ILD layer 130A, the spacers 150A, and the metal layer 160A below from being damaged by the etch-back process 560.

After the etch-back process 560 is performed, the remaining portion of the dielectric material 550A has a height 570A, measured from a top surface of the remaining portion of the dielectric material 550A and a bottom surface of the dielectric material 550A. In some embodiments, the height 570A is in a range between about 5 nm and about 30 nm. The range of the height 570A is configured to optimize the performance of the T-shaped helmet formed therein later.

In more detail, a high-k dielectric material (e.g., the high-k dielectric material 580A shown in FIG. 45A and discussed below) will be formed over the dielectric material 550A to fill in the opening 240A in a later process. The high-k dielectric material and the dielectric material 550A will collectively form the T-shaped helmet. If the entire T-shaped helmet had been formed by the high-k dielectric material, the parasitic capacitance associated with the T-shaped helmet may be too large for some IC applications, as the parasitic capacitance of a material is directly correlated with the dielectric constant of the material. As such, the present disclosure implements the dielectric material 550A as a bottom part of the T-shaped helmet. Since the dielectric material 550A has a relatively low dielectric constant, the overall parasitic capacitance caused by the T-shaped helmet will be reduced. Meanwhile, the upper part of the T-shaped helmet (i.e., the high-k dielectric material formed over the dielectric material 550A) can still adequately protect the layers below (e.g., the spacers 150A and/or the metal layer 160A) from etching damage.

Here, if the height 570A is too tall, then there is not much room for the subsequently-formed high dielectric material. In other words, the high-k portion of the T-shaped helmet may be too thin, which may compromise its intended functionality of protecting the layers below from etching damage. For example, a thin high-k dielectric portion of the T-shaped helmet may be inadvertently etched through, even if it is supposed to have a high etching selectivity with other low-k materials. On the other hand, if the height 570A is too short, then the overall dielectric constant of the T-shaped helmet is not offset much by the dielectric material 550A, even though it has a relatively low dielectric constant. Consequently, the parasitic capacitance may still be excessively high.

According to the various aspects of the present disclosure, the height 570A is configured to be in an optimized range where the high-k portion of the T-shaped helmet can still adequately serve its role as a protective mask, while the low-k portion of the T-shaped helmet can sufficiently reduce the overall dielectric constant of the T-shaped helmet, thereby reducing parasitic capacitance. It is understood that the specific value of the height 570A may vary depending on the specific IC application in which the FinFET device 100A is implemented, for example its requirement regarding parasitic capacitance. It is also understood that the upper surface of the dielectric material 550A may be configured to be located above the upper surfaces of the spacers 150A in some embodiments, or below the upper surfaces of the spacers 150A in other embodiments.

Referring now to FIG. 45A, the high-k dielectric material 580A is formed over the dielectric material 550A to fill the opening 240A. In various embodiments, the high-k dielectric material may include $ZrO_x$, $YSiO_x$, SiOC, $Al_2O_3$, $HfO_2$, $TiO_2$, $ZrSiO_4$, $HfSiO_4$, $Si_3N_4$, $Ta_2O_5$, SrO, $Y_2O_3$, $La_2O_3$, $LaLuO_2$, CaO, MgO, $Gd_2O_3$, $PrO_2$, $CeO_2$, $ZrHfO_2$, AlON, or combinations thereof. A planarization process (e.g., CMP) is then performed to flatten and planarize the upper surfaces of the ILD layers 130A and the high-k dielectric material 580A. The portions of the liner 510A formed over the ILD layers 130A are removed in the planarization process. After the performance of the planarization process, the high-k dielectric material 580A has a height 585A. In some embodiments, the height 585A is in a range between about 5 nm and about 30 nm. In some embodiments, a ratio between the height 585A and the height 570A is in a range between about 0.5 and about 2. As discussed above, the high-k dielectric material 580A and the dielectric material 550A together form the T-shaped helmet. The range of the height 585A, as well as the ratio between the heights 585A and 570A are configured to optimize the functionality of the T-shaped helmet, while reducing the overall parasitic capacitance associated with it.

As discussed above in the previous embodiments, the T-shape profile is achieved at least in part by making sure that the spacers 150A are taller than the gate electrode (which is made up of the work function metal layer 140A and the metal layer 160A), and that the ILD layers 130A are taller than the spacers 150A. For example, as shown in FIG. 45A, the gate electrode has a height 590A, the spacers 150A have a height 591A, and the ILD layers 130A have a height 592A, which are measured as vertical distances from an upper surface of the fin structure 110A to the upper surfaces of the gate electrode, the spacers 150A, and the ILD layers 130A, respectively. The height 592A is greater than the height 591A, and the height 591A is greater than the height 590A. The sidewall of the gate electrode is in contact with a lower segment 150A-L of the spacer 150A, whereas a portion 510A of the liner 510A is in contact with an upper segment 150A-U of the spacer 150A.

It is understood that a bi-layer T-shaped helmet (e.g., having two different portions 550A and 580A) such as the one shown in FIG. 45A may be implemented for the FinFET devices 100B, 100C, 100D as well, for example with a similar process flow discussed above with reference to FIGS. 42A-45A. In addition, the bi-layer T-shaped helmet may be implemented in embodiments where the liner 510A (or liners 510B/510C/510D) is not present. Furthermore, it is understood that although two distinct segments (one having a lower-k dielectric material and the other having a higher-k dielectric material) are used to form the T-shaped helmet, other embodiments may utilize three or more distinct segments to implement the T-shaped helmet.

Figure 46A:
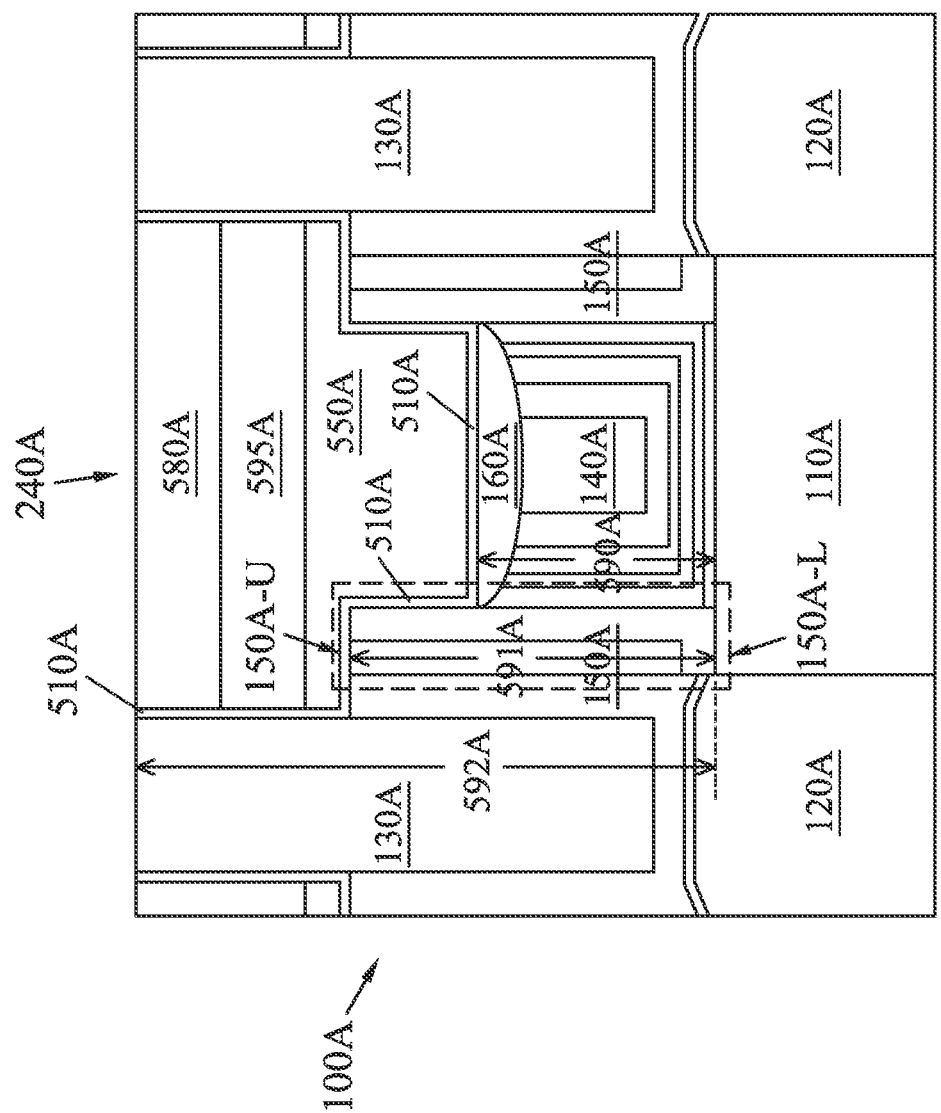

For example, referring to FIG. 46A, another dielectric material 595A may be implemented between the dielectric material 550A and the high-k dielectric material 580A. The dielectric material 595A may have a greater dielectric constant than the dielectric material 550A, but a lower dielectric constant than the high-k dielectric material 580A. As such, the dielectric material 595A can protect the spacers 150A better than the dielectric material 550A but not as well as the high-k dielectric material 580A. Meanwhile, the dielectric material 595A can also reduce the overall dielectric constant of the T-shaped helmet, but not as much as the dielectric material 550A. In this manner, the dielectric material 595A may be viewed as a compromise or a transition between the two different dielectric materials 550A and 580A.

It is also understood that the eighth and ninth embodiments discussed above may include additional processes to complete the fabrication of the FinFET devices 100A-100D. For example, source/drain contacts similar to the source/drain contacts 440A-440D (shown in FIGS. 14A-14D) may be formed over the source/drain regions 120A-120D. It is also understood that although the eighth and ninth embodiments are discussed using FinFET devices, they may be applied to non-FinFET devices as well, such as for planar devices without a protruding fin.

FIG. 47 is a flowchart of a method 800 for fabricating a semiconductor device in accordance with various aspects of the present disclosure. The method 800 includes a step 810 of providing a semiconductor device. The semiconductor device includes: a source and a drain; a semiconductor structure disposed between the source and the drain; a first metal layer disposed over the semiconductor structure; an interlayer dielectric (ILD) disposed over the source and over the drain; and spacers disposed between the ILD and the first metal layer.

The method 800 includes a step 820 of performing one or more first etching processes to form an opening in the semiconductor device. The opening is defined by an upper surface of the first metal layer, upper surfaces and side surfaces of the spacers, and side surfaces of the ILD.

The method 800 includes a step 830 of forming a liner to partially fill the opening. The liner has a first material composition.

The method 800 includes a step 840 of forming a dielectric material on the liner. The dielectric material having a second material composition different from the first material composition.

The method 800 includes a step 850 of performing a second etching process to remove the dielectric material. The dielectric material has a greater etching rate than the liner such that the liner protects at least the spacers from being etched during the second etching process.

In some embodiments, the liner is formed to have a greater dielectric constant than the spacers, the ILD, and the dielectric material.

In some embodiments, the method 800 further includes a step of forming a dielectric structure in the opening after the second etching process. The forming of the dielectric structure may include forming a first portion over the liner and forming a second portion over the first portion. The second portion has a greater dielectric constant than the first portion. In some embodiments, the forming of the first portion comprises depositing a low-k dielectric layer as the first portion, the low-k dielectric layer having a dielectric constant less than about 4. In some embodiments, the forming of the second portion comprises depositing a high-k dielectric layer as the second portion, the high-k dielectric layer having a dielectric constant greater than about 4.

It is understood that additional process steps may be performed before, during, or after the steps 810-850 discussed above to complete the fabrication of the semiconductor device. For example, before the step 810 is performed, the method 800 may include forming dummy gate structures (e.g., a polysilicon gate electrode) and removing the dummy gate structures to form the first opening and the second opening. After the step 850 is performed, the method 800 may include the formation of source/drain contacts of the semiconductor device and/or the formation of vias/metal lines. Other steps may be performed but are not discussed herein in detail for reasons of simplicity.

In summary, the present disclosure utilizes various embodiments each having unique fabrication process flows to form T-shaped helmets with high-k dielectric materials over the gate spacers and gate electrodes. The present disclosure also forms similarly-sized (laterally) U-shaped openings for short channel, middle channel, and long channel devices. Through these U-shaped openings, layers of a metal gate electrode can be etched, for example simultaneously. The present disclosure may also form liners in the T-shaped openings, for example over the gate spacers, where the liners contain a high-k dielectric material. Furthermore, the present disclosure may utilize two or more different types of dielectric materials to implement the T-shaped helmets. For example, a bottom portion of the T-shaped helmet may be implemented using a dielectric material with a lower dielectric constant, and a top portion of the T-shaped helmet may be implemented using a dielectric material with a higher dielectric constant.

Based on the above discussions, it can be seen that the present disclosure offers advantages over conventional semiconductor devices and the fabrication thereof. It is understood, however, that other embodiments may offer additional advantages, and not all advantages are necessarily disclosed herein, and that no particular advantage is required for all embodiments. One advantage is that the present disclosure reduces etching loading concerns. For example, due to the similar lateral dimensions between the U-shaped openings for the short channel, middle channel, and long channel devices, the metal layers of the metal gate electrode for these devices have lateral dimensions that are not too different from one another. This means that they can all be etched simultaneously without causing loading problems. Another advantage is that the T-shaped helmets can protect the spacers and the gate electrodes below from being etched inadvertently during subsequent contact hole etching processes. This is even more beneficial for the short channel device, since it may be more prone to overlay shift issues due to its smaller size. Here, even if there is poor overlay, the high-k dielectric material composition of the T-shaped helmets can adequately protect the spacers (e.g., containing a low-k material) and the metal gate electrode therebelow from being etched. A further advantage is that due to the high-k dielectric material of the liners, they may serve as protective layer to prevent the layers (e.g., gate spacers) below from being damaged by etching. As such, the T-shaped profile of the helmets may be well-preserved. Yet another advantage is that the T-shaped helmets formed by two or more different types of dielectric materials may simultaneously achieve good etching-protective properties (due to a higher-k-dielectric component located at the top) in etching processes, as well as offering reduced parasitic capacitance (due to a lower-k-dielectric component located at the bottom). Other advantages include compatibility with existing fabrication process flows, etc.

One aspect of the present disclosure involves a semiconductor device. The semiconductor device includes a semiconductor layer. A gate structure is disposed over the semiconductor layer. A spacer is disposed on a sidewall of the gate structure. A height of the spacer is greater than a height of the gate structure. A liner is disposed on the gate structure and on the spacer. The spacer and the liner have different material compositions.

One aspect of the present disclosure involves a semiconductor device. The semiconductor device includes a semiconductor layer. A gate structure is disposed over the semiconductor layer. A spacer is disposed on a sidewall of the gate structure. An interlayer dielectric (ILD) is disposed adjacent to the spacer. The spacer is disposed between the ILD and the gate structure. A dielectric structure is disposed over the gate structure. The dielectric structure includes a first portion and a second portion disposed over the first portion. A first dielectric constant of the first portion is smaller than a second dielectric constant of the second portion. The second dielectric constant is greater than about 4.

Another aspect of the present disclosure involves a method of fabricating a semiconductor device. A semiconductor device is provided that includes: a source and a drain; a semiconductor structure disposed between the source and the drain; a first metal layer disposed over the semiconductor structure; an interlayer dielectric (ILD) disposed over the source and over the drain; and spacers disposed between the ILD and the first metal layer. One or more first etching processes are performed to form an opening in the semiconductor device. The opening is defined by an upper surface of the first metal layer, upper surfaces and side surfaces of the spacers, and side surfaces of the ILD. A liner is formed to partially fill the opening. The liner has a first material composition. A dielectric material is formed on the liner. The dielectric material has a second material composition different from the first material composition. A second etching process is performed to remove the dielectric material. The dielectric material has a greater etching rate than the liner such that the liner protects at least the spacers from being etched during the second etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a semiconductor device that includes:
   a semiconductor fin structure;
   source/drain regions disposed on opposite sides of the semiconductor fin structure;
   a gate structure disposed over the semiconductor fin structure, the gate structure including a gate electrode; and
   gate spacers disposed on sidewalls of the gate structure;
   etching the semiconductor device, wherein the gate electrode and the gate spacers are partially etched, and wherein the gate electrode is etched at a faster rate than the gate spacers during the etching;
   after the etching, re-forming a portion of the gate structure; and after the re-forming the portion of the gate structure, forming a liner over the gate structure and the gate spacers, wherein the liner defines an upwardly-facing recess.

2. The method of claim 1, wherein:
the semiconductor device further includes an interlayer dielectric (ILD) structure disposed on sidewalls of the gate spacers; and
the gate spacers are etched at a faster etching rate than the ILD structure during the etching.

3. The method of claim 2, wherein the forming the liner further comprises forming the liner over the ILD structure.

4. The method of claim 1, wherein the forming the liner comprises forming a liner that contains a dielectric material having a dielectric constant greater than about 4, and wherein the liner has a thickness in a range between about 0.5 nanometers and about 5 nanometers.

5. The method of claim 1, wherein a segment of the liner is formed to have an upper surface with a lower vertical elevation than an upper surface of the gate spacers.

6. The method of claim 1, wherein:
the gate structure includes a work function (WF) metal layer;
the etching partially etches away the WF metal layer; and
the re-forming the portion of the gate structure comprises depositing a first metal layer over the WF metal layer, the first metal layer and the WF metal layer having different material compositions.

7. The method of claim 1, further comprising: after the forming of the liner, depositing a dielectric material over the liner, wherein the dielectric material and the liner have different material compositions.

8. The method of claim 7, wherein the depositing the dielectric material comprises depositing a dielectric material having a smaller dielectric constant than the liner as the dielectric material.

9. The method of claim 7, further comprising: etching back a portion of the dielectric material, wherein an etching selectivity exists between the liner and the dielectric material during the etching back.

10. The method of claim 9, wherein the dielectric material is a first dielectric material, and wherein the method further comprises depositing a second dielectric material over the first dielectric material after the first dielectric material has been etched back.

11. The method of claim 10, wherein the depositing the second dielectric material comprises depositing a dielectric material having a greater dielectric constant than about 4 as the second dielectric material.

12. The method of claim 1, wherein the gate electrode has a concave upper surface after the etching has been performed.

13. A method, comprising:
providing a semiconductor device that includes:
a semiconductor fin structure;
source/drain regions disposed on opposite sides of the semiconductor fin structure;
a gate structure disposed over the semiconductor fin structure;
gate spacers disposed on sidewalls of the gate structure, the gate structure including a work function (WF) metal layer that completely fills a space between the gate spacers; and
an interlayer dielectric (ILD) structure disposed on sidewalls of the gate spacers;
performing a first etching process to the semiconductor device, the first etching process partially etches away the WF metal layer, wherein an etching selectivity exists between the gate structure, the gate spacers, and the ILD structure during the first etching process, such that remaining portions of the gate structure, the gate spacers, and the ILD structure collectively define a T-shaped opening;
depositing a conductive material over the WF metal layer, wherein the conductive material and the WF metal layer have different material compositions; and
after the first etching process has been performed, partially filling the T-shaped opening with a liner, over the gate structure and the gate spacers.

14. The method of claim 13, further comprising:
forming a first dielectric material over the liner, the first dielectric material filling the T-shaped opening, wherein the first dielectric material and the liner have different material compositions; and
performing a second etching process to remove the first dielectric material, wherein the liner serves as an etching-stop layer during the second etching process.

15. The method of claim 14, further comprising, after the first dielectric material has been removed:
forming a second dielectric material to partially fill the T-shaped opening; and
forming a third dielectric material to completely fill the T-shaped opening, wherein the third dielectric material has a greater dielectric constant than the second dielectric material.

16. The method of claim 13, wherein the gate structure is etched at a faster rate than the gate spacers during the first etching process.

17. A method, comprising:
providing a semiconductor device that includes:
a source and a drain;
a semiconductor structure disposed between the source and the drain;
a first metal layer disposed over the semiconductor structure;
an interlayer dielectric (ILD) disposed over the source and over the drain; and
spacers disposed between the ILD and the first metal layer;
performing one or more first etching processes to form an opening in the semiconductor device, wherein the opening is defined by an upper surface of the first metal layer, upper surfaces and side surfaces of the spacers, and side surfaces of the ILD;
forming a liner to partially fill the opening, wherein the liner has a first material composition;
forming a dielectric material on the liner, the dielectric material having a second material composition different from the first material composition; and
performing a second etching process to remove the dielectric material, wherein the dielectric material has a greater etching rate than the liner such that the liner protects at least the spacers from being etched during the second etching process.

18. The method of claim 17, wherein the liner is formed to have a greater dielectric constant than the spacers, the ILD, and the dielectric material.

19. The method of claim 17, further comprising: forming a dielectric structure in the opening after the second etching process, wherein the forming of the dielectric structure comprises forming a first portion over the liner and forming a second portion over the first portion, wherein the second portion has a greater dielectric constant than the first portion.

20. The method of claim 19, wherein:
the forming of the first portion comprises depositing a low-k dielectric layer as the first portion, the low-k dielectric layer having a dielectric constant less than about 4; and
the forming of the second portion comprises depositing a high-k dielectric layer as the second portion, the high-k dielectric layer having a dielectric constant greater than about 4.

* * * * *